United States Patent
Aoki et al.

(10) Patent No.: US 9,791,518 B2
(45) Date of Patent: Oct. 17, 2017

(54) IMPEDANCE MEASURING DEVICE AND CONTROL METHOD FOR IMPEDANCE MEASURING DEVICE

(71) Applicant: NISSAN MOTOR CO., LTD., Yokohama-shi, Kanagawa (JP)

(72) Inventors: Tetsuya Aoki, Kanagawa (JP); Masanobu Sakai, Kanagawa (JP); Michihiko Matsumoto, Kanagawa (JP); Hidetaka Nishimura, Kanagawa (JP); Masashi Sato, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 15/118,598

(22) PCT Filed: Jan. 7, 2015

(86) PCT No.: PCT/JP2015/050273
§ 371 (c)(1),
(2) Date: Aug. 12, 2016

(87) PCT Pub. No.: WO2015/125506
PCT Pub. Date: Aug. 27, 2015

(65) Prior Publication Data
US 2017/0045588 A1 Feb. 16, 2017

(30) Foreign Application Priority Data
Feb. 19, 2014 (WO) .................. PCT/JP2014/053912

(51) Int. Cl.
*G01R 31/36* (2006.01)
*G01R 27/14* (2006.01)
(Continued)

(52) U.S. Cl.
CPC ......... *G01R 31/3662* (2013.01); *G01R 27/14* (2013.01); *G01R 31/3648* (2013.01);
(Continued)

(58) Field of Classification Search
CPC ............ G01R 31/3624; G01R 31/3658; G01R 31/3606; G01R 31/3662; G01R 31/3679
(Continued)

(56) References Cited

U.S. PATENT DOCUMENTS

| 6,922,058 B2 * | 7/2005 | Potempa ............ G01R 31/3662 320/149 |
| 7,259,572 B2 * | 8/2007 | Houldsworth ..... G01R 31/3606 320/132 |

(Continued)

FOREIGN PATENT DOCUMENTS

| JP | 2011-169870 A | 9/2011 |
| JP | 2011-216429 A | 10/2011 |

(Continued)

OTHER PUBLICATIONS

USPTO Notice of Allowance, U.S. Appl. No. 15/119,056, Aug. 1, 2017, 11 pages.

*Primary Examiner* — Jermele M Hollington
*Assistant Examiner* — Christopher McAndrew
(74) *Attorney, Agent, or Firm* — Foley & Lardner LLP

(57) ABSTRACT

An impedance measuring device outputs an alternating current of a prescribed frequency to each of a positive electrode terminal and a negative electrode terminal of a laminated type battery and detects an alternating-current potential difference between the positive electrode terminal and an intermediate-point terminal and an alternating-current potential difference between the negative electrode terminal and the intermediate-point terminal. The impedance measuring device adjusts an amplitude of the alternating current such that the alternating-current potential difference between the positive electrode terminal and the intermediate-point terminal and the alternating-current potential difference between the negative electrode terminal and the intermediate-point terminal coincide, and computes
(Continued)

an impedance on the basis of the adjusted alternating current and alternating-current potential differences. Then, the impedance measuring device corrects a phase difference of the alternating currents output to the positive electrode terminal and the negative electrode terminal on the basis of a phase difference between an alternating-current potential generated at the positive electrode terminal and an alternating-current potential generated at the negative electrode terminal.

17 Claims, 37 Drawing Sheets

(51) Int. Cl.
  *H01M 8/04537* (2016.01)
  *H01M 8/04992* (2016.01)
(52) U.S. Cl.
  CPC .... *G01R 31/3658* (2013.01); *H01M 8/04649* (2013.01); *H01M 8/04992* (2013.01); *G01R 31/3606* (2013.01); *G01R 31/3624* (2013.01); *G01R 31/3679* (2013.01)
(58) Field of Classification Search
  USPC .......................................................... 324/430
  See application file for complete search history.

(56) References Cited

U.S. PATENT DOCUMENTS

| | | | |
|---|---|---|---|
| 7,619,390 B2 * | 11/2009 | Kim | G01R 31/362 320/132 |
| 9,366,731 B2 | 6/2016 | Sakai et al. | |
| 9,519,031 B2 * | 12/2016 | Jamison | G01R 31/3662 |
| 9,529,055 B2 * | 12/2016 | Sakai | G01R 31/3662 |
| 2001/0022518 A1 * | 9/2001 | Asakura | G01R 31/3679 324/426 |
| 2009/0209945 A1 * | 8/2009 | Lobl | A61M 5/14224 604/891.1 |
| 2010/0145644 A1 * | 6/2010 | Honkura | G01R 31/3679 702/63 |
| 2011/0133744 A1 * | 6/2011 | Ono | G01R 31/3662 324/430 |
| 2011/0227587 A1 * | 9/2011 | Nakanishi | G01R 31/3662 324/649 |
| 2011/0270559 A1 * | 11/2011 | Christophersen | G01R 27/26 702/65 |
| 2012/0280693 A1 * | 11/2012 | Lammers | G01R 31/3662 324/430 |
| 2012/0306504 A1 * | 12/2012 | van Lammeren | G01R 31/3658 324/430 |
| 2013/0057292 A1 | 3/2013 | Hasegawa et al. | |
| 2013/0069598 A1 * | 3/2013 | Tanaka | H01M 10/0525 320/134 |
| 2013/0229156 A1 * | 9/2013 | Brandon | B60L 3/0046 320/136 |
| 2013/0249562 A1 | 9/2013 | Sakai et al. | |
| 2013/0253862 A1 * | 9/2013 | Luo | G01R 31/3662 702/63 |
| 2015/0276888 A1 * | 10/2015 | Sakai | G01R 31/3662 324/430 |
| 2016/0356858 A1 * | 12/2016 | Sakai | G01R 31/3651 |

FOREIGN PATENT DOCUMENTS

| | | |
|---|---|---|
| WO | WO 2012/077450 A1 | 6/2012 |
| WO | WO 2014/141752 A1 | 9/2014 |

\* cited by examiner

IMPEDANCE MEASURING DEVICE AND CONTROL METHOD FOR IMPEDANCE MEASURING DEVICE

TECHNICAL FIELD

This invention relates to an impedance measuring device for measuring an impedance of a laminated type battery and a control method for impedance measuring device.

BACKGROUND ART

A device for measuring an internal resistance of a laminated type battery with power supplied to a load from the laminated type battery is proposed in WO2012077450.

This measuring device outputs the same alternating currents to a positive electrode terminal and a negative electrode terminal of the laminated type battery such that no current leaks to a load side connected to the laminated type battery. Then, an amplitude of the alternating current output to each electrode terminal is adjusted such that a potential difference on a positive electrode side obtained by subtracting a potential of an intermediate-point terminal located between the positive electrode terminal and the negative electrode terminal from a potential of the positive electrode terminal of the laminated type battery and a potential difference on a negative electrode side obtained by subtracting the potential of the intermediate-point terminal from a potential of the negative electrode terminal coincide. Then, the internal resistance of the laminated type battery is measured on the basis of the adjusted alternating currents and potential differences.

SUMMARY OF INVENTION

Some of laminated type batteries include capacitance components inside like fuel cell batteries. Capacitance components of a fuel cell battery may vary depending on an operating state of a fuel cell system. In such a case, a difference between a capacitance on a positive electrode side and a capacitance on a negative electrode side becomes large and a phase difference is generated between a detection signal indicating a potential difference on the positive electrode side and a detection signal indicating a potential difference on the negative electrode side.

In a state where there is a phase deviation between the detection signals on the positive and negative electrode sides, the alternating current output from the measuring device to the fuel cell battery partly leaks toward the load, thereby causing a problem of deteriorating impedance measurement accuracy.

The present invention was developed focusing on such a problem and aims to provide an impedance measuring device for suppressing a reduction of impedance measuring accuracy due to capacitance components of a laminated type battery.

According to one aspect of the present invention, an impedance measuring device includes a laminated type battery, a plurality of battery cells is laminated in the laminated type battery. The impedance measuring device includes a first power supply unit configured to output an alternating current of a prescribed frequency for measuring an impedance of the laminated type battery to a positive electrode terminal of the laminated type battery, and a second power supply unit configured to output an alternating current of the prescribed frequency to a negative electrode terminal of the laminated type battery. The impedance measuring device includes a first detection unit configured to detect an alternating-current potential difference between the positive electrode terminal and an intermediate-point terminal of the laminated type battery, and a second detection unit configured to detect an alternating-current potential difference between the negative electrode terminal and the intermediate-point terminal. The impedance measuring device includes an adjustment unit configured to adjust an amplitude of the alternating current output from at least one of the first and second power supply units such that the alternating-current potential difference detected by the first detection unit and the alternating-current potential difference detected by the second detection unit coincide. The impedance measuring device includes a computation unit configured to compute the impedance of the laminated type battery on the basis of the alternating current adjusted by the adjustment unit and the alternating-current potential difference. The impedance measuring device includes a correction unit configured to correct a phase difference of the alternating currents output from the first and second power supply units on the basis of a phase difference between an alternating-current potential generated at the positive electrode terminal and an alternating-current potential generated at the negative electrode terminal.

DESCRIPTION OF EMBODIMENTS

Hereinafter, embodiments of the present invention are described with reference to the accompanying drawings.

First Embodiment

Figure 1A:
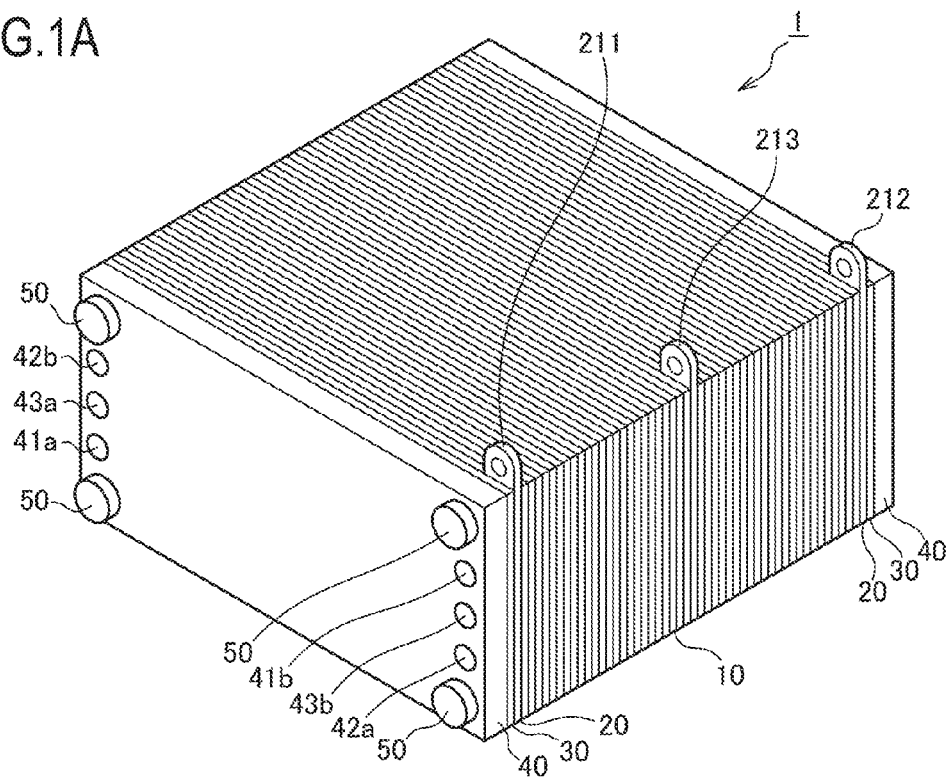
FIG. 1A is an external perspective view showing an example of a laminated type battery to be measured by an impedance measuring device in a first embodiment of the present invention.

FIG. 1A is an external perspective view showing an example of a laminated type battery to be measured by an impedance measuring device in a first embodiment of the present invention. In FIG. 1A, a fuel cell stack 1 in which a plurality of battery cells are laminated is shown as an example of the laminated type battery.

As shown in FIG. 1A, the fuel cell stack 1 includes a plurality of power generation cells 10, current collector plates 20, insulation plates 30, end plates 40 and four tension rods 50.

The power generation cell 10 is a so-called battery cell and indicates one of a plurality of fuel cells laminated in the fuel cell stack 1. The power generation cell 10 generates, for example, an electromotive voltage of about 1 V (volt). The detailed configuration of the power generation cell 10 is described later with reference to FIG. 1B.

The current collector plates 20 are respectively arranged at outer sides of the laminated power generation cells 10. The current collector plates 20 are formed of a gas-impermeable conductive material such as dense carbon. The current collector plates 20 include a positive electrode terminal 211 and a negative electrode terminal 212. Further, an intermediate-point terminal 213 is provided between the positive electrode terminal 211 and the negative electrode terminal 212. The intermediate-point terminal 213 is connected to the power generation cell 10 located in the middle out of the power generation cells 10 laminated from the positive electrode terminal 211 to the negative electrode terminal 212. It should be noted that the intermediate-point terminal 213 may be located at a position deviated from a middle point between the positive electrode terminal 211 and the negative electrode terminal 212. Electrons e⁻ generated in the power generation cells 10 are extracted from the negative electrode terminal 212 of the fuel cell stack 1.

The insulation plates 30 are respectively arranged at outer sides of the current collector plates 20. The insulation plates 30 are formed of an insulating material such as rubber.

The end plates 40 are respectively arranged at outer sides of the insulation plates 30. The end plates 40 are formed of a rigid metal material such as steel.

One end plate 40 (end plate 40 on a front left side in FIG. 1A) includes an anode supply port 41a, an anode discharge port 41b, a cathode supply port 42a, a cathode discharge port 42b, a cooling water supply port 43a and a cooling water discharge port 43b. In the present embodiment, the anode discharge port 41b, the cooling water discharge port 43b and the cathode supply port 42a are provided on a right side in FIG. 1A. Further, the cathode discharge port 42b, the cooling water supply port 43a and the anode supply port 41a are provided on a left side in FIG. 1A.

The tension rods 50 are respectively arranged near four corners of the end plate 40. The fuel cell stack 1 is formed with holes (not shown) penetrating inside. The tension rods 50 are inserted into these through holes. The tension rods 50 are formed of a rigid metal material such as steel. An insulation processing is applied to surfaces of the tension rods 50 to prevent an electrical short circuit between the power generation cells 10. Nuts (not shown by being located on a back side) are threadably engaged with these tension rods 50. The tension rods 50 and the nuts tighten the fuel cell stack 1 in a lamination direction.

A method for supplying hydrogen as anode gas to the anode supply port 41$a$ is, for example, a method for directly supplying hydrogen gas from a hydrogen storage device, a method for supplying reformed hydrogen-containing gas obtained by reforming hydrogen-containing fuel or the like. It should be noted that the hydrogen storage device is a high-pressure gas tank, a liquefied hydrogen tank, a hydrogen storage alloy tank or the like. The hydrogen-containing fuel includes natural gas, methanol, gasoline and the like. Further, air is generally used as cathode gas to be supplied to the cathode supply port 42$a$.

Figure 1B:
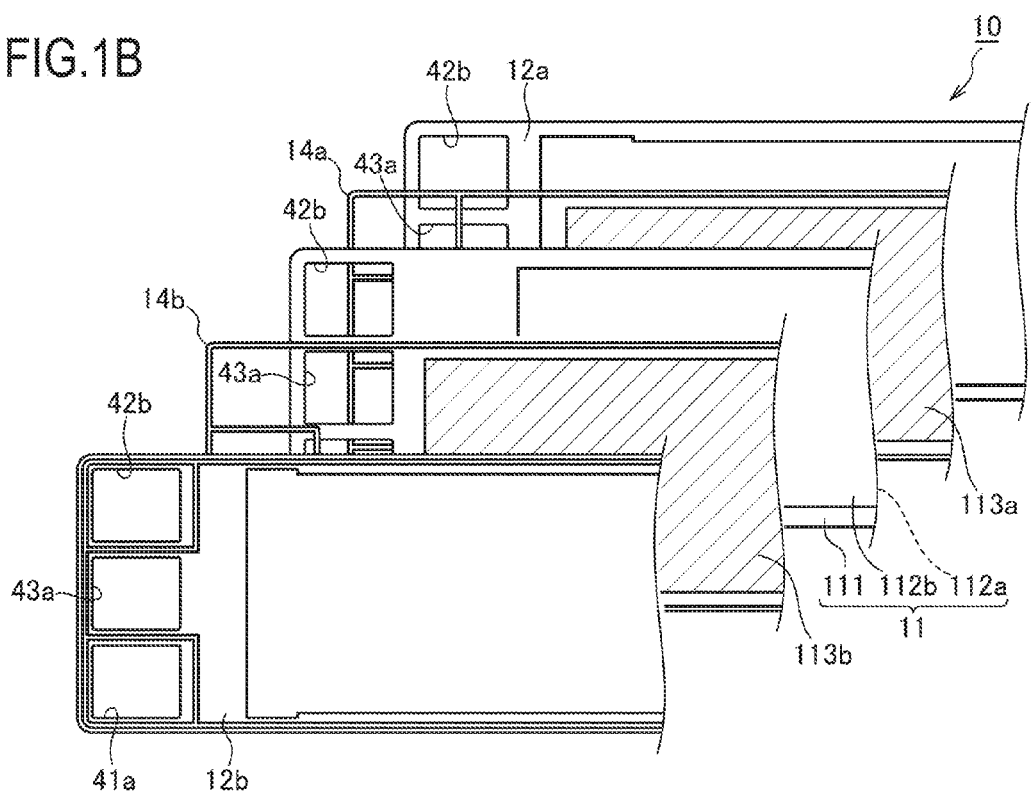
FIG. 1B is an exploded view showing the structure of a power generation cell to be laminated in the laminated type battery.

FIG. 1B is an exploded view showing the structure of the power generation cell laminated in the fuel cell stack 1.

As shown in FIG. 1B, the power generation cell 10 is structured such that an anode separator (anode bipolar plate) 12$a$ and a cathode separator (cathode bipolar plate) 12$b$ are arranged on opposite surfaces of a membrane electrode assembly (MEA) 11.

In the MEA 11, electrode catalyst layers 112 are formed on opposite surfaces of an electrolyte membrane 111 composed of an ion-exchange membrane. Gas diffusion layers (GDLs) 113 are formed on these electrode catalyst layers 112.

The electrode catalyst layer 112 is, for example, formed of platinum-carrying carbon black particles.

The GDL 113 is formed of a material having sufficient gas diffusion property and electrical conductivity such as carbon fibers.

The anode gas supplied from the anode supply port 41$a$ flows in this GDL 113$a$, reacts with the anode electrode catalyst layer 112 (112$a$) and is discharged from the anode discharge port 41$b$.

The cathode gas supplied from the cathode supply port 42$a$ flows in this GDL 113$b$, reacts with the cathode electrode catalyst layer 112 (112$b$) and is discharged from the cathode discharge port 42$b$.

The anode separator 12$a$ is laid on one surface (back surface in FIG. 1B) of the MEA 11 via the GDL 113$a$ and a seal 14$a$. The cathode separator 12$b$ is laid on one surface (front surface in FIG. 1B) of the MEA 11 via the GDL 113$b$ and a seal 14$b$. The seals 14 (14$a$, 14$b$) are rubber-like elastic materials such as silicone rubber, ethylene propylene diene monomer (EPDM) or fluororubber. The anode separator 12$a$ and the cathode separator 12$b$ are, for example, formed by press-molding a separator base made of metal such as stainless steel, forming reaction gas flow passages on one surface and forming cooling water flow passages on an opposite surface such that the reaction gas flow passages and the cooling water flow passages are alternately arranged. As shown in FIG. 1B, the anode separator 12$a$ and the cathode separator 12$b$ are laid together to form the cooling water flow passages.

The MEA 11, the anode separator 12$a$ and the cathode separator 12$b$ are respectively formed with holes 41$a$, 41$b$, 42$a$, 42$b$, 43$a$ and 43$b$ and, by laying these one next to another, the anode supply port 41$a$, the anode discharge port 41$b$, the cathode supply port 42$a$, the cathode discharge port 42$b$, the cooling water supply port 43$a$ and the cooling water discharge port 43$b$ are formed.

Figure 2:
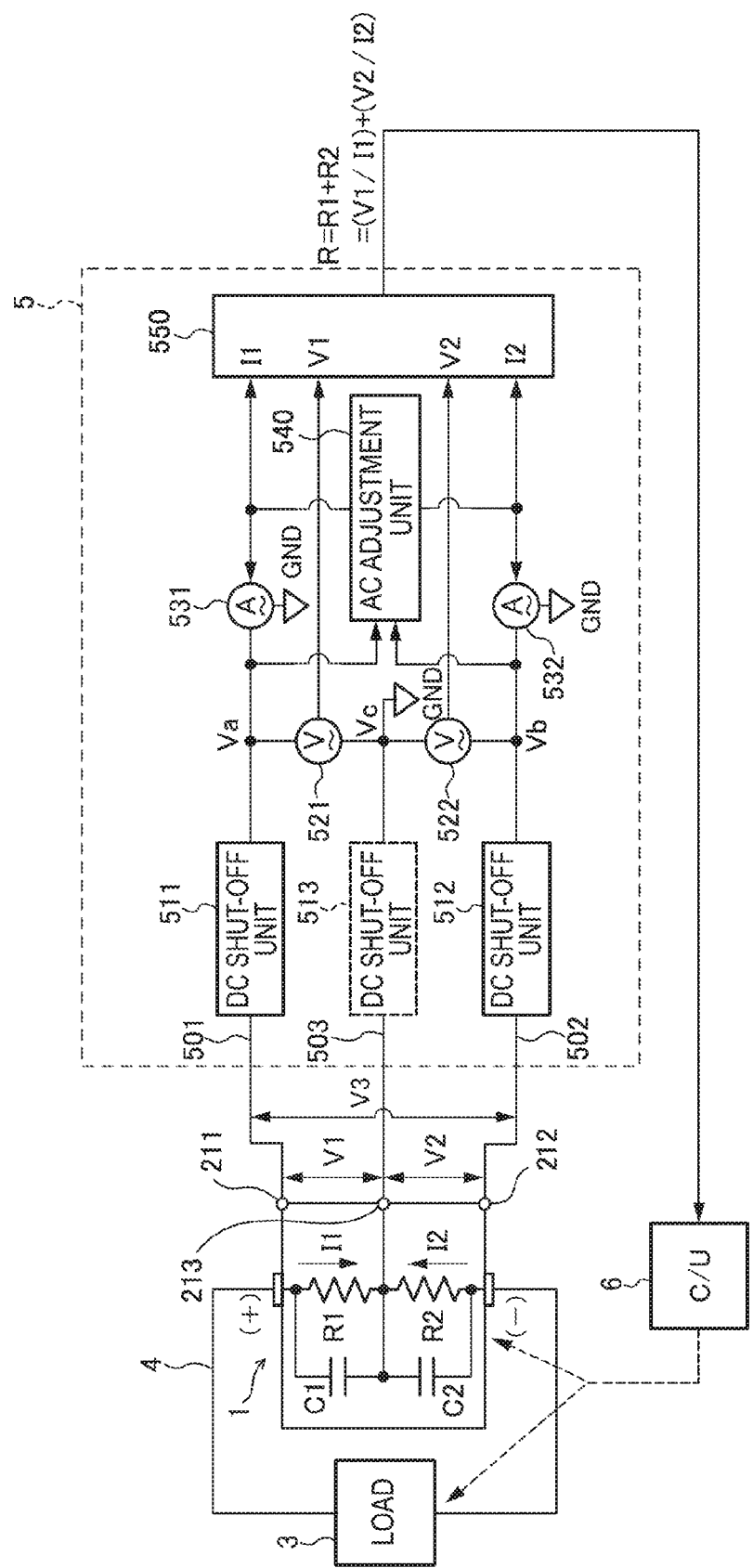
FIG. 2 is a diagram showing a basic configuration of the impedance measuring device.

FIG. 2 is a diagram showing a basic configuration of an impedance measuring device 5 in the present embodiment.

The impedance measuring device 5 measures an internal impedance of the fuel cell stack 1, for example, mounted in a vehicle. The fuel cell stack 1 is connected to a load 3 mounted in the vehicle. The load 3 is an electric motor, an auxiliary machine used for power generation of the fuel cell stack 1 or the like. A controller unit (C/U) 6 controls an operating state of the load 3 and operating states of the fuel cell stack 1 such as a power generation state and a wet state on the basis of a measurement result by the impedance measuring device 5.

The impedance measuring device 5 includes a positive-electrode side direct current shut-off unit 511, a negative-electrode side direct current shut-off unit 512, an intermediate point direct current shut-off unit 513, a positive-electrode side potential difference detection unit 521, a negative-electrode side potential difference detection unit 522, a positive-electrode side power supply unit 531, a negative-electrode side power supply unit 532, an alternating current adjustment unit 540 and a computation unit 550.

Figure 3:
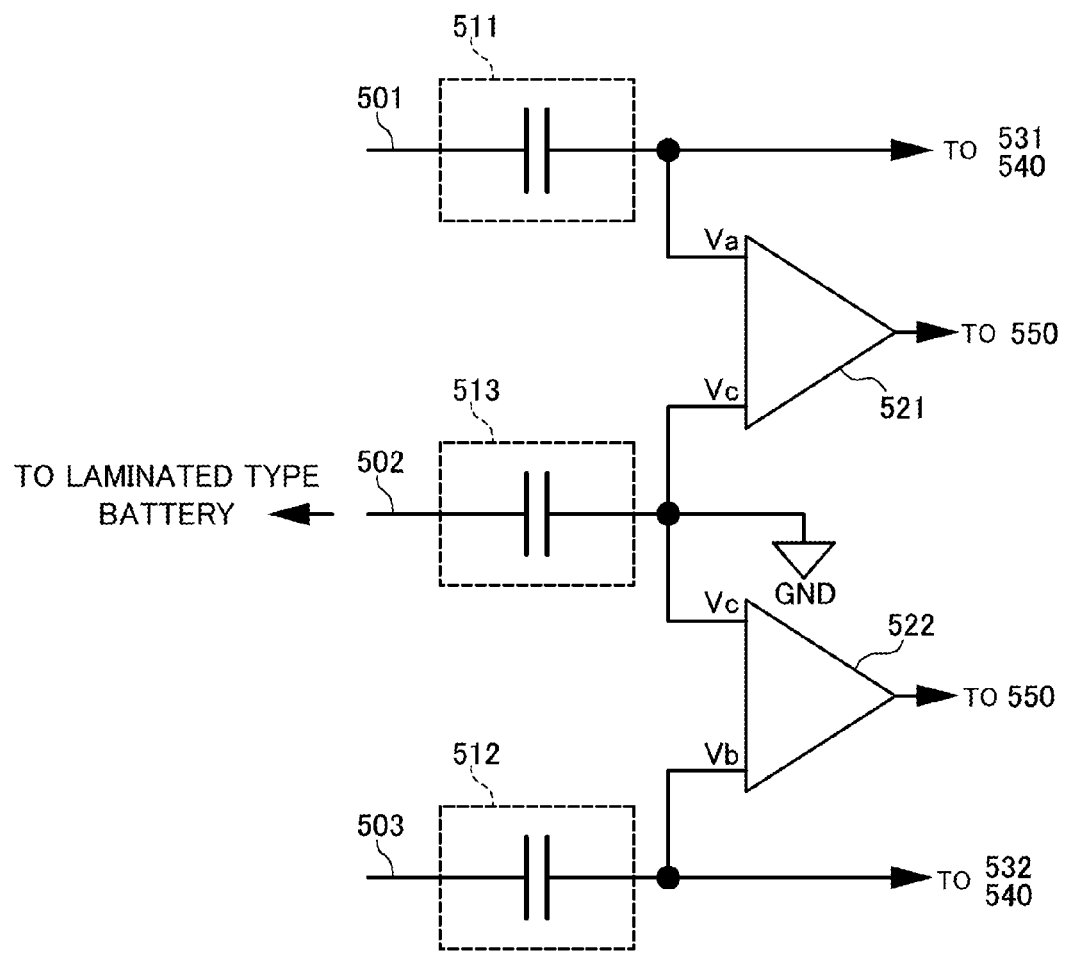
FIG. 3 is a diagram showing direct current shut-off units and potential difference detection units.

The positive-electrode side direct current shut-off unit 511, the negative-electrode side direct current shut-off unit 512, the intermediate point direct current shut-off unit 513, the positive-electrode side potential difference detection unit 521 and the negative-electrode side potential difference detection unit 522 are described in detail with reference to FIG. 3.

The positive-electrode side direct current shut-off unit 511 is connected to the positive electrode terminal 211 of the fuel cell stack 1. The negative-electrode side direct current shut-off unit 512 is connected to the negative electrode terminal 212 of the fuel cell stack 1. The intermediate point direct current shut-off unit 513 is connected to the intermediate-point terminal 213 of the fuel cell stack 1. The direct-current shut-off units 511 to 513 shut off direct-current signals, but allow alternating-current signals to flow. The direct-current shut-off units 511 to 513 are, for example, capacitors or transformers. It should be noted that the intermediate point direct current shut-off unit 513 shown by broken line may be omitted.

The positive-electrode side potential difference detection unit 521 detects a potential difference between an alternating-current potential Va generated at the positive electrode terminal 211 and an alternating-current potential Vc generated at the intermediate-point terminal 213 (hereinafter, referred to as an "alternating-current potential difference V1"). The positive-electrode side potential difference detection unit 521 outputs a detection signal, whose signal level changes according to the alternating-current potential difference V1, to the computation unit 550.

The negative-electrode side potential difference detection unit 522 detects a potential difference between an alternating-current potential Vb generated at the negative electrode terminal 212 and the alternating-current potential Vc generated at the intermediate-point terminal 213 (hereinafter, referred to as an "alternating-current potential difference V2"). The negative-electrode side potential difference detection unit 522 outputs a detection signal, whose signal level changes according to the alternating-current potential difference V2, to the computation unit 550. The positive-electrode side potential difference detection unit 521 and the negative-electrode side potential difference detection unit 522 are realized, for example, by differential amplifiers (instrumentation amplifiers).

The positive-electrode side power supply unit 531 and the negative-electrode side power supply unit 532 are described in detail with reference to FIG. 4.

The positive-electrode side power supply unit 531 is a first power supply unit for outputting an alternating current of a reference frequency fb. The positive-electrode side power supply unit 531 is realized by a voltage-current conversion circuit such as an operational amplifier (OP amplifier). By this voltage-current conversion circuit, a current Io proportional to an input voltage Vi is output. It should be noted that Io=Vi/Rs, where Rs denotes a current sensing resistance. This voltage-current conversion circuit is a variable alternating current source capable of adjusting the output current Io according to the input voltage Vi.

By using the voltage-current conversion circuit as the positive-electrode side power supply unit 531, the output current Io can be computed by dividing the input voltage Vi by a proportionality constant Rs even without actually measuring the output current Io, wherefore the output current Io can be obtained if the input voltage Vi is detected. Further, since an output of the voltage-current conversion circuit is a current, the alternating current flowing in a laminated cell group and an output current of the positive-electrode side power supply unit 531 are in the same phase even if an element which causes a phase angle such as a capacitor is disposed in a current path. Further, the input voltage Vi is also in the same phase. Thus, it is not necessary to consider a phase deviation of the alternating current in resistance calculation in the subsequent stage and a circuit is simple. Furthermore, even if an impedance of a capacitor in the current path varies, there is no influence of a phase change of the alternating current. From the above, a circuit as shown in FIG. 4 is preferably used as the positive-electrode side power supply unit 531. The negative-electrode side power supply unit 532 is also similarly configured. Specifically, the negative-electrode side power supply unit 532 is a second power supply unit for outputting an alternating current of the reference frequency fb.

The alternating current adjustment unit 540 is described in detail with reference to FIG. 5.

The alternating current adjustment unit 540 adjusts an amplitude of the alternating current output from at least one of the positive-electrode side power supply unit 531 and the negative-electrode side power supply unit 532 such that the alternating-current potential Va on the positive electrode side and the alternating-current potential Vb on the negative electrode side coincide.

In the present embodiment, the alternating current adjustment unit 540 increases and decreases both the amplitude of the alternating current output from the positive-electrode side power supply unit 531 and the amplitude of the alternating current output from the negative-electrode side power supply unit 532 such that both the alternating-current potential difference V1 on the positive electrode side and the alternating-current potential difference V2 on the negative electrode side have a prescribed value. The alternating current adjustment unit 540 is realized, for example, by a PI (Proportional Integral) control circuit.

Further, the alternating current adjustment unit 540 outputs command signals for the positive-electrode side power supply unit 531 and the negative-electrode side power supply unit 532 as alternating currents I1 and I2 to be output from the positive-electrode side power supply unit 531 and the negative-electrode side power supply unit 532 to the computation unit 550.

The alternating current adjustment unit 540 includes a positive-electrode side detector circuit 5411, a positive-electrode side subtractor 5421, a positive-electrode side integration circuit 5431, a positive-electrode side multiplier 5441, a negative-electrode side detector circuit 5412, a negative-electrode side subtractor 5422, a negative-electrode side integration circuit 5432 and a negative-electrode side multiplier 5442.

The alternating current adjustment unit 540 further includes reference power supplies 545 and alternating-current signal sources 546. The reference power supply 545 outputs a potential difference determined with 0 V (volt) as a reference (hereinafter, referred to as a "reference voltage Vs"). The reference voltage Vs is a value determined in advance to match the alternating-current potential difference V1 on the positive electrode side and the alternating-current potential difference V2 on the negative electrode side. The alternating-current signal source 546 is an oscillation source for oscillating an alternating-current signal of the reference frequency fb. The reference frequency fb is set at a prescribed frequency suitable to measure the internal impedance of the fuel cell stack 1.

The positive-electrode side detector circuit 5411 removes an unnecessary signal from the alternating-current potential Va generated in a signal line connecting between the direct current shut-off unit 511 and the positive-electrode side power supply unit 531 and converts the alternating-current potential Va into a direct-current signal proportional to an amplitude of the alternating-current potential Va. For example, the positive-electrode side detector circuit 5411 outputs an average or effective value of the alternating-current potential difference V1 as the direct-current signal.

In the present embodiment, the positive-electrode side detector circuit 5411 is realized by a synchronous detector circuit. The positive-electrode side detector circuit 5411 extracts a real axis component V1r and an imaginary axis component V1x of the alternating-current potential difference V1 from the alternating-current potential Va generated at an output terminal of the positive-electrode side power supply unit 531. Then, the positive-electrode side detector circuit 5411 outputs the real axis component V1r of the alternating-current potential difference V1 to the positive-electrode side subtractor 5421. The real axis component V1r is a value equivalent to an average or effective value of the alternating-current potential difference V1. As a phase of the alternating-current potential difference V1 is retarded with respect to the alternating current I1, the value of the real axis component V1r becomes smaller. The detail of the positive-electrode side detector circuit 5411 is described later with reference to FIG. 6.

The positive-electrode side subtractor 5421 calculates a differential signal indicating a deviation width of the real axis component V1r from the reference voltage Vs by subtracting the reference voltage Vs from the real axis component V1r of the alternating-current potential difference V1 output from the positive-electrode side detector circuit 5411. For example, as the deviation width from the reference voltage Vs increases, a signal level of the differential signal increases.

The positive-electrode side integration circuit 5431 averages the differential signal or adjusts the sensitivity of the differential signal by integrating the differential signal output from the positive-electrode side subtractor 5421. Then, the positive-electrode side integration circuit 5431 outputs the integrated differential signal as a positive-electrode side current command value I1c to the positive-electrode side multiplier 5441.

The positive-electrode side multiplier 5441 outputs a command signal of the alternating current I1 for converging the alternating-current potential difference V1 to the reference voltage Vs by multiplying an alternating-current signal of the reference frequency fb output from the alternating-current signal source 546 by the positive-electrode side current command value I1c. An amplitude of the command signal is increased with an increase of the positive-electrode side current command value T1c by the positive-electrode side multiplier 5441. The positive-electrode side multiplier 5441 outputs its command signal of the alternating current I1 to the positive-electrode side power supply unit 531. The alternating-current voltage signal Vi input as the command signal of the alternating current I1 to the positive-electrode side power supply unit 531 is converted into the alternating-current signal Io by the positive-electrode side power supply unit 531 and output to the positive electrode 211 of the fuel cell stack 1.

It should be noted the negative-electrode side detector circuit 5412, the negative-electrode side subtractor 5422, the negative-electrode side integration circuit 5432 and the negative-electrode side multiplier 5442 are respectively basically identically configured to the positive-electrode side detector circuit 5411, the positive-electrode side subtractor 5421, the positive-electrode side integration circuit 5431 and the positive-electrode side multiplier 5441.

Figure 6:
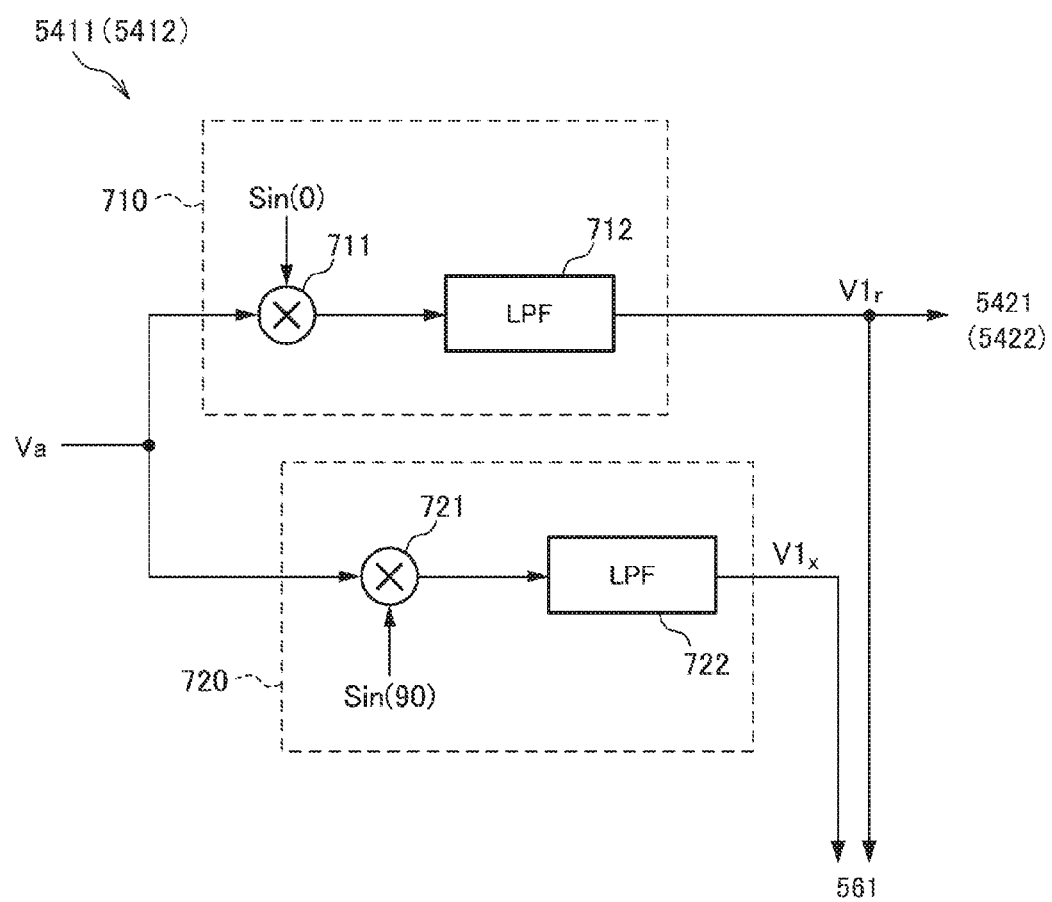
FIG. 6 is a diagram showing the detail of a positive-electrode side detector circuit provided in the alternating current adjustment unit.

FIG. 6 is a diagram showing an example of the configuration of the positive-electrode side detector circuit 5411.

The positive-electrode side detector circuit 5411 includes an in-phase component extraction unit 710 and an orthogonal component extraction unit 720.

The in-phase component extraction unit 710 extracts the real axis component V1r of the alternating-current potential difference V1 by multiplying the alternating-current potential Va from the positive-electrode side power supply unit 531 by an in-phase signal Sin(0) for detecting the same frequency component as the alternating current I1 output from the positive-electrode side power supply unit 531.

The in-phase signal Sin(0) is an alternating-current signal having the reference frequency fb and having the same phase as the alternating current output from the positive-electrode side power supply unit 531. The in-phase signal Sin(0) is input to the in-phase component extraction unit 710, for example, from the alternating-current signal source 546.

The in-phase component extraction unit 710 includes an in-phase multiplier 711 and an in-phase low-pass filter 712.

The in-phase multiplier 711 multiplies the alternating-current potential Va on the positive electrode side by the in-phase signal Sin(0). This causes an in-phase alternating-current signal corresponding to a degree of coincidence of a waveform of the alternating-current potential Va and that of the in-phase signal Sin(0) to be output from the in-phase multiplier 711. For example, if the alternating-current potential Va and the in-phase signal Sin(0) perfectly coincide in phase, an in-phase alternating-current signal having a full-wave rectification waveform is output. Further, as the degree of coincidence of the waveforms of the alternating-current potential Va and the in-phase signal Sin(0) increases, the real axis component V1r increases.

The in-phase low-pass filter 712 detects a direct-current component of the in-phase alternating-current signal as the real axis component V1r. In the present embodiment, the in-phase low-pass filter 712 is realized by a low-pass filter (LPF) for removing an alternating-current component of the in-phase alternating-current signal, i.e. a high-frequency range component and allowing the passage of a direct-current component of the in-phase alternating-current signal. The in-phase alternating-current signal smoothed by the in-phase low-pass filter 712 is input to the positive-electrode side subtractor 5421 and a phase difference detection unit 561.

As just described, the in-phase component extraction unit 710 rectifies the alternating-current potential Va by multiplying the alternating-current potential Va by the in-phase signal Sin(0) having the same phase as the output current I1 of the positive-electrode side power supply unit 531. In this way, only the alternating-current signal having the same frequency and phase as the output current I1 of the positive-electrode side power supply unit 531 can be extracted as the real axis component V1r from the alternating-current potential Va. Thus, even if the alternating-current potential Va is buried in noise, the real axis component V1r can be reliably detected.

The orthogonal component extraction unit 720 is provided to detect a phase difference between the alternating-current potentials Va and Vb.

The orthogonal component extraction unit 720 extracts the imaginary axis component V1x of the alternating-current potential difference V1 by multiplying the alternating-current potential Va by an orthogonal signal Sin(90) for detecting a component having the same frequency as the output current I1 of the positive-electrode side power supply unit 531 and having a phase orthogonal to that of the alternating current I1.

The orthogonal signal Sin(90) is an alternating-current signal having the reference frequency fb, a phase advanced by 90° with respect to the output current of the positive-electrode side power supply unit 531 and the same amplitude as the in-phase signal Sin(0). The orthogonal signal Sin(90) is input to the orthogonal component extraction unit 720 while turning, for example, the phase of the alternating-current signal source 546 by 90°.

The orthogonal component extraction unit 720 includes an orthogonal multiplier 721 and an orthogonal low-pass filter 722.

The orthogonal multiplier 721 multiplies the alternating-current potential Va by the orthogonal signal Sin(90). This causes an orthogonal alternating-current signal corresponding to a degree of coincidence of the waveform of the alternating-current potential Va and that of the orthogonal signal Sin(90) to be output from the orthogonal multiplier 721.

The orthogonal low-pass filter 722 detects a direct-current component of the orthogonal alternating-current signal as the imaginary axis component V1x. In the present embodiment, the orthogonal low-pass filter 722 is realized by a low-pass filter for removing an alternating-current component of the orthogonal alternating-current signal, i.e. a high-frequency range component and allowing the passage of a direct-current component of the orthogonal alternating-current signal. The orthogonal alternating-current signal smoothed by the orthogonal low-pass filter 722 is input as the imaginary axis component V1x of the detection signal to the phase difference detection unit 561.

As just described, the orthogonal component extraction unit 720 rectifies the alternating-current potential Va by multiplying the alternating-current potential Va by the orthogonal signal Sin(90). In this way, only the alternating-current signal having the same frequency as the output current of the positive-electrode side power supply unit 531 and having the phase advanced by 90° from that of the output current can be extracted as the imaginary axis component V1x from the alternating-current potential Va. Thus, even if the alternating-current potential Va is buried in noise, the imaginary axis component V1x can be reliably detected.

As described above, the positive-electrode side detector circuit 5411 detects the real axis component V1r and the imaginary axis component V1x of the alternating-current potential difference V1 on the basis of the alternating-current potential Va. Then, the positive-electrode side detector circuit 5411 outputs the real axis component V1r to the positive-electrode side subtractor 5421 to feed back the amplitude of the alternating current output from the positive-electrode side power supply unit 531. Further, the positive-electrode side detector circuit 5411 outputs the imaginary axis component V1x of the alternating-current potential difference V1 to the phase difference detection unit 561 to detect the phase difference between the alternating-current potentials generated at the positive electrode terminal 211 and the negative electrode terminal 212 of the fuel cell stack 1.

It should be noted that although an example in which the real axis component V1r of the alternating-current potential difference V1 is output to the positive-electrode side subtractor 5421 has been described in the present embodiment, a vector value V1p of the alternating-current potential difference V1 may be computed from the alternating-current potential Va and output to the positive-electrode side subtractor 5421. Specifically, the vector value Vp1 is obtained by computing a square root of the sum of a square value of the real axis component V1r and a square value of the imaginary axis component V1x as in the following equation.

[Equation 1]

$$V1p = \sqrt{V1r^2 \times V1x^2} \quad (1)$$

Further, an example in which the real axis component V1r and the imaginary axis component V1x of the alternating-current potential difference V1 are extracted from the alternating-current potential Va generated at the output terminal of the positive-electrode side power supply unit 531 has been described in the present embodiment. However, the real axis component V1r and the imaginary axis component V1x of the alternating-current potential difference V1 may be extracted from an output signal of the positive-electrode side potential difference detection unit 521 instead of from the alternating-current potential Va. For example, the real axis component V1r of the alternating-current potential difference VI can be detected by multiplying a detection signal indicating the alternating-current potential difference V1 output from the positive-electrode side potential difference detection unit 521 by the in-phase signal Sin(0).

As described above, the alternating current adjustment unit 540 adjusts the amplitude of the alternating current output from the positive-electrode side power supply unit 531 such that the real axis component V1r of the alternating-current potential difference V1 extracted from the alternating-current potential Va becomes the reference voltage Vs. Similarly, the alternating current adjustment unit 540 adjusts the amplitude of the alternating current output from the negative-electrode side power supply unit 532 such that the real axis component V2r of the alternating-current potential difference V2 extracted from the alternating-current potential Vb becomes the reference voltage Vs.

Since this causes the alternating-current potentials Va and Vb to be controlled to the same level, the amplitude of the alternating-current potential to be superimposed on the positive electrode terminal 211 and that of the alternating-current potential to be superimposed on the negative electrode terminal 212 become equal to each other. In this way, it can be prevented that the alternating current leaks from the impedance measuring device 5 toward the load 3 via the fuel cell stack 1. It should be noted that a control of the positive-electrode side power supply unit 531 and the negative-electrode side power supply unit 532 such that the alternating-current potentials Va and Vb become equal to each other is referred to as an "equipotential control" below.

However, since the power generation cells 10 equivalently have capacitance components besides resistance components, the equipotential control may not properly function due to the capacitance components combined in the fuel cell stack 1. A case where the equipotential control does not properly function is described below.

An equivalent circuit of the fuel cell stack 1 can be expressed as a circuit in which an internal resistance R1 on the positive electrode side and an internal resistance R2 on the negative electrode side, and a capacitance C1 on the positive electrode side and a capacitance C2 on the negative electrode side are connected in parallel as shown in FIG. 2. The inventors found out that the capacitances C1 and C2 largely changed depending on the operating state of the fuel cell stack 1, the operating state of the load 3 and the like.

For example, when power required from the load 3 suddenly increases during the power generation of the fuel cell stack 1 and an output current extracted from the fuel cell stack 1 increases, gas concentrations of the anode gas and the cathode gas in the fuel cell stack 1 increase. Associated with this, the capacitances C1 and C2 change and a phase difference Φ between the detection signal indicating the alternating-current potential difference V1 and the detection signal indicating the alternating-current potential difference V2 increases.

Figure 7:
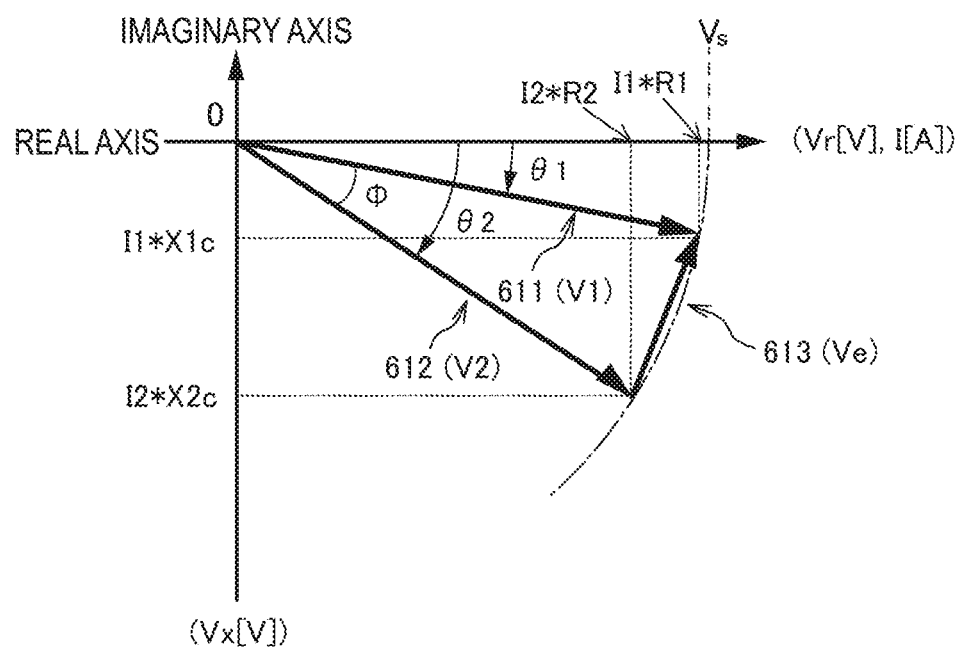
FIG. 7 is a graph showing a phase difference between alternating-current potential differences on a positive electrode side and a negative electrode side, FIG. 8 are charts showing an alternating current leaking to a load when a phase difference is generated.

FIG. 7 is a graph showing a phase deviation between the detection signals indicating the alternating-current potential differences V1 and V2.

FIG. 7 shows a vector 611 indicating the alternating-current potential difference V1, a vector 612 indicating the alternating-current potential difference V2 and a differential vector 613 indicating a potential difference Ve obtained by subtracting the vector 612 from the vector 611. Further, amplitudes of the detection signals are shown by dashed-dotted line.

It should be noted that a horizontal axis shows the real axis components of the alternating-current potential differences V1 and V2 with the alternating currents I1 and I2 as references and a vertical axis shows the imaginary axis components of the alternating-current potential differences V1 and V2.

In FIG. 7, the magnitudes of the vectors 611 and 612 are adjusted to the reference voltage Vs and the vectors 611 and 612 when a reactance of the capacitance C2 becomes smaller than that of the capacitance C1 due to the operating state of the fuel cell stack 1 or the load 3 are shown.

The vector 611 is delayed by a phase angle of θ1 with respect to the alternating current I1 due to the capacitance C1. The real axis component V1r of the vector 611 is a value obtained by multiplying the alternating current I1 and the internal resistance R1. The imaginary axis component V1x is a value obtained by multiplying the alternating current I1 and a capacitance reactance X1c. It should be noted that the capacitance reactance X1c is an inverse of a value obtained by multiplying an angular velocity Φ of the alternating current I1 and the capacitance C1.

The vector 612 is delayed by a phase angle of θ2 with respect to the alternating current I2 due to the capacitance C2. The real axis component V2r of the vector 612 is a value obtained by multiplying the alternating current I2 and the internal resistance R2. The imaginary axis component V2x is a value obtained by multiplying the alternating current I2 and a capacitance reactance X2c. It should be noted that the capacitance reactance X2c is an inverse of a value obtained by multiplying an angular velocity Φ of the alternating current I2 and the capacitance C2.

Here, a case where the phase angle θ1 of the vector 611 becomes smaller than the phase angle θ2 of the vector 612 is described.

In the fuel cell stack 1, the anode discharge port 41b is provided on the side of the positive electrode terminal 211 as shown in FIG. 1. For example, in a fuel cell system with a purge valve for discharging impurity gas such as nitrogen from the anode discharge port 41b, the impurity gas tends to be accumulated near the anode discharge port 41b, i.e. on the side of the positive electrode terminal 211. Thus, a hydrogen gas concentration of a group of the power generation cells laminated from the positive electrode terminal 211 to the intermediate-point terminal 213 may become lower than that of a group of the power generation cells laminated from the intermediate-point terminal 213 to the negative electrode terminal 212.

In such a situation, as the hydrogen gas concentration in the fuel cell stack 1 decreases, the capacitance components of the power generation cells 10 with respect to the alternating current become smaller. Thus, the capacitance C1 becomes smaller than the capacitance C2. As a result, as shown in FIG. 7, the phase angle θ1 of the vector 611 becomes smaller than the phase angle θ2 of the vector 612 and the phase difference Φ is generated between the detection signal indicating the alternating-current potential difference V1 and the detection signal indicating the alternating-current potential difference V2.

Figure 8:
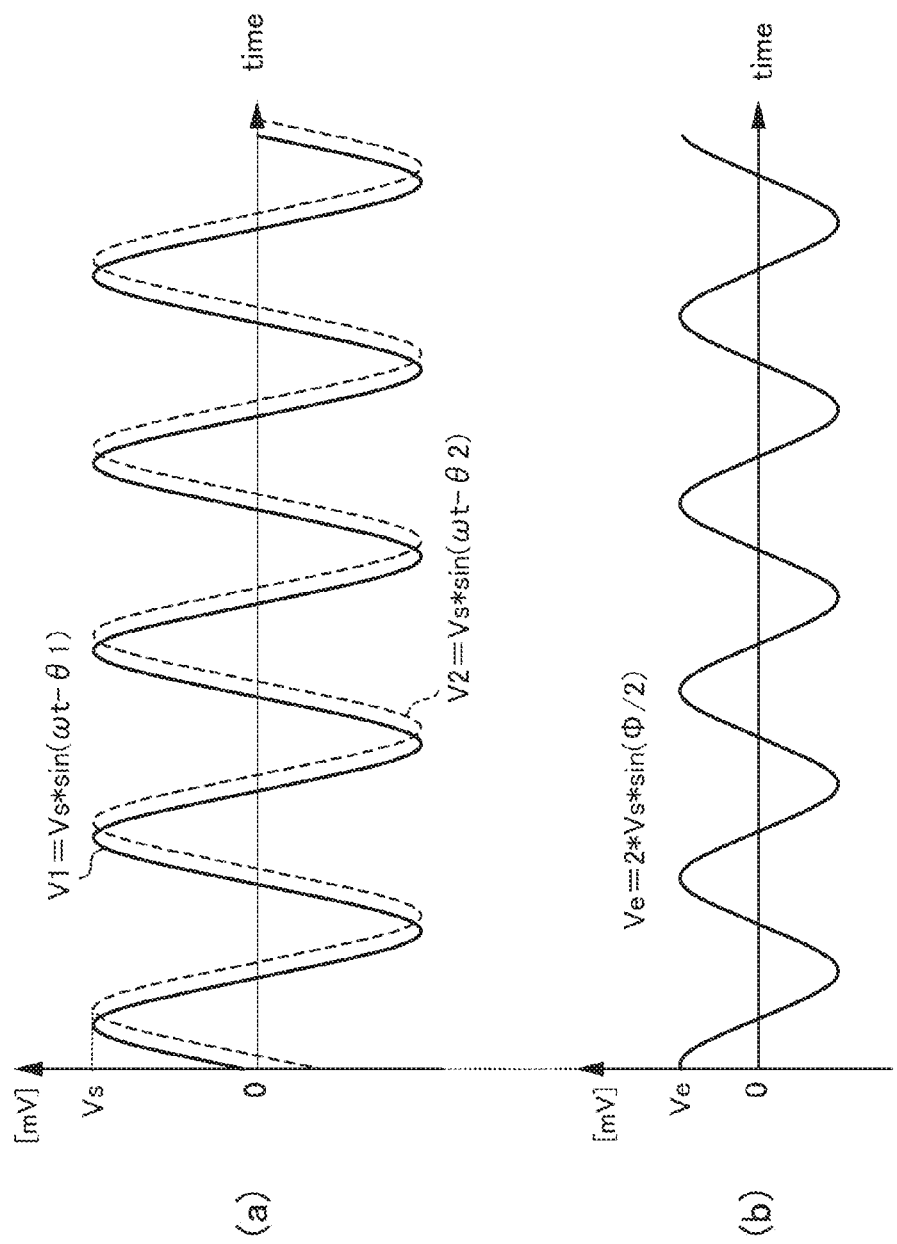

FIG. 8 are conceptual charts showing an alternating current leaking to the load 3 when the phase difference Φ is generated between the detection signals indicating the alternating-current potential differences V1 and V2.

FIG. 8(a) is a chart showing waveforms of the alternating-current potential difference V1 of the vector 611 and the alternating-current potential difference V2 of the vector 612 shown in FIG. 7. FIG. 8(b) is a chart showing a waveform of the alternating-current potential difference Ve of the differential vector 613. A vertical axis represents amplitude and a horizontal axis is a common time axis in both FIGS. 8(a) and 8(b).

As shown in FIG. 8(a), the phase difference Φ between the phase angle θ1 of the vector 611 and the phase angle θ2 of the vector 612 is generated between the alternating-current potential differences V1 and V2. In such a case, as shown in FIG. 8(b), the alternating-current potential difference Ve is generated between the positive electrode terminal 211 and the negative electrode terminal 212 of the fuel cell stack 1.

Due to the alternating-current potential difference Ve, a part of the alternating current I1 or I2 output from the positive-electrode side power supply unit 531 and the negative-electrode side power supply unit 532 to the fuel cell stack 1 leaks toward the load 3 without flowing in the fuel cell stack 1. Here, a part of the alternating current I2 output from the negative-electrode side power supply unit 532 leaks toward the load 3 from the negative electrode terminal 212 of the fuel cell stack 1.

When the part of the alternating current I2 leaks to the load 3, an error is created between the current command value I2 used to compute the internal resistance R2 and an actual value of the current actually flowing through the resistance component R2. Thus, an error of the calculated internal resistance R2 becomes large. Since the amount of the current leaking to the load 3 also increases as the phase difference Φ increases, the measurement accuracy of the internal resistance R2 is reduced.

Thus, errors included in measurement results of the internal resistances R1 and R2 may be beyond an allowable range in a state where the capacitance C1 or C2 vary depending on the operating state of the fuel cell stack 1 and the phase difference Φ is created between the detection signals of the alternating-current potential differences V1 and V2.

Even in such a measurement state, the both signal levels of the detection signals output from the positive-electrode side detector circuit 5411 and the negative-electrode side detector circuit 5412 indicate a fixed value by the equipotential control. Thus, the impedance is measured without detecting that the measurement state of the impedance measuring device 5 is defective.

Accordingly, in the embodiment of the present invention, a phase difference of the alternating-current potentials supplied to both the positive electrode terminal 211 and the negative electrode terminal 212 due to the capacitance components of the fuel cell stack 1 is detected and whether or not the measurement state where the impedance is measured is defective is diagnosed on the basis of that phase difference.

Figure 5:
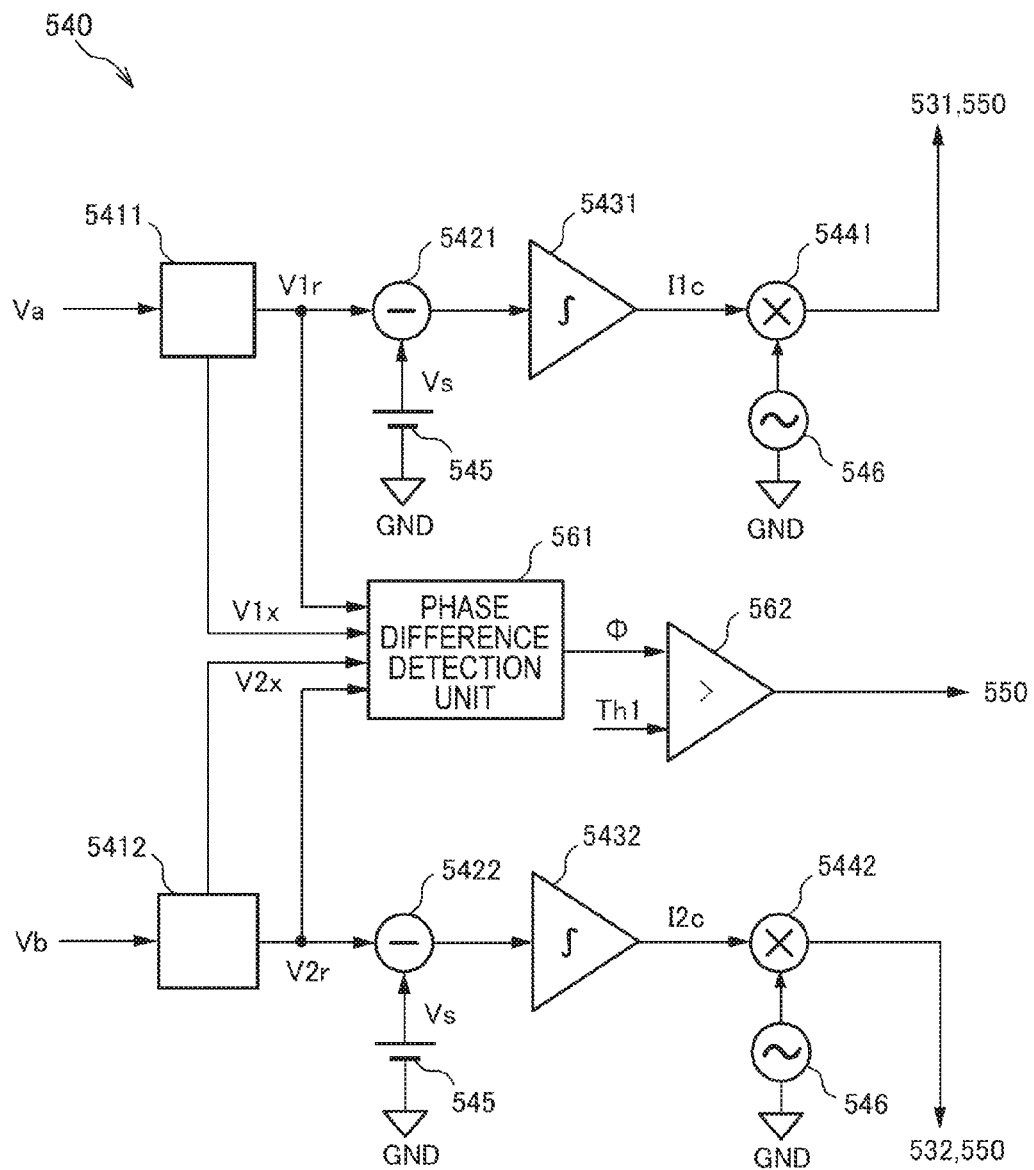
FIG. 5 is a diagram showing the detail of an alternating current adjustment unit for adjusting the alternating currents to the positive and the negative electrodes and a phase difference detection unit.

In the first embodiment, this is realized by the phase difference detection unit 561 and a determination circuit 562 shown in FIG. 5.

The phase difference detection unit 561 is a circuit for detecting a phase difference between an alternating-current potential generated at the positive electrode terminal 211 and an alternating-current potential generated at the negative electrode terminal 212 of the fuel cell stack 1. The phase difference detection unit 561 calculates the phase difference between the alternating-current potential differences V1 and V2 on the basis of the detection signal of the alternating-current potential difference V1 output from the positive-electrode side detector circuit 5411 and the detection signal of the alternating-current potential difference V2 output from the negative-electrode side detector circuit 5412.

Specifically, the phase difference detection unit 561 computes the phase angle θ1 of the alternating-current potential difference V1 using the real axis component V1r and the imaginary axis component V1x of the alternating-current potential difference V1 output from the positive-electrode side detector circuit 5411 in accordance with the following equation.

[Equation 2]

$$\theta 1 = \tan^{-1}\left(\frac{V1r}{V1x}\right) \quad (2)$$

Further, the phase difference detection unit 561 computes the phase angle θ2 of the alternating-current potential difference V2 using the real axis component V2r and the imaginary axis component V2x of the alternating-current potential difference V2 output from the positive-electrode side detector circuit 5412 in accordance with the following equation.

[Equation 3]

$$\theta 2 = \tan^{-1}\left(\frac{V2r}{V2x}\right) \quad (3)$$

Then, the phase difference detection unit 561 calculates a value obtained by subtracting the phase angle θ2 of the alternating-current potential difference V2 from the phase angle θ1 of the alternating-current potential difference V1 as the phase difference Φ between the alternating-current potential generated at the positive electrode terminal 211 and the alternating-current potential generated at the negative electrode terminal as in the following equation and outputs it to the determination circuit 562.

[Equation 4]

$$\Phi = \theta_1 - \theta_2 \quad (4)$$

The determination circuit 562 compares the phase difference $\Phi$ output from the phase difference detection unit 561 and a predetermined allowable value Th1 and diagnoses whether or not the measurement state where the internal resistances R1 and R2 are measured is defective.

The allowable value Th1 of the phase difference $\Phi$ is an upper limit value in a range where an measurement error is allowable, i.e. a threshold value and set by experimental data or the like. It should be noted that a technique for determining the allowable value Th1 is described later with reference to FIG. 10.

In the present embodiment, the determination circuit 562 judges that the equipotential control is defective due to the phase difference $\Phi$ and generates a determination signal of H (High)-level indicating that that the measurement state is defective when the phase difference $\Phi$ is larger than the allowable value Th1 or when the phase difference $\Phi$ is equal to the allowable value Th1.

On the other hand, the determination circuit 562 generates a determination signal of L (Low)-level indicating that the measurement state is not defective when the phase difference $\Phi$ is smaller than the allowable value Th1. Then, the determination circuit 562 outputs the generated determination signal to the controller unit 6 or the computation unit 550.

Next, the computation unit 550 is described in detail with reference to FIG. 9.

The detection signals indicating the alternating-current potential differences V1 and V2 output from the positive-electrode side potential difference detection unit 521 and the negative-electrode side potential difference detection unit 522, and the command signals of the alternating currents I1 and I2 for the positive-electrode side power supply unit 531 and the negative-electrode side power supply unit 532 are input to the computation unit 550. Specifically, the computation unit 550 obtains the detection values of the alternating currents I1 and I2 and those of the alternating-current potential differences V1 and V2.

The computation unit 550 computes the internal impedance of the fuel cell stack 1 on the basis of the alternating-current potential differences V1 and V2 and the alternating currents I1 and I2.

For example, the computation unit 550 computes the real axis component and the imaginary axis component of the alternating-current potential difference V1 on the basis of the detection signal from the positive-electrode side potential difference detection unit 521 and computes the real axis component and the imaginary axis component of the alternating-current potential difference V2 on the basis of the detection signal from the negative-electrode side potential difference detection unit 522.

In the present embodiment, the computation unit 550 calculates the internal resistance R1 by dividing the real axis component of the alternating-current potential difference V1 by the alternating current I1 and calculates the internal resistance R2 by dividing the real axis component of the alternating-current potential difference V2 by the alternating current I2. It should be noted that the computation unit 550 may calculate the capacitances C1 and C2 using the imaginary axis components of the alternating-current potential differences V1 and V2.

It should be noted that the computation unit 550 may compute average or effective values of the alternating-current potential differences V1 and V2 on the basis of the detection signals from the positive-electrode side potential difference detection unit 521 and the negative-electrode side potential difference detection unit 522 and compute average or effective values of the alternating currents I1 and I2 on the basis of the command signals from the alternating current adjustment unit 540. Then, the computation unit 550 calculates the internal resistance R1 by dividing the average or effective value of the alternating-current potential difference V1 by the average or effective value of the alternating current I1 and the computation unit 550 calculates the internal resistance R2 by dividing the average or effective value of the alternating-current potential difference V2 by the average or effective value of the alternating current I2.

The computation unit 550 includes an AD (Analog-Digital) converter 551 and a microcomputer chip 552.

The AD converter 551 converts the command signals (I1, I2) of the alternating currents and the detection signals (V1, V2) of the alternating-current potential differences, which are analog signals, into digital numeric signals and transfers them to the microcomputer chip 552.

The microcomputer chip 552 stores a program for calculating internal resistances Rn and the internal resistance R of the entire fuel cell stack 1 in advance. The microcomputer chip 552 successively computes at prescribed minute time intervals or outputs a computation result according to a request of the controller unit 6. It should be noted that the internal resistances Rn and the internal resistance R of the entire fuel cell stack 1 are computed by the following equations.

[Equations 5]

$$\text{Computation equation for resistance } Rn = \frac{Vn}{In}(n = 1, 2, \ldots, n) \quad (5\text{-}1)$$

$$\text{Overall resistance value } R = \sum Rn \quad (5\text{-}2)$$

The computation unit 550 may be realized by an analog computation circuit using an analog computation IC. According to the analog computation circuit, a temporally continuous change of the resistance value can be output to the controller unit 6.

The controller unit 6 obtains the internal resistance R output from the computation unit 550 as an impedance measurement result and obtains the determination signal output from the determination circuit 562 as a measurement state determination result. The determination signal is input to the controller unit 6, for example, via the computation unit 550.

The controller unit 6 controls the operating state of the fuel cell stack 1 according to the measurement result of the internal resistance R. For example, the controller unit 6 judges that the electrolyte membranes of the fuel cell stack 1 are dry and reduces a flow rate of the cathode gas supplied to the fuel cell stack 1 when the internal resistance R is high. In this way, the amount of moisture carried out from the fuel cell stack 1 can be reduced.

In the present embodiment, the controller unit 6 judges that the measurement state is defective and discards the measurement result of the internal resistance R when a balance between the capacitances C1 and C2 is lost, the phase difference Φ of the alternating-current potential differences V1 and V2 increases and the determination signal becomes H-level.

Then, the controller unit 6 sets the internal resistance R computed by the computation unit 550 before the determination signal is switched from L-level to H-level as the measurement result and fixes the measurement result until the determination signal returns to L-level.

Specifically, every time the internal resistance R is obtained in a prescribed sampling cycle, the controller unit 6 records that resistance value in time series in an unillustrated memory and holds it in the memory for a specific period. Then, the controller unit 6 calculates a fixed value to be used as the measurement result on the basis of a plurality of resistance values held in the memory when the determination signal is switched from L-level to H-level. For example, an average value of the plurality of resistance values held in the memory, an update value recorded last in the memory out of the plurality of resistance values or the like is used as the fixed value.

It should be noted that although an example in which the measurement result of the internal resistance R is discarded when the measurement state of the impedance measuring device 5 is determined to be defective has been described here, measurement data in which a code indicating a measurement failure, the phase difference Φ detected by the phase difference detection unit 561 and the like are attached to the measurement result may be generated without discarding the measurement result. A plurality of control blocks for controlling a cathode gas supply flow rate, an anode gas supply flow rate, a cooling water temperature and the like of the fuel cell stack 1 are present in the controller unit 6 and, if required measurement accuracy of the internal resistance R differs for each control block, how to handle the measurement result can be changed according to the code attached to the measurement data.

Further, although an example in which the determination circuit 562 is provided in the alternating current adjustment unit 540 has been described in the present embodiment, there is no limitation to this.

For example, the phase difference Φ detected by the phase difference detection unit 561 may be directly input to the controller unit 6 and the controller unit 6 may diagnose whether or not the measurement state of the impedance measuring device 5 is defective. Alternatively, the phase difference Φ may be input to the computation unit 550 and the computation unit 550 may diagnose the measurement state and may discard the measurement result and output the measurement result before the determination of a measurement failure to the controller unit 6 when the measurement failure is determined.

Furthermore, although an example in which the phase difference Φ of the alternating-current potential differences V1 and V2 is computed in the phase difference detection unit 561 has been described in the present invention, the phase difference Φ may be computed in the computation unit 550.

Specifically, the real axis component V1r and the imaginary axis component V1x output from the positive-electrode side detector circuit 5411 and the real axis component V2r and the imaginary axis component V2x output from the negative-electrode side detector circuit 5412 are input to the computation unit 550 and the phase difference Φ is computed in accordance with equations (2) to (4) in the computation unit 550.

Further, although an example in which the phase difference Φ of the alternating-current potential differences V1 and V2 is used to detect whether or not the measurement state is defective has been described in the present embodiment, a difference ΔVx between the imaginary axis component V1x on the positive electrode side and the imaginary axis component V2x on the negative electrode side may be used.

The phase difference Φ of the alternating-current potential differences V1 and V2 is in a proportional relationship with the difference ΔVx obtained by subtracting the imaginary axis component V2x on the negative electrode side from the imaginary axis component V1x on the positive electrode side as shown in the following equation. For example, as the phase difference Φ of the detection signals increases, the difference ΔVx of the imaginary axis components increases.

[Equation 6]

$$\Phi \propto (V1x - V2x) \qquad (6)$$

Accordingly, by utilizing the relationship of equation (6), the measurement state can be determined to be defective when the difference ΔVx of the imaginary axis components exceeds a prescribed allowable value. It should be noted that the allowable value is an upper limit value in a range where an impedance measurement error is allowable, and set according to a system design from experimental data or the like.

Next, a setting technique for setting the allowable value Th1 for the phase difference Φ between the alternating-current potentials Va and Vb is described.

Figure 10:
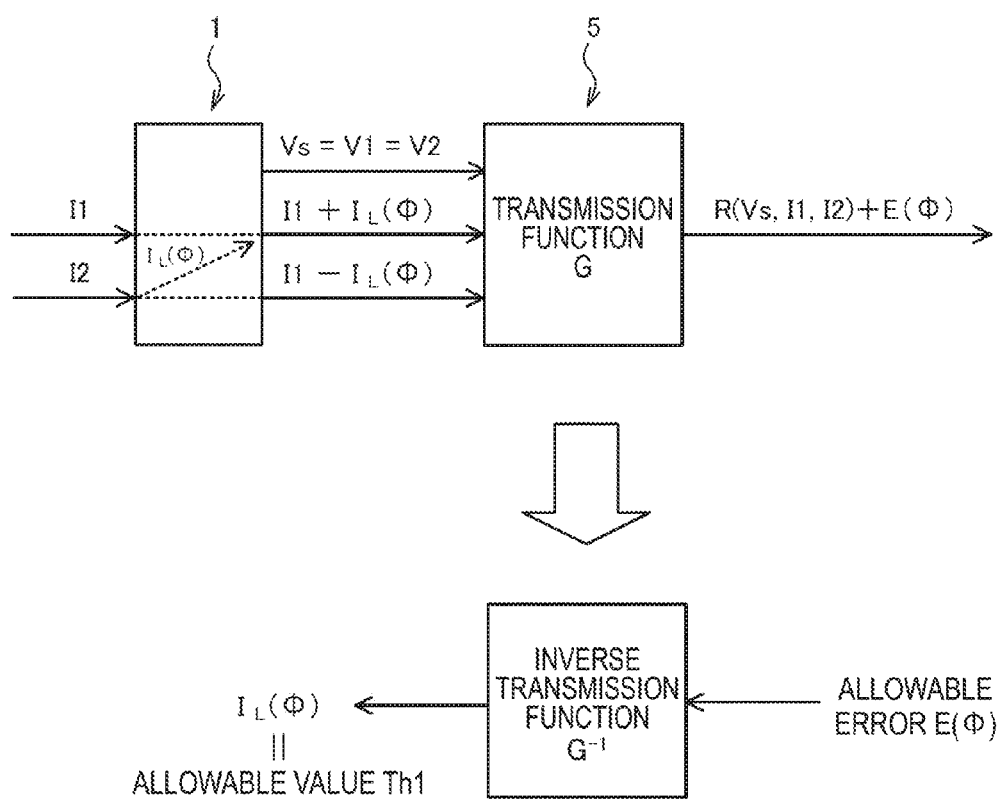
FIG. 10 is a chart showing an example of a technique for determining an allowable value for a phase difference.

FIG. 10 is a diagram showing an example of the setting technique for setting the allowable value for the phase difference Φ used in the determination circuit 562.

In FIG. 10, it is assumed that a relationship of a leakage current $I_L(\Phi)$, whose amplitude value changes according to the magnitude of the phase difference Φ, and an impedance measurement error E is linear. In such a case, a transmission function G is computed by modeling a circuit configuration of the impedance measuring device 5.

As a circuit model of the transmission function G, the alternating currents I1 and I2 on the positive and negative electrode sides are input to the fuel cell stack 1. Then, the alternating-current potential differences V1 and V2, the alternating currents I1 and I2 and the leakage current $I_L(\Phi)$, which is a part of the alternating current I1 or I2 leaking to the load 3 from one electrode terminal of the fuel cell stack 1 and flowing to the other electrode terminal, are input from the fuel cell stack 1 to the impedance measuring device 5. This causes an measurement error E(Φ) corresponding to the leakage current $I_L(\Phi)$ to be added to the internal resistance R, and that addition value is output as a measurement result from the impedance measuring device 5.

Inputs of this transmission function G include the alternating-current potential differences V1 and V2 on the positive and negative electrode sides when being adjusted to the reference voltage Vs, an alternating current $(I1-I_L)$ on the positive electrode side obtained by subtracting the leakage current $I_L$ from the alternating current I1 and an alternating current $(I2+I_L)$ on the negative electrode side obtained by adding the leakage current $I_L$ to the alternating current I2. An output of the transmission function G in response to these inputs is a value obtained by adding the measurement error E(Φ) to the internal resistance R (Vs, I1, I2).

By substituting the allowable value E(Φ) of the measurement error determined according to the usage of the measurement result into an inverse $G^{-1}$ of such a transmission function G, the leakage current $I_L(\Phi)$ is calculated and this calculation value is used as a determination value for determining whether or not the measurement state is defective. The allowable value Th1 of the phase difference $\Phi$ is determined by this determination value.

It should be noted that although an example in which the allowable value Th1 is set by computing the transmission function G has been described here, there is no limitation to this. For example, a relationship between the phase difference $\Phi$ detected by the phase difference detection unit 561 and the measurement error $E(\Phi)$ by the impedance measuring device 5 may be obtained in advance by an experiment or the like and the phase difference $\Phi$ corresponding to the allowable measurement error $E(\Phi)$ may be set as the allowable value Th1.

Further, although an example in which the allowable value Th1 is fixed at a predetermined value has been described in the present embodiment, the allowable value Th1 may be appropriately changed in consideration of deterioration causes since characteristics of substances constituting the fuel cell stack 1 are deteriorated as the use time of the fuel cell stack 1 becomes longer.

For example, a data table or a function expression indicating a relationship of an integrated value of the use time of the fuel cell stack 1 and the allowable value of the phase difference $\Phi$ is stored in advance in the impedance measuring device 5 and the allowable value Th1 is changed such as at the start-up of the impedance measuring device 5 using such a data table or the like. Further, the allowable value Th1 may be set or revised in consideration of a variable element due to a reduction in the oscillation accuracy of the alternating currents of the positive-electrode side power supply unit 531 and the negative-electrode side power supply unit 532 provided in the impedance measuring device 5 besides the integrated use time of the fuel cell stack 1.

In this way, the allowable value used to determine whether or not the impedance measurement state is defective can be properly set. Thus, whether or not the measurement state is defective can be properly diagnosed and reliability for the measurement result can be enhanced.

Figure 11:
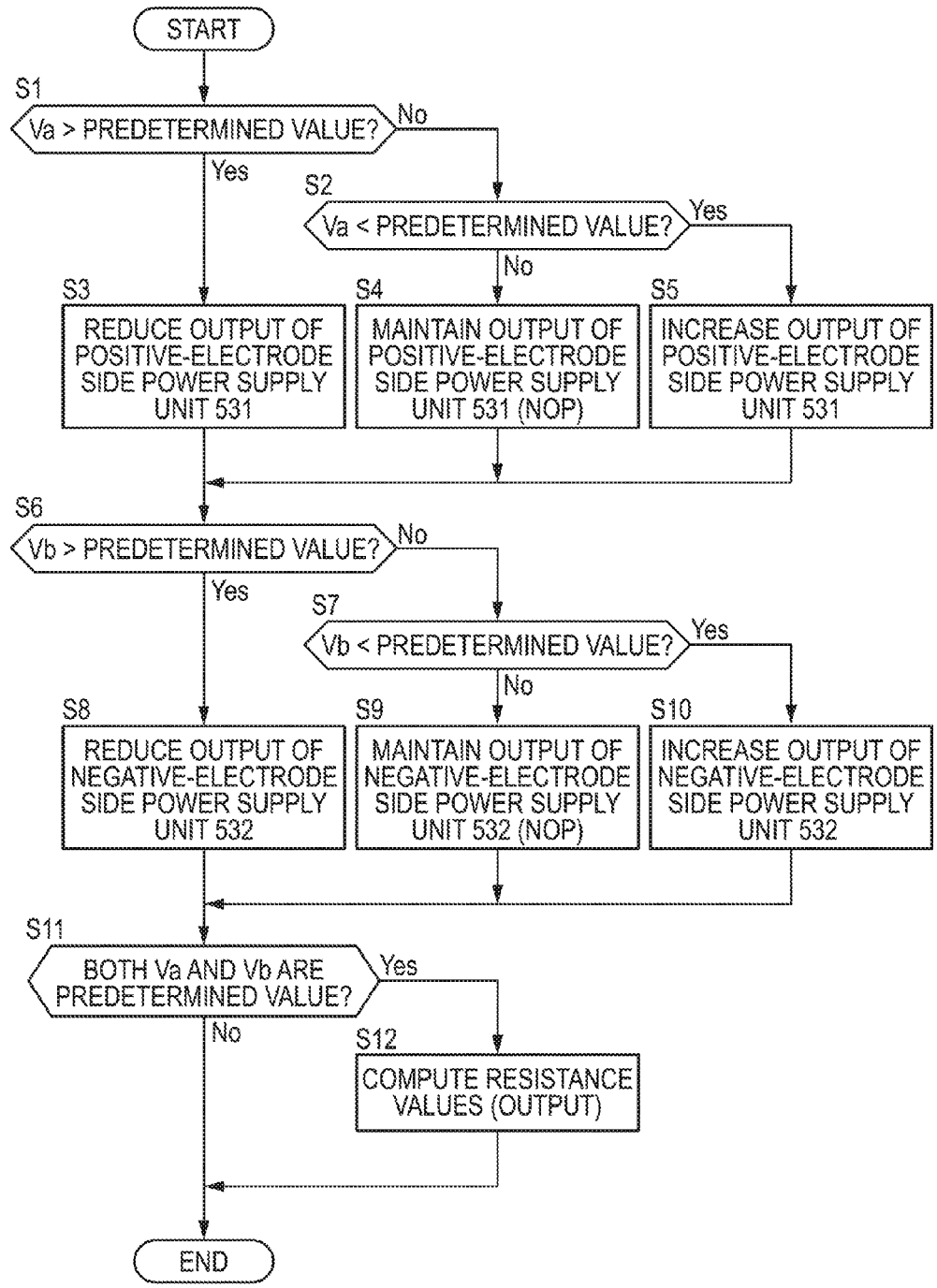
FIG. 11 is a flow chart showing an equipotential control method by the alternating current adjustment unit, FIG. 12 are time charts when an equipotential control is executed.

FIG. 11 is a flow chart showing an example of a control method when the control executed by the alternating current adjustment unit 540 is realized by a controller.

In Step S1, the controller determines whether or not the positive electrode alternating-current potential Va is larger than a prescribed value. The controller proceeds to Step S2 when a determination result is negative while proceeding to Step S3 when the determination result is affirmative.

In Step S2, the controller determines whether or not the positive electrode alternating-current potential Va is smaller than the prescribed value. The controller proceeds to Step S4 when a determination result is negative while proceeding to Step S5 when the determination result is affirmative.

In Step S3, the controller reduces the output of the positive-electrode side power supply unit 531. Specifically, the controller reduces the amplitude of the alternating current I1. In this way, the positive electrode alternating-current potential Va decreases.

In Step S4, the controller maintains the output of the positive-electrode side power supply unit 531. In this way, the positive electrode alternating-current potential Va is maintained.

In Step S5, the controller increases the output of the positive-electrode side power supply unit 531. In this way, the positive electrode alternating-current potential Va increases.

In Step S6, the controller determines whether or not the negative electrode alternating-current potential Vb is larger than the prescribed value. The controller proceeds to Step S7 when a determination result is negative while proceeding to Step S8 when the determination result is affirmative.

In Step S7, the controller determines whether or not the negative electrode alternating-current potential Vb is smaller than the prescribed value. The controller proceeds to Step S9 when a determination result is negative while proceeding to Step S10 when the determination result is affirmative.

In Step S8, the controller reduces the output of the negative-electrode side power supply unit 532. In this way, the negative electrode alternating-current potential Vb decreases.

In Step S9, the controller maintains the output of the negative-electrode side power supply unit 532. In this way, the negative electrode alternating-current potential Vb is maintained.

In Step S10, the controller increases the output of the negative-electrode side power supply unit 532. In this way, the negative electrode alternating-current potential Vb increases.

In Step S11, the controller determines whether or not the alternating-current potentials Va and Vb are the prescribed value. The controller proceeds to Step S12 when a determination result is affirmative while exiting from the process when the determination result is negative.

In Step S12, the controller computes the internal resistance values in accordance with the aforementioned equations (5-1), (5-2).

Figure 12:
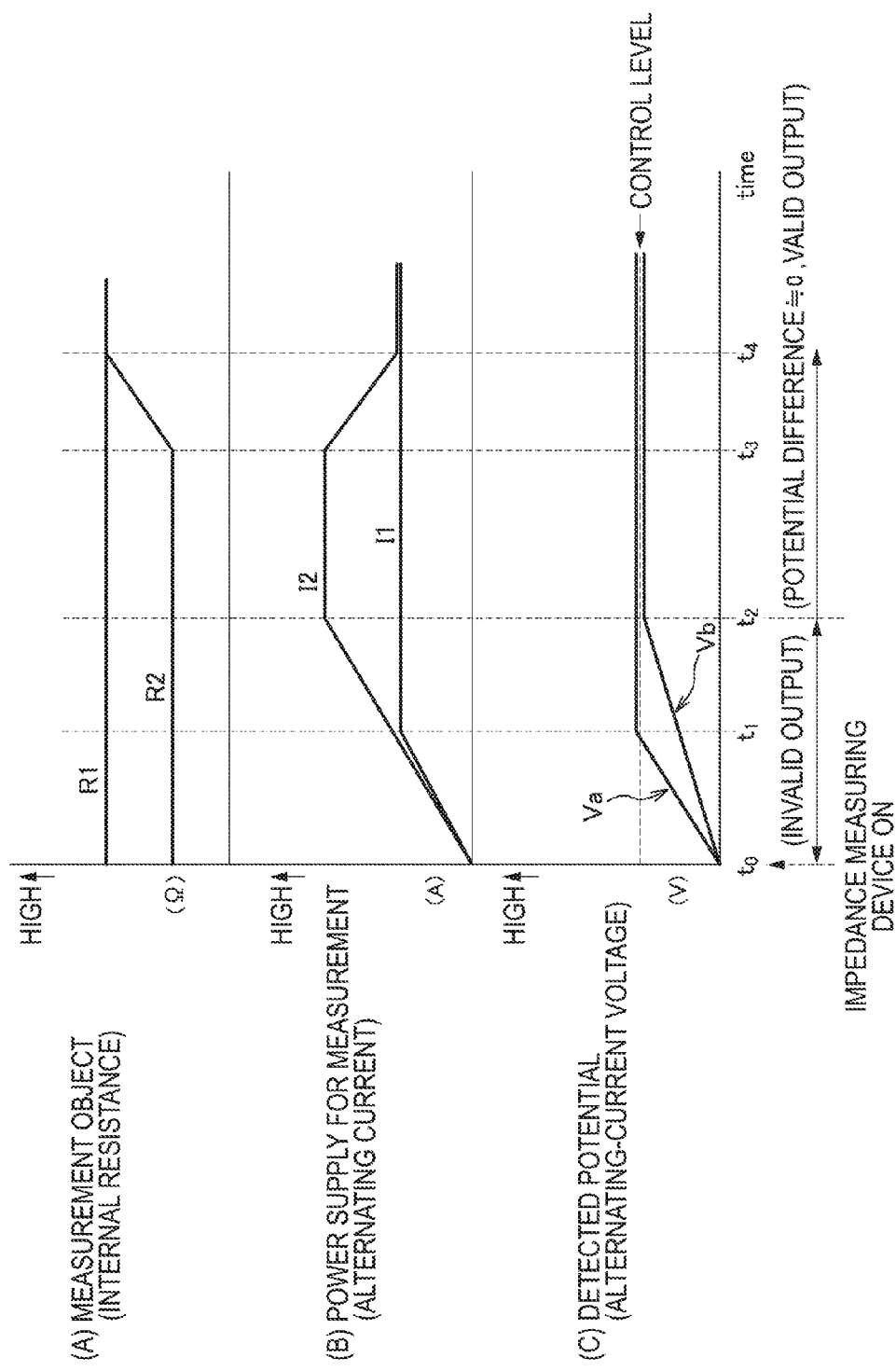

FIG. 12 are time charts when the impedance measuring device 5 is controlled by the controller. It should be noted that step numbers are also written to make correspondence with the flow chart easily understandable.

In an initial stage in FIG. 12, the internal resistance value R1 on the positive electrode side is higher than the internal resistance value R2 on the negative electrode side (FIG. 12(A)). The controller starts the control in such a state.

At time t0, neither the positive electrode alternating-current potential Va nor the negative electrode alternating-current potential Vb has reached a control level (FIG. 12(C)). In this state, the controller repeats Steps S1→S2→S5→S6→S7→S10→S11. This causes the alternating current I1 on the positive electrode side and the alternating current I2 on the negative electrode side to increase (FIG. 12(B)).

When the positive electrode alternating-current potential Va reaches the control level at time t1 (FIG. 12(C)), the controller repeats Steps S1→S2→S4→S6→S7→S10→S11. This causes the alternating current I1 on the positive electrode side to be maintained and the alternating current I2 on the negative electrode side to increase (FIG. 12(B)).

When the negative electrode alternating-current potential Vb also reaches the control level to have the same level as the positive electrode alternating-current potential Va at time t2 (FIG. 12(C)), the controller repeats Steps S1→S2→S4→S6→S7→S9→S11→S12. This causes the alternating current I1 on the positive electrode side and the alternating current I2 on the negative electrode side to be maintained. Then, the internal resistance value R1 on the positive electrode side and the internal resistance value R2 on the negative electrode side are computed in accordance with equation (5-1). Then, the overall internal resistance value R is computed by adding the internal resistance value R1 on the positive electrode side and the internal resistance value R2 on the negative electrode side.

The internal resistance value R2 on the negative electrode side increases due to a change in the wet state of the fuel cell stack 1 or the like at and after time t3 (FIG. 12(A)). In this case, the controller repeats Steps S1→S2→S4→S6→S8→S11→S12. Since the alternating current I2 on the negative electrode side is reduced in accordance with an increase of the internal resistance value R2 on the negative electrode side by processing in this way, the negative electrode alternating-current potential Vb is maintained at the same level as the positive electrode alternating-current potential Va. Thus, the internal resistance R is computed also in this state.

At and after t4, the internal resistance value R2 on the negative electrode side coincides with the internal resistance value R1 on the positive electrode side (FIG. 12(A)). In this case, the controller repeats Steps S1→S2→S4→S6→S7→S9→S11→S12. The alternating-current potential Va on the positive electrode side and the alternating-current potential Vb on the negative electrode are maintained at the same level (FIG. 12(C)) by processing in this way, and the internal resistance R is computed.

Next, functions and effects when the measurement state is acceptable due to the equipotential control of the impedance measuring device 5 are described.

Figure 13:
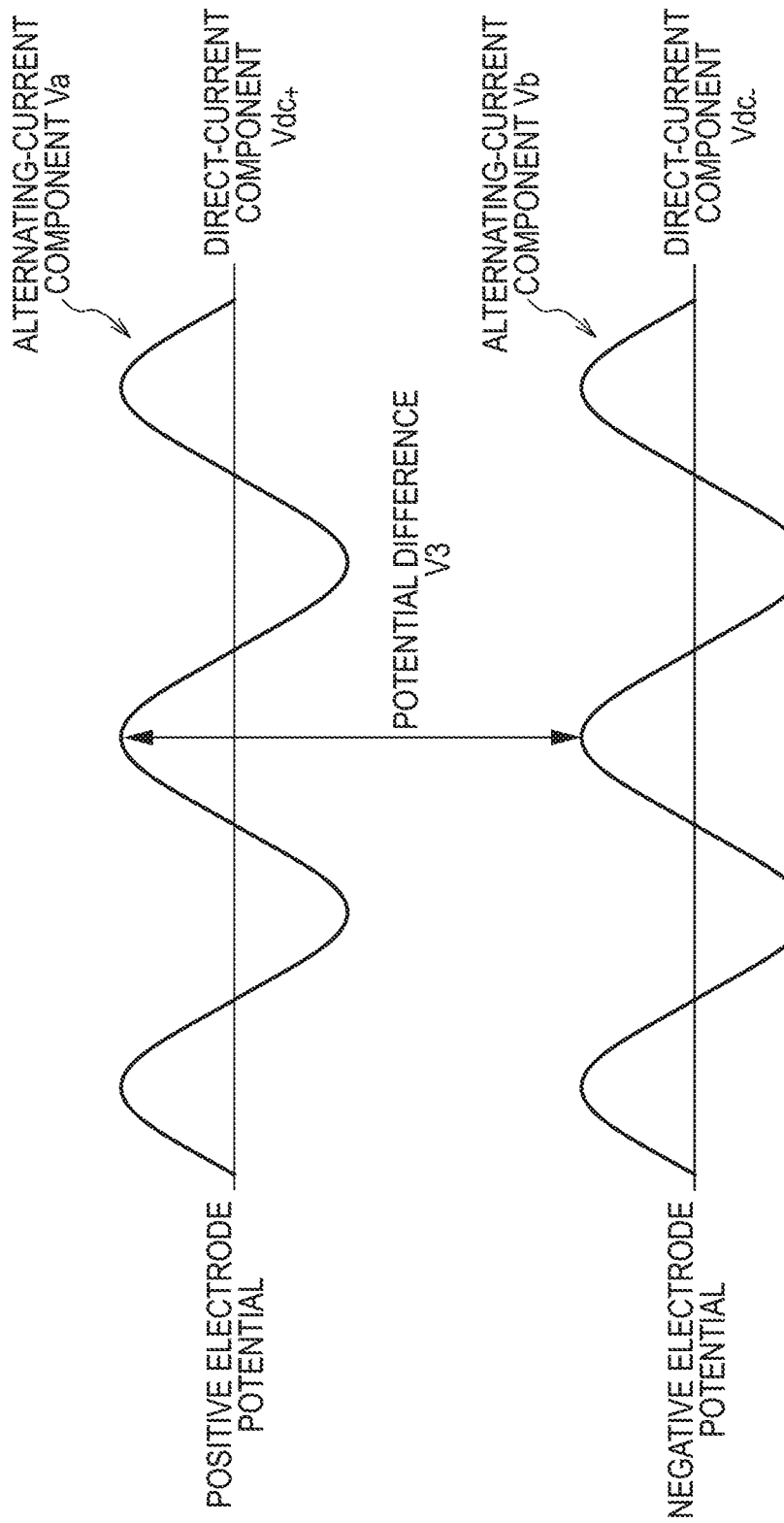
FIG. 13 is a chart showing potentials at the positive electrode and the negative electrode when no phase difference is generated.

FIG. 13 is a chart illustrating states of the positive electrode potential generated at the positive electrode terminal 211 and the negative electrode potential generated at the negative electrode terminal 212 of the fuel cell stack 1 when the measurement state of the impedance measuring device 5 is acceptable.

During the output of the fuel cell stack 1, a potential difference V3 is generated between the positive electrode terminal 211 and the negative electrode terminal 212. Before the impedance measuring device 5 is started (ON), the positive electrode potential and the negative electrode potential are constant and a direct-current voltage is supplied to the load 3. Thereafter, when the impedance measuring device 5 is started and the alternating currents I1 and I2 are output from the positive-electrode side power supply unit 531 and the negative-electrode side power supply unit 532, the alternating-current potential Va is superimposed on the positive electrode potential and the alternating-current potential Vb is superimposed on the negative electrode potential.

Then, in accordance with the commands by the alternating current adjustment unit 540, the positive-electrode side power supply unit 531 and the negative-electrode side power supply unit 532 output the alternating currents I1 and I2 while adjusting the amplitudes thereof.

The alternating current I1 output from the positive-electrode side power supply unit 531 is output to the positive electrode terminal 211 of the fuel cell stack 1 via the positive-electrode side direct current shut-off unit 511 and flows into the positive-electrode side potential difference detection unit 521 via the intermediate-point terminal 213 and the intermediate point direct current shut-off unit 513. At this time, the alternating-current potential difference V1 (V1=Va−Vc) is generated between the positive electrode terminal 211 and the intermediate-point terminal 213 due to an impedance determined by the internal resistance R1 and the capacitance C1 and the alternating current I1. This alternating-current potential difference V1 is detected by the positive-electrode side potential difference detection unit 521.

On the other hand, the alternating current I2 output from the negative-electrode side power supply unit 532 is output to the negative electrode terminal 212 of the fuel cell stack 1 via the negative-electrode side direct current shut-off unit 512 and flows into the negative-electrode side potential difference detection unit 522 via the intermediate-point terminal 213 and the intermediate point direct current shut-off unit 513. At this time, the alternating-current potential difference V2 (V2=Vb−Vc) is generated between the negative electrode terminal 212 and the intermediate-point terminal 213 due to an impedance determined by the internal resistance R2 and the capacitance C2 and the alternating current I2. This alternating-current potential difference V2 is detected by the negative-electrode side potential difference detection unit 522.

The alternating current adjustment unit 540 adjusts the positive-electrode side power supply unit 531 and the negative-electrode side power supply unit 532 such that a difference (V1−V2) between the alternating-current potential difference V1 on the positive electrode side and the alternating-current potential difference V2 on the negative electrode side of the fuel cell stack 1, i.e. a difference (Va−Vb) between the alternating-current potentials Va and Vb is constantly small.

Thus, the amplitude of the alternating-current component Va of the positive electrode potential and that of the alternating-current component Vb of the negative electrode potential are adjusted, wherefore the voltage difference V3 is constant without variation in a state where no phase difference Φ is generated between the alternating-current potentials Va and Vb.

Then, the computation unit 550 applies Ohm's law using the alternating-current potential differences V1 and V2 output from the positive-electrode side potential difference detection unit 521 and the negative-electrode side potential difference detection unit 522 and the alternating currents I1 and I2 output from the positive-electrode side power supply unit 531 and the negative-electrode side power supply unit 532. In this way, the internal resistance R1 on the positive electrode side and the internal resistance R2 on the negative electrode side of the fuel cell stack 1 are calculated in the computation unit 550.

Here, since the alternating-current potentials of the positive electrode terminal 211 and the negative electrode terminal 212 are equal, the leakage of the alternating current to the load device 3 can be suppressed even when the load device 3 such as a travel motor is connected to the positive electrode terminal 211 and the negative electrode terminal 212.

In this way, the values of the alternating currents I1 and I2 flowing into the fuel cell stack 1 whose internal resistance is measured and the values of the alternating currents output from the positive-electrode side power supply unit 531 and the negative-electrode side power supply unit 532 substantially coincide. Thus, the internal resistance values R1 and R2 of the fuel cell stack 1 can be precisely computed by the alternating current values output from the positive-electrode side power supply unit 531 and the negative-electrode side power supply unit 532. Further, without depending on the state of the load 3, the internal resistance R of the entire fuel cell stack 1 can be precisely measured on the basis of the internal resistance values R1 and R2 of the fuel cell stack 1 in operation. Further, since the positive-electrode side power supply unit 531 and the negative-electrode side power supply unit 532 are used, the internal resistance R can be measured even while the fuel cell stack 1 is stopped.

Figure 14:
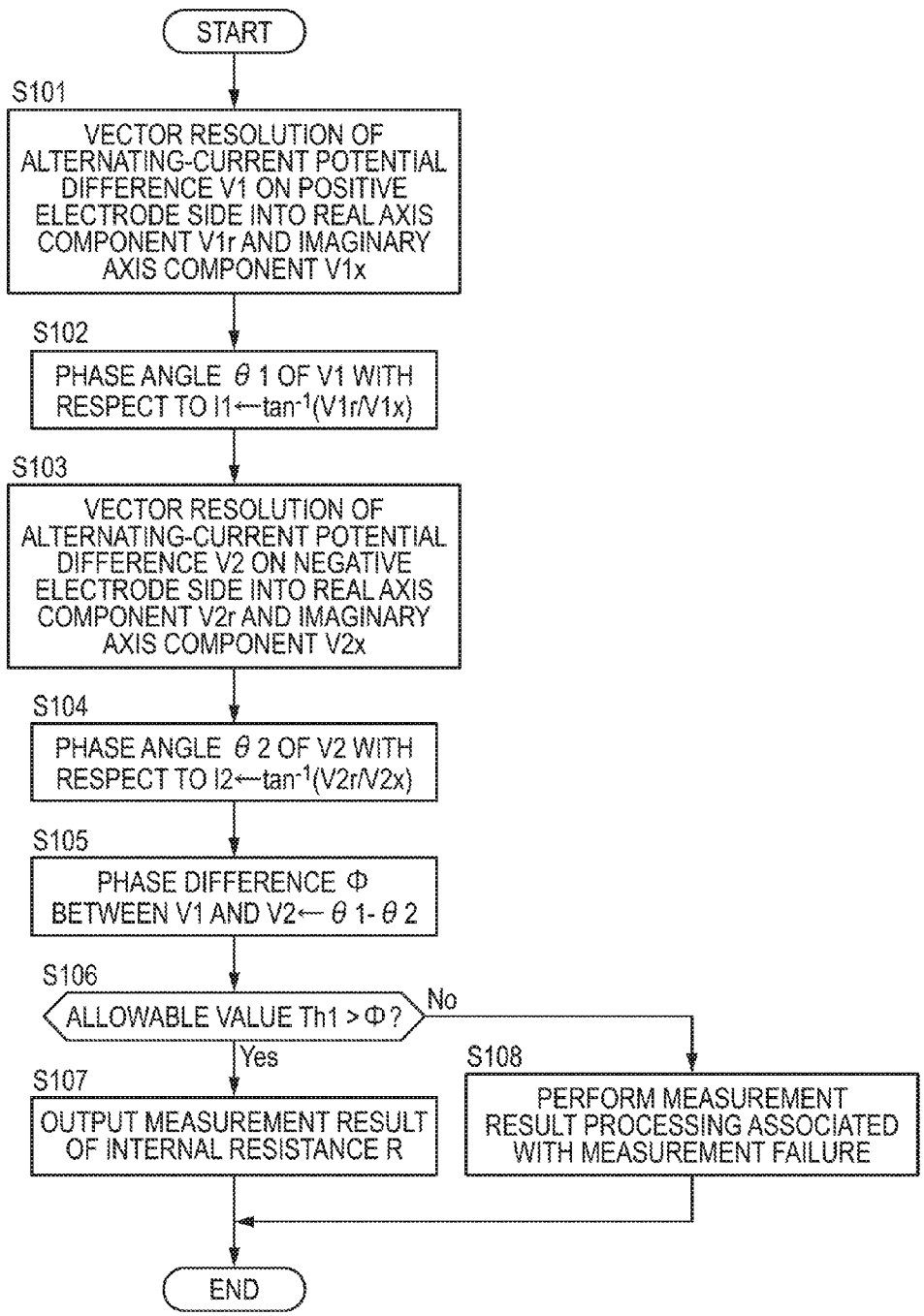
FIG. 14 is a flow chart showing a detection method for detecting on the basis of the phase difference that a measurement state of the impedance measuring device is defective.

FIG. 14 is a flow chart showing a process procedure example of a failure detection method for detecting whether or not the measurement state of the impedance measuring device 5 is defective.

In Step S101, the positive-electrode side detector circuit 5411 resolves the alternating-current potential difference V1 on the positive electrode side into the real axis component V1r and the imaginary axis component V1x and outputs the real axis component V1r and the imaginary axis component V1x to the phase difference detection unit 561.

In Step S102, the phase difference detection unit 561 computes the phase angle θ1 of the alternating-current potential difference V1 with respect to the alternating current I1 on the basis of the real axis component V1r and the imaginary axis component V1x of the alternating-current potential difference V1 in accordance with equation (2).

In Step S103, the negative-electrode side detector circuit 5412 resolves the alternating-current potential difference V2 on the negative electrode side into the real axis component V2r and the imaginary axis component V2x and the negative-electrode side detector circuit 5412 outputs the real axis component V2r and the imaginary axis component V2c to the phase difference detection unit 561.

In Step S104, the phase difference detection unit 561 computes the phase angle θ2 of the alternating-current potential difference V2 with respect to the alternating current I2 on the basis of the real axis component V2r and the imaginary axis component V2x of the alternating-current potential difference V2 in accordance with equation (3).

In Step S105, the phase difference detection unit 561 outputs a value obtained by subtracting the phase angle θ2 of the alternating-current potential difference V2 from the phase angle θ1 of the alternating-current potential difference V1 in accordance with equation (4) as the phase difference Φ between the alternating-current potential differences V1 and V2 to the determination circuit 562.

In Step S106, the determination circuit 562 judges whether or not the phase difference Φ is smaller than the allowable value Th1. Then, the determination circuit 562 determines the measurement state of the internal resistance R2 to be acceptable when the phase difference Φ is smaller than the allowable value Th1. On the other hand, the determination circuit 562 determines the measurement state to be defective when the phase difference Φ is not smaller than the allowable value Th1. The determination circuit 562 outputs that determination result to the computation unit 550.

In Step S107, the computation unit 550 outputs the resistance values computed in Step S12 shown in FIG. 11 as a measurement result to the controller unit 6 when the measurement state of the internal resistance R is determined to be acceptable. It should be noted that the computation unit 550 may generate and output measurement data indicating the resistance values computed in Step S12, the determination result and the phase difference Φ.

On the other hand, the computation unit 550 performs a measurement result processing associated with a measurement failure in Step S108 when the measurement state of the internal resistance R is determined to be defective.

In the measurement result processing, the computation unit 550 discards the resistance values computed in Step S12 and outputs the resistance values before the determination of the measurement failure as the measurement result to the controller unit 6, for example, only for a prescribed time. Alternatively, the computation unit 550 may generate and output measurement data indicating the resistance values computed in Step S12 and the determination result.

When the process is finished in Step S107 or S108, a series of processings of the failure detection method based on the phase difference Φ are finished.

According to the first embodiment of the present invention, the impedance of the fuel cell stack 1 as an example of a laminated type battery is measured. This impedance measuring device 5 includes the positive-electrode side power supply unit 531 for outputting the alternating current of the prescribed reference frequency fb to the positive electrode terminal 211 of the fuel cell stack 1 and the negative-electrode side power supply unit 532 for outputting the alternating current of the reference frequency Φ to the negative electrode terminal 212 of the fuel cell stack 1. Further, the impedance measuring device 5 includes the positive-electrode side potential difference detection unit 521 for detecting the alternating-current potential difference V1 between the positive electrode terminal 211 and the intermediate-point terminal 213 and the negative-electrode side potential difference detection unit 522 for detecting the alternating-current potential difference V2 between the negative electrode terminal 212 and the intermediate-point terminal 213. The impedance measuring device 5 also includes the alternating current adjustment unit 540 for adjusting the amplitude of the alternating current output from at least one of the positive-electrode side power supply unit 531 and the negative-electrode side power supply unit 532 such that the alternating-current potential differences V1 and V2 coincide, and the computation unit 550 for computing the impedance on the basis of the adjusted alternating current and alternating-current potential differences.

Further, the impedance measuring device 5 includes the phase difference detection unit 561 for computing the phase difference Φ between the alternating-current potential generated at the positive electrode terminal 211 and the alternating-current potential generated at the negative electrode terminal 212 or a parameter correlated with the phase difference Φ. Any one of a diagnosis process for diagnosing whether or not the measurement state is defective, a cancellation process for discarding the measurement result and a hold process for fixing the measurement result at a prescribed value having high reliability is performed on the basis of the phase difference Φ or the parameter correlated with the phase difference Φ.

As just described, the diagnosis process of the measurement state, the cancellation process of the measurement result and the hold process are performed by detecting the phase difference Φ between the alternating-current potential generated at the positive electrode terminal 211 and the alternating-current potential generated at the negative electrode terminal 212. Thus, reliability for the measurement result can be ensured. Therefore, it is possible to maintain and improve reliability for the measurement result when the measurement accuracy of the impedance measuring device 5 is reduced due to variations of capacitance components of the laminated type battery.

For example, depending on the operating state of the fuel cell stack 1, the capacitance components of the fuel cell stack 1 may change in response to the alternating-current signal of the reference frequency fb and a difference between the capacitance C1 on the positive electrode side and the capacitance C2 on the negative electrode side may increase. In such a case, the phase difference Φ between the alternating-current potential generated at the positive electrode terminal 211 and the alternating-current potential generated at the negative electrode terminal 212 of the fuel cell stack 1 increases and more alternating current leaks to the load 3 connected to the fuel cell stack 1.

As a result, both an error between the output current I1 of the positive-electrode side power supply unit 531 and the current actually flowing through the internal resistance R1 and an error between the output current I2 of the negative-electrode side power supply unit 532 and the current actually flowing through the internal resistance R2 increase. Thus, the measurement accuracy of the internal resistance R is reduced.

Further, the internal resistance R measured by the impedance measuring device 5 is used, for example, to control a degree of wetness of the fuel cell stack 1 in a fuel cell system. Thus, it is difficult to properly control the degree of wetness of the fuel cell stack 1 with the internal resistance R measured in a state where the measurement accuracy of the internal resistance R is reduced, i.e. a state where the measurement state of the impedance measuring device 5 is defective.

As a measure against this, in the present embodiment, the impedance measuring device 5 detects the phase difference $\Phi$ or the parameter related to the phase difference $\Phi$ and detects a reduction in impedance measurement accuracy due to variations of the capacitances C1 and C2.

For example, the impedance measuring device 5 outputs a diagnosis result to the effect that the measurement state is defective together with the measurement result when the measurement state is judged to be defective on the basis of the phase difference $\Phi$. In this way, in a system using the measurement result, whether or not to use the internal resistance R can be judged according to the diagnosis result of the measurement state when the usage of the measurement result, measurement accuracy required from the system or the like is different.

Alternatively, the impedance measuring device 5 may discard the measurement result when the measurement state is determined to be defective. Since this prevents the measurement result with low measurement accuracy and low reliability from being output, only the measurement result with high reliability can be reliably output to the controller unit 6 or the like.

Further, even when the measurement state is defective, the past measurement result obtained before failure determination may be output. In this way, regardless of the measurement state of the impedance measuring device 5, it is possible to output the measurement result when the measurement state was acceptable, i.e. the measurement result with high measurement accuracy to a system that has to continue a control utilizing that measurement result.

Normally, in the fuel cell stack 1, the internal resistance R changes mainly depending on a degree of wetness of the power generation cells 10, whereas the capacitance C1 or C2 changes depending on a gaseous state in the fuel cell stack 1, the operating state of the load 3 and the like. Thus, a correlation between a change of the internal resistance R and a change of the capacitance C is said to be low.

Accordingly, there is a high possibility that the resistance component R indicates a fixed value even in such a situation where the phase difference $\Phi$ increases according to a variation of the capacitance C1 or C2 and the measurement state is determined to be defective. Thus, when the measurement state is determined to be defective on the basis of the phase difference $\Phi$, reliability for an output result can be improved by outputting the internal resistance value before the failure determination as the measurement result.

As just described, according to the first embodiment, it is possible to maintain and improve reliability for the measurement result as against a reduction in the measurement accuracy of the impedance measuring device 5 due to the capacitance components of the laminated type battery.

Further, in the present embodiment, the phase difference detection unit 561 computes the phase difference $\Phi$ on the basis of the detection signal indicating the alternating-current potential difference V1 output from the positive-electrode side detector circuit 5411 and the detection signal indicating the alternating-current potential difference V2 output from the negative-electrode side detector circuit 5412.

Then, the impedance measuring device 5 determines the measurement state to be defective when the phase difference $\Phi$ is not smaller than the prescribed threshold value Th1 and determines the measurement state to be acceptable when the phase difference $\Phi$ is smaller than the threshold value Th1. The threshold value Th1 is set on the basis of an allowable range of the measurement accuracy required from the system and the like.

Thus, even if the phase difference $\Phi$ is generated between the alternating-current potential differences V1 and V2, the impedance measuring device 5 determines the measurement state to be acceptable within the allowable range of the measurement error and determines the measurement state to be defective only when the phase difference $\Phi$ is larger than the allowable range. In this way, the measurement state can be easily and properly diagnosed according to the request of the system that uses the measurement result.

It should be noted that an example in which the detection signals output from the positive-electrode side detector circuit 5411 and the negative-electrode side detector circuit 5412 are used as the respective detection signals of the alternating-current potential differences V1 and V2 has been described in the present embodiment. However, the phase difference $\Phi$ may be computed using the detection signals output from the positive-electrode side potential difference detection unit 521 and the negative-electrode side potential difference detection unit 522 instead of the detection signals output from the positive-electrode side detector circuit 5411 and the negative-electrode side detector circuit 5412.

Second Embodiment

Figure 15:
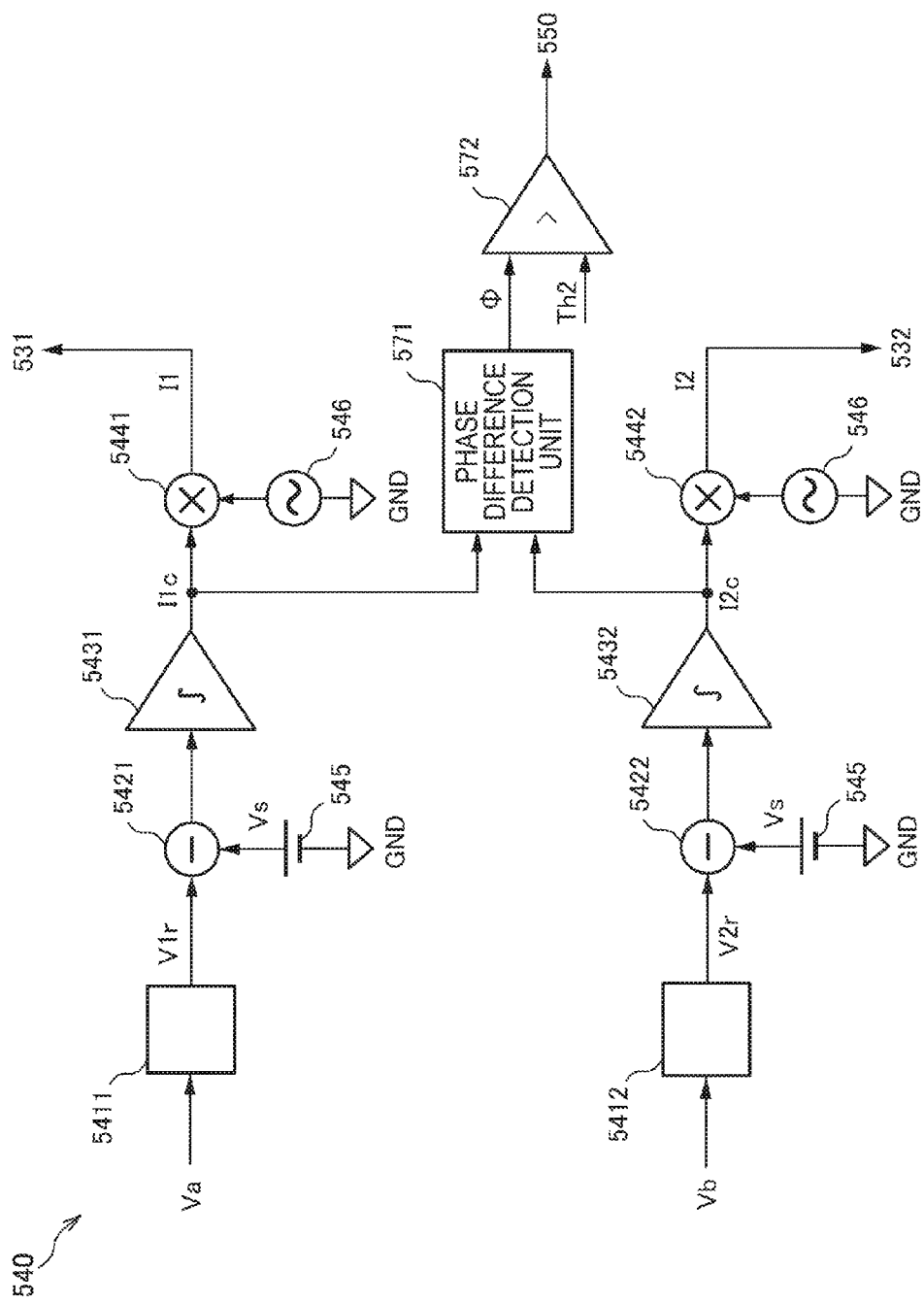
FIG. 15 is a diagram showing a phase difference detection unit in a second embodiment of the present invention.

FIG. 15 is a diagram showing the configurations of an alternating current adjustment unit 540 and a phase difference detection unit 571 in a second embodiment of the present invention.

In the second embodiment, the phase difference detection unit 571 and a determination circuit 572 are provided instead of the phase difference detection unit 561 and the determination circuit 562 shown in FIG. 5. It should be noted that constituent parts other than the phase difference detection unit 571 and the determination circuit 572 are not described here since being the same as those of the alternating current adjustment unit 540 shown in FIG. 5.

A positive-electrode side current command value I1c output from a positive-electrode side integration circuit 5431 and a negative-electrode side current command value I2c output from a negative-electrode side integration circuit 5432 are input to the phase difference detection unit 571.

The phase difference detection unit 571 calculates a difference between a time change amount $\Delta$I1c of the positive-electrode side current command value I1c and a time change amount $\Delta$I2c of the negative-electrode side current command value I2c. The time change amounts $\Delta$I1c and $\Delta$I2c are time change rates and indicate increased or decreased amounts of the positive-electrode side current command value I1c and the negative-electrode side current command value I2c within the same time.

Generally, when an internal resistance R of a fuel cell stack 1 changes, the positive-electrode side current command value I1c and the negative-electrode side current command value I2c change in the same direction in a state where the difference between the positive-electrode side current command value I1c and the negative-electrode side current command value I2c is substantially constant. For example, both the positive-electrode side current command value I1c and the negative-electrode side current command value I2c increase when the internal resistance R decreases, and both the positive-electrode side current command value I1c and the negative-electrode side current command value I2c decrease when the internal resistance R increases.

Contrary to this, when an output voltage between a positive-electrode side 211 and a negative-electrode side 212 of the fuel cell stack 1 suddenly changes, the positive-electrode side current command value I1c and the negative-electrode side current command value I2c tend to change in opposite directions. The reason for such changes is that a voltage fluctuation is transmitted to a positive-electrode side power supply unit 531 due to a fluctuation of the output voltage of the fuel cell stack 1 and a phase angle and the like of an alternating-current potential Va change. As a result, the phase difference $\Phi$ increases and the amount of a current leaking to a load 3 increases.

Accordingly, the phase difference detection unit 571 judges whether or not the positive-electrode side current command value I1c and the negative-electrode side current command value I2c have changed in opposite directions, using an absolute value of a difference obtained by subtracting the time change amount $\Delta I2c$ from the time change amount $\Delta I1c$ as a parameter related to the phase difference $\Phi$.

Figure 16A:
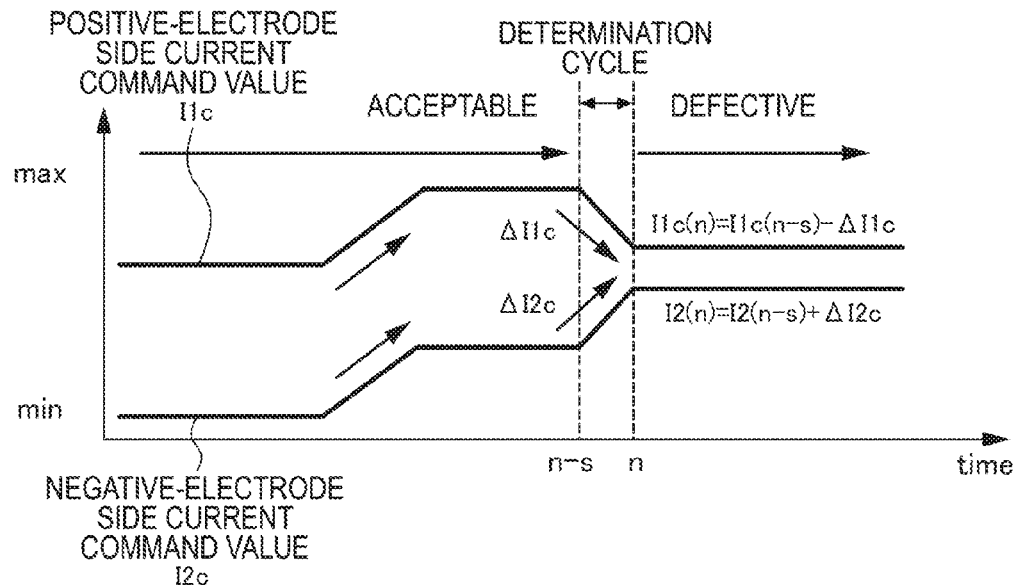
FIG. 16A is a chart showing a technique for judging that current command values to positive-electrode and negative-electrode side power supply units have changed in opposite directions.
Figure 16B:
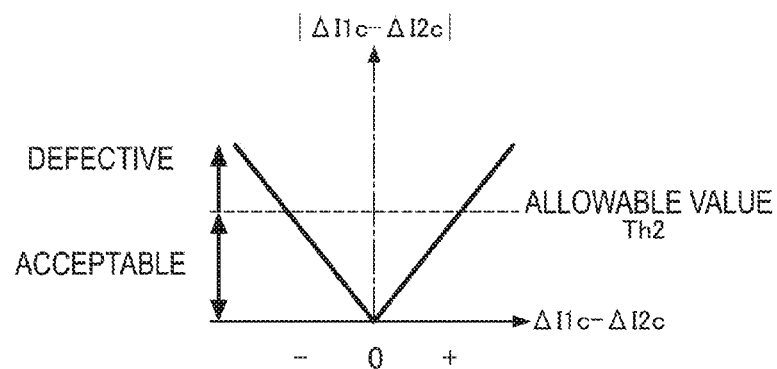
FIG. 16B is a chart showing a relationship of an absolute difference between time change rates of the positive-electrode side and negative-electrode side current command values and a measurement state.

FIG. 16A is a chart showing a judgment technique for judging whether or not the positive-electrode side current command value I1c and the negative-electrode side current command value I2c have changed in opposite directions. FIG. 16B is a graph showing a relationship of an absolute difference between the positive-electrode side current command value I1c and the negative-electrode side current command value I2c and a measurement state.

In FIG. 16A, the phase difference detection unit 571 obtains the positive-electrode side current command value I1c and the negative-electrode side current command value I2c in every prescribed determination cycle (S sec) and records the positive-electrode side current command value I1c and the negative-electrode side current command value I2c together in a memory 5711. Along with this, the phase difference detection unit 571 reads the positive-electrode side current command value I1c and the negative-electrode side current command value I2c recorded last time from the memory 5711.

At time n, the phase difference detection unit 571 obtains the positive-electrode side current command value I1c(n) and reads the last positive-electrode side current command value I1c(n-s) obtained S seconds before time n from the memory 5711. It should be noted that a time at which the current command value was obtained is shown in parentheses here.

Then, the phase difference detection unit 571 calculates the time change amount $\Delta I1c$ of the positive-electrode side current command value I1c by subtracting the positive-electrode side current command value I1c(n-s) obtained last time from the positive-electrode side current command value I1c(n) obtained this time as in the following equation.

[Equation 7]

$$\Delta I1c = I1c(n) - I1c(n-s) \quad (7)$$

Here, since the positive-electrode side current command value I1c has decreased, the time change amount $\Delta T1c$ is a negative (minus) value.

Further, the phase difference detection unit 571 obtains the negative-electrode side current command value I2c(n) and reads the negative-electrode side current command value I2c(n-s) obtained last time from the memory 5711 at time n. Then, the phase difference detection unit 571 calculates the time change amount $\Delta I2c$ of the negative-electrode side current command value I2c by subtracting the negative-electrode side current command value I2c(n-s) obtained last time from the negative-electrode side current command value I2c(n) obtained this time as in the following equation.

[Equation 8]

$$\Delta I2c = I2c(n) - I2c(n-s) \quad (8)$$

Here, since the negative-electrode side current command value I2c has increased, the time change amount $\Delta I2c$ is a positive (plus) value.

Subsequently, the phase difference detection unit 571 calculates an absolute value of a value obtained by subtracting the time change amount $\Delta I2c$ of the negative-electrode side current command value I2c from the time change amount $\Delta I1c$ of the positive-electrode side current command value I1c.

Since the time change amount $\Delta I1c$ is a negative value and the time change amount $\Delta I2c$ is a positive value at time n, the absolute value of the difference between the time change amounts $\Delta I1c$ and $\Delta I2c$ is a largest value. As just described, when the positive-electrode side current command value I1c and the negative-electrode side current command value I2c change in the opposite directions, the absolute value of the difference (absolute difference) between the time change amount $\Delta I1c$ of the positive-electrode side current command value I1c and the time change amount $\Delta I2c$ of the negative-electrode side current command value I2c increases.

Thus, as shown in FIG. 16B, the measurement state is determined the time change amounts $\Delta I1c$ and $\Delta I2c$ becomes larger than a predetermined allowable value Th2.

Therefore, in the present embodiment, the determination circuit 572 judges whether or not the absolute value of the difference between the time change amount $\Delta I1c$ of the positive-electrode side current command value I1c and the time change amount $\Delta I2c$ of the negative-electrode side current command value I2c is larger than the allowable value Th2 as in the following equation.

[Equation 9]

$$|\Delta I1c - \Delta I2c| < Th2 \quad (9)$$

Then, as shown in FIG. 16A, the determination circuit 572 judges that the absolute value of the difference between the time change amounts $\Delta I1c$ and $\Delta I2c$ is larger than the allowable value Th2 and determines the impedance measurement state to be defective at time n.

In such a situation, an equipotential control is balanced in a state where alternating currents I1 and I2 to be supplied to the fuel cell stack 1 partly leak to the load 3. Thus, a determination result to the effect that the measurement state is defective is output from the impedance measuring device 5 also after time n.

It should be noted that an example in which the measurement state is determined using the absolute value of the difference between the time change amounts $\Delta I1c$ and $\Delta I2c$ has been described in the present embodiment, the determination circuit 572 may determine the measurement state using the time change amounts $\Delta I1c$ and $\Delta I2c$ as they are. In this case, both positive (plus) and negative (minus) allowable values are set in the determination circuit 572 and the determination circuit 572 determines the measurement state to be defective when an allowable range from the positive allowable value to the negative allowable value is exceeded.

Figure 17:
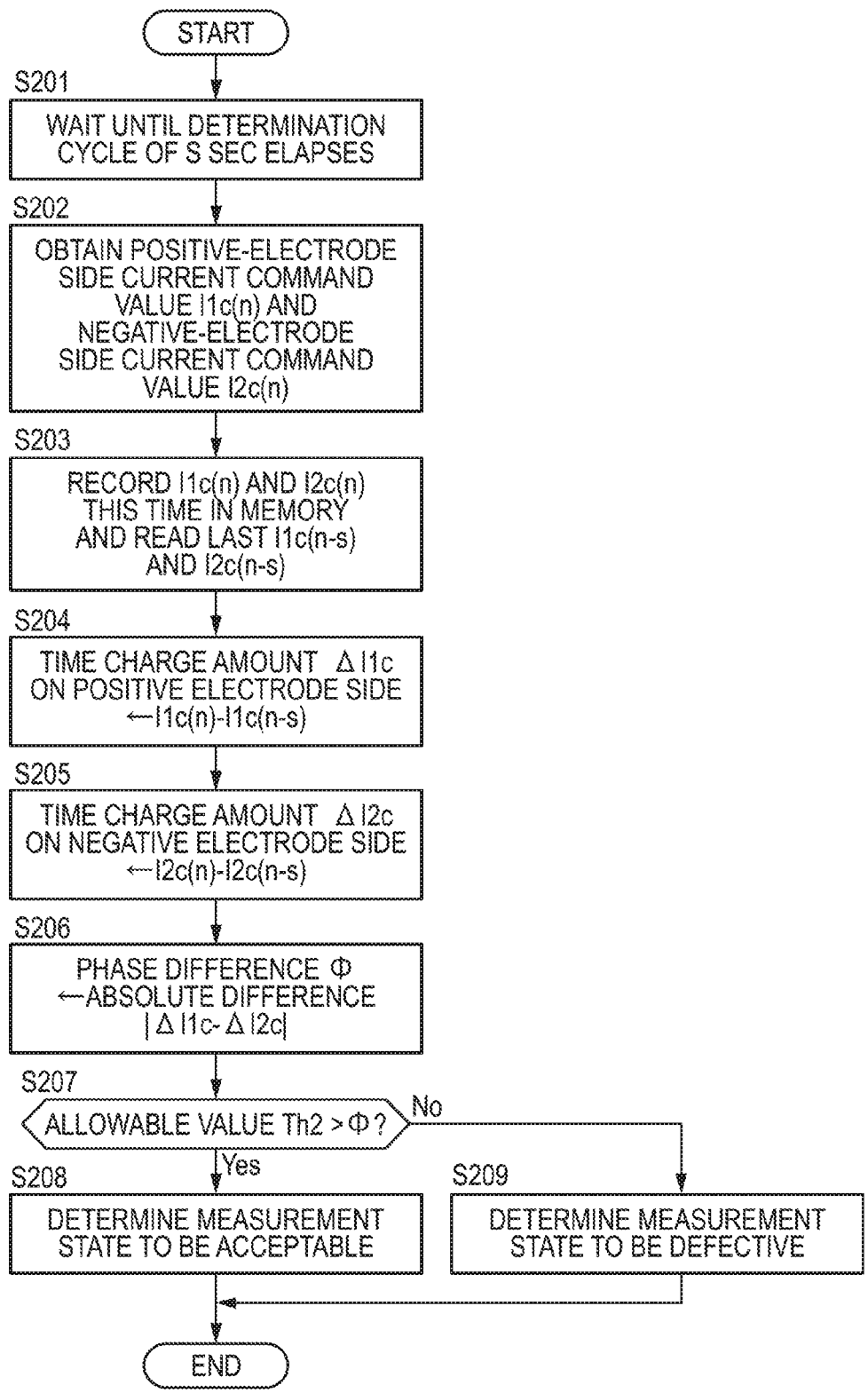
FIG. 17 is a flow chart showing a diagnosis method for diagnosing the measurement state on the basis of a difference between the positive-electrode side and negative-electrode side current command values.

FIG. 17 is a flow chart showing a process procedure of a diagnosis method for diagnosing a measurement state on the basis of the difference between the time change amount $\Delta I1c$ of the positive-electrode side current command value I1c and the time change amount $\Delta I2c$ of the negative-electrode side current command value I2c. This computation method is performed in every prescribed determination cycle of S seconds.

In Step S201, the phase difference detection unit 571 waits until the determination cycle of S seconds elapses.

In Step S202, the phase difference detection unit 571 obtains both the positive-electrode side current command value I1c(n) and the negative-electrode side current command value I2c(n) of time n.

In Step S203, the phase difference detection unit 571 records both the positive-electrode side current command value I1c(n) and the negative-electrode side current command value I2c(n) obtained this time in the memory 5711 and reads the last positive-electrode side current command value I1c(n-s) and negative-electrode side current command value I2c(n-s) obtained S seconds ago from the memory 5711.

In Step S204, the phase difference detection unit 571 calculates the time change amount $\Delta I1c$ of the positive-electrode side current command value I1c by subtracting the positive-electrode side current command value I1c(n-s) obtained last time from the positive-electrode side current command value I1c(n) obtained this time in accordance with equation (7).

In Step S205, the phase difference detection unit 571 calculates the time change amount $\Delta I2c$ of the negative-electrode terminal current command value I2c by subtracting the negative-electrode terminal current command value I2c(n-s) obtained last time from the negative-electrode terminal current command value I2c(n) obtained this time in accordance with equation (8).

Then, in Step S206, the phase difference detection unit 571 sets the absolute value of the difference between the time change amounts $\Delta I1c$ and $\Delta I2c$ as the parameter related to the phase difference $\Phi$ and outputs it to the determination circuit 572.

In Step S207, the determination circuit 572 judges in accordance with equation (9) whether or not the absolute value of the difference between the time change amounts $\Delta I1c$ and $\Delta I2c$ is larger than the allowable value Th2.

In Step S208, the determination circuit 572 determines the measurement state to be acceptable when the absolute value of the difference between the time change amounts $\Delta I1c$ and $\Delta I2c$ is not larger than the allowable value Th2. Thereafter, a computation unit 550 outputs computed resistance values to the controller unit 6, for example, similarly to the processing of Step S107 shown in FIG. 13.

In Step S209, the determination circuit 572 determines the measurement state to be defective when the absolute value of the difference between the time change amounts $\Delta I1c$ and $\Delta I2c$ is larger than the allowable value Th2. Then, the computation unit 550 outputs the computed resistance values to the controller unit 6 similarly to the processing of Step S107 shown in FIG. 13. Thereafter, the computation unit 550 performs a measurement result processing, for example, similarly to the processing of Step S108 shown in FIG. 13.

When the processing of Step S208 or S209 is finished, a series of processings of the diagnosis method based on the difference between the time change amounts $\Delta I1c$ and $\Delta I2c$ are finished.

According to the second embodiment of the present invention, the alternating current adjustment unit 540 extracts a real axis component V1r of an alternating-current potential difference V1 by a positive-electrode side detector circuit 5411 and calculates the positive-electrode side current command value I1c for the positive-electrode side power supply unit 531. Along with this, the alternating current adjustment unit 540 extracts a real axis component V2r of an alternating-current potential difference V2 by a positive-electrode side detector circuit 5412 and calculates the negative-electrode terminal current command value I2c for a negative-electrode terminal power supply unit 532.

Then, the determination circuit 572 determines the measurement state of the impedance measuring device 5 to be defective if one of the positive-electrode side current command value I1c and the negative-electrode terminal current command value I2c decreases when the other increases.

In this way, it can be detected that the phase difference $\Phi$ increases to cause a measurement failure of the impedance measuring device 5 due to a transient change of the output voltage of the fuel cell system 1.

For example, a situation where a breaker connected between the fuel cell system 1 and the load 3 is switched from a shut-off state to a connected state after a start process of the fuel cell system 1 is completed falls into a situation where the output power of the fuel cell system 1 transiently changes. Since the amount of the current flowing from the fuel cell system 1 to the load 3 transiently largely changes in such a situation, the amount of anode gas and cathode gas consumed in the fuel cell system 1 transiently increases, a gas concentration changes and the output voltage of the fuel cell system 1 fluctuates. As a result, the phase of the alternating current supplied from the positive-electrode side power supply unit 531 is likely to shift, a balance between a capacitance C1 on the positive electrode side and a capacitance C2 on the negative electrode side is lost and the alternating current I1 or I2 partly leaks to the load 3.

Alternatively, the amount of a power generation current supplied from the fuel cell system 1 to the load 3 transiently largely changes also when an accelerator operation amount is increased to suddenly accelerate a vehicle in a state where the power generation current is supplied from the fuel cell system 1 to the load 3. Also in such a situation, the output voltage of the fuel cell system 1 suddenly fluctuates as the gas concentration changes in the fuel cell system 1.

Particularly in such a fuel cell system that power is generated while anode gas is stored in the fuel cell system 1 without being circulated, more impurities are retained on a downstream side than on an upstream side of an anode gas flow passage in the fuel cell system 1. Thus, due to a transient change of the power generation current output from the fuel cell system 1, a variation of the gas concentration becomes large between the positive and negative electrode sides of the fuel cell system 1 and a balance between the capacitance C1 on the positive electrode side and the capacitance C2 on the negative electrode side is largely lost.

When the output voltage of the fuel cell system 1 transiently changes in this way, the positive-electrode side current command value I1c and the negative-electrode terminal current command value I2c change in opposite directions. Utilizing this property, an increase of the phase difference Φ is detected in the present embodiment. In this way, the impedance measuring device 5 can detect that the measurement state is defective.

In the present embodiment, the phase difference detection unit 571 calculates the difference obtained by subtracting the time change amount ΔI2c of the negative-electrode side current command value I2c from the time change amount ΔI1c of the positive-electrode side current command value I1c as the parameter related to the phase difference Φ. The determination circuit 572 determines a measurement failure when that difference is beyond the prescribed allowable range or when the absolute value of the difference between the time change amounts ΔI1c and ΔI2c is larger than the allowable value Th2. By using the absolute value of the difference between the time change amounts ΔI1c and ΔI2c, the measurement state can be determined by setting only one allowable value. Thus, the determination circuit 572 can have a simple configuration.

The positive-electrode side current command value I1c changes according to a change of the phase angle θ1 of the alternating-current potential difference V1 and the negative-electrode side current command value I2c changes according to a change of the phase angle θ2 of the alternating-current potential difference V2. Thus, when the magnitude of either one of the capacitances C1 and C2 changes, the difference between the positive-electrode side current command value I1c and the negative-electrode side current command value I2c changes. However, the difference between the positive-electrode side current command value I1c and the negative-electrode side current command value I2c is also changed by a change of the internal resistance R of the fuel cell stack 1. Thus, a change of the internal resistance R and a change of the phase difference Φ needs to be separated for more precise diagnosis.

When the phase difference Φ is changed by a change of the state on the side of the load 3, the positive-electrode side current command value I1c and the negative-electrode side current command value I2c temporarily change in opposite directions. In contrast, when the magnitude of the internal resistance R changes, both the positive-electrode side current command value I1c and the negative-electrode side current command value I2c moderately change in the same direction. Thus, by calculating the difference between the positive-electrode side current command value I1c and the negative-electrode side current command value I2c per unit time, a variation of the phase difference Φ can be accurately detected on the basis of the positive-electrode side current command value I1c and the negative-electrode side current command value I2c.

It should be noted that an example in which the phase difference detection unit 571 computes each of the time change amounts of the positive electrode side current command value I1c and the negative-electrode side current command value I2c and calculates the absolute value of the difference between these has been described in the present embodiment. However, the positive-electrode side current command value I1c and the negative-electrode side current command value I2c may be input to the computation unit 550 and the absolute value of the difference of the time change amounts may be computed in the computation unit 550.

Third Embodiment

Figure 18:
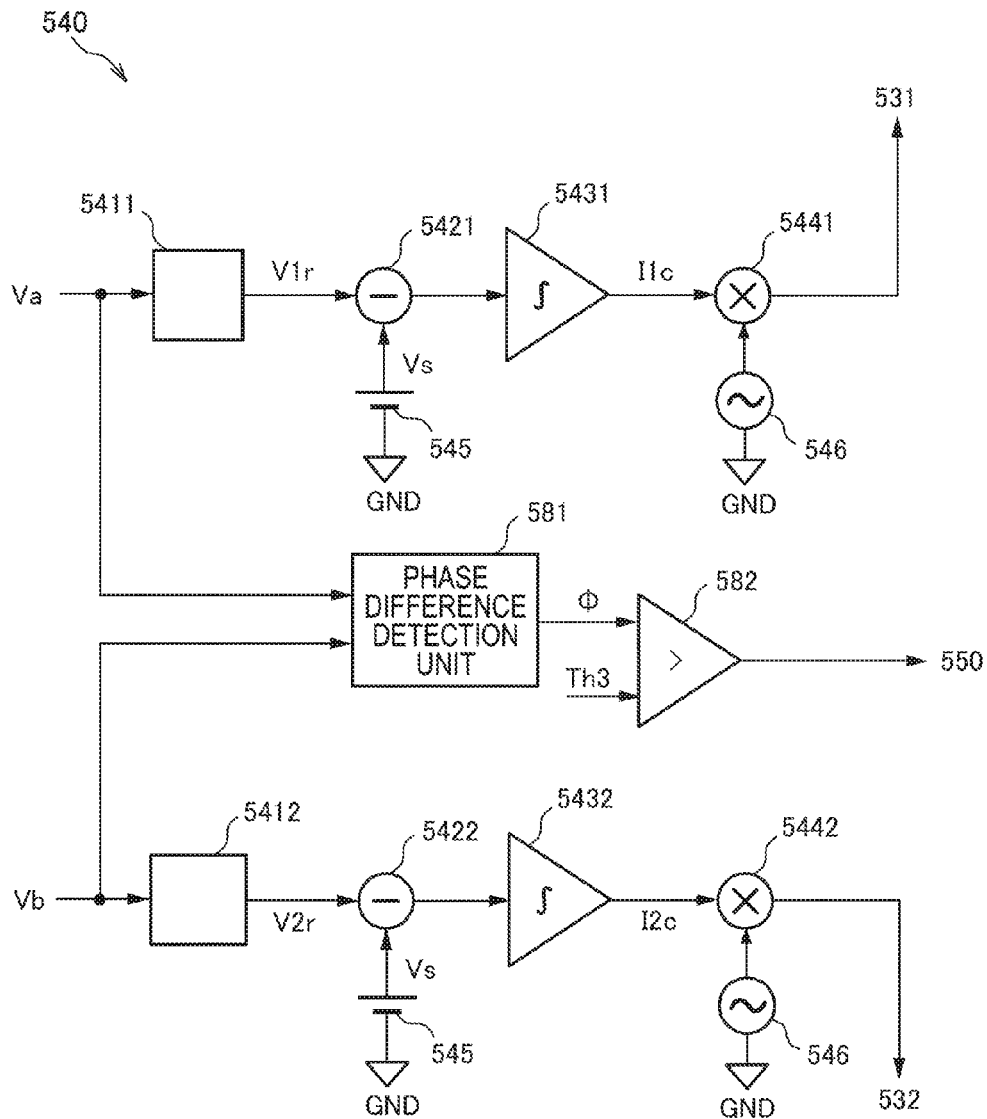
FIG. 18 is a diagram showing a phase difference detection unit in a third embodiment of the present invention.

FIG. 18 is a diagram showing the configurations of an alternating current adjustment unit 540 and a phase difference detection unit 581 in a third embodiment of the present invention.

In the third embodiment, the phase difference detection unit 581 and a determination circuit 582 are provided instead of the phase difference detection unit 561 and the determination circuit 562 shown in FIG. 5. It should be noted that constituent parts other than the phase difference detection unit 581 and the determination circuit 582 are denoted by the same reference signs and not described here since being the same as those of the alternating current adjustment unit 540 shown in FIG. 5.

An output terminal of a positive-electrode side power supply unit 531 and an output terminal of a negative-electrode side power supply unit 532 are respectively connected to the phase difference detection unit 581. Then, an alternating-current potential Va generated at the output terminal of the positive-electrode side power supply unit 531 and an alternating-current potential Vb generated at the output terminal of the negative-electrode side power supply unit 532 are input to the phase difference detection unit 581.

The phase difference detection unit 581 detects an alternating-current component of a potential difference (Va−Vb) of the alternating-current potentials Va and Vb. Specifically, the phase difference detection unit 581 detects an alternating-current component of a potential difference V3 between a positive electrode terminal 211 and a negative electrode terminal 212 of a fuel cell stack 1.

Normally, a phase difference Φ between an alternating-current potential generated at the positive electrode terminal 211 and an alternating-current potential generated at the negative electrode terminal 212 of the fuel cell stack 1 is designed to be equal to a phase difference between the alternating-current potential Va generated at the output terminal of the positive-electrode side power supply unit 531 and the alternating-current potential Vb generated at the output terminal of the negative-electrode side power supply unit 532. Thus, a detection signal indicating the potential difference V3, which is an output voltage of the fuel cell stack 1, indicates a fixed value by an equipotential control in a state where no phase difference is generated between the alternating-current potentials Va and Vb. In contrast, the detection signal indicating the potential difference V3 includes an alternating-current component in a state where the phase difference Φ is generated between the alternating-current potentials Va and Vb.

As the phase difference Φ increases, an amplitude of the alternating-current component of the potential difference (Va−Vb) between the alternating-current potentials Va and Vb increases. Thus, the potential difference (Va−Vb) can be utilized as a parameter correlated with the phase difference Φ.

Thus, the phase difference detection unit 581 detects the alternating-current component of the potential difference (Va−Vb) between the alternating-current potentials Va and Vb as the parameter related to the phase difference Φ.

Figure 19:
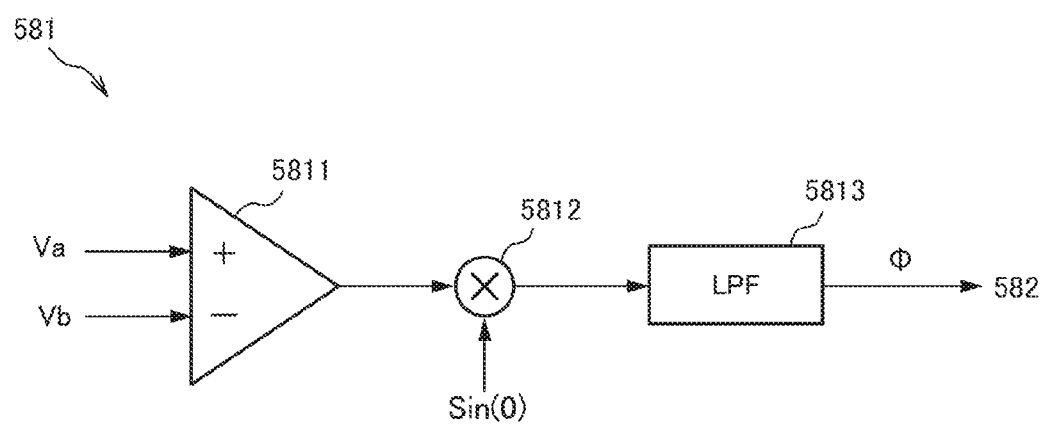
FIG. 19 is a diagram showing the detail of the phase difference detection unit.

FIG. 19 is a circuit diagram showing a detailed configuration of the phase difference detection unit 581.

The phase difference detection unit 581 includes a differential amplifier 5811, a multiplier 5812 and a low-pass filter 5813.

The differential amplifier 5811 detects the potential difference (Va−Vb) by subtracting the alternating-current potential Vb from the alternating-current potential Va and outputs it as a detection signal indicating the potential difference V3 to the multiplier 5812. The differential amplifier 5811 has the same configuration as the positive-electrode side potential difference detection unit 521 and the negative-electrode side potential difference detection unit 522 shown in FIG. 3.

The multiplier 5812 multiplies the detection signal output from the differential amplifier 5811 by an in-phase signal Sin(0). In this way, a signal obtained by removing an unnecessary signal from the detection signal and indicating the alternating-current component included in the potential difference V3 is output from the multiplier 5812.

It should be noted that the in-phase signal Sin(0) is an alternating-current signal having the same phase as alternating currents of a reference frequency fb output from the positive-electrode side power supply unit 531 and the negative-electrode side power supply unit 532. The in-phase signal Sin(0) is, for example, input to the multiplier 5812 from an alternating-current signal source 546.

The low-pass filter 5813 is an LPF for smoothing a signal output from the multiplier 5812 and allowing the passage of a direct-current component of the output signal. An amplitude component of the output signal is detected by the low-pass filter 5813. Thus, the direct-current signal smoothed by the low-pass filter 5813 is input as an amplitude value of the alternating-current component included in the potential difference V3 to the determination circuit 582.

As just described, the phase difference detection unit 581 detects the amplitude value of the alternating-current component included in the potential difference V3 between the positive electrode terminal 211 and the negative electrode terminal 212 of the fuel cell stack 1 and outputs it as the parameter related to the phase difference Φ to the determination circuit 582.

The determination circuit 582 determines a measurement state to be defective and outputs a determination signal of H-level when the amplitude value of the alternating-current component included in the potential difference V3 is larger than a predetermined allowable value Th3. It should be noted that the allowable value Th3 for the alternating-current component of the potential difference V3 is set, for example, by experimental data or the like similarly to the allowable value Th1 of the phase difference Φ.

According to the third embodiment of the present invention, a signal line connecting between a positive-electrode side direct current shut-off unit 511 and the positive-electrode side power supply unit 531 and a signal line connecting between a negative-electrode side direct current shut-off unit 512 and the negative-electrode side power supply unit 532 are both connected to the phase difference detection unit 581.

The phase difference detection unit 581 detects the potential difference (Va−Vb) between the alternating-current potentials Va and Vb as the potential difference V3 between the alternating-current potential generated at the positive electrode terminal 211 and the alternating-current potential generated at the negative electrode terminal 212 of the fuel cell stack 1. Then, the impedance measuring device 5 calculates the alternating current component included in the potential difference (Va−Vb) as the parameter related to the phase difference Φ and determines the measurement state to be defective when that alternating-current component is larger than the prescribed threshold value.

In this way, the potential difference (Va−Vb) obtained by subtracting the alternating-current potential Vb generated at the output terminal of the negative-electrode side power supply unit 532 from the alternating-current potential Va generated at the output terminal of the positive-electrode side power supply unit 531 is detected as an alternating-current potential difference Ve between the positive electrode terminal 211 and the negative electrode terminal 212 of the fuel cell stack 1.

In this way, the alternating-current component generated in the potential difference V3 between the alternating-current potential generated at the positive electrode terminal 211 and the alternating-current potential generated at the negative electrode terminal 212 of the fuel cell stack 1 can be more directly detected as compared to the first and second embodiments. Thus, the phase difference Φ generated between the alternating-current potential generated at the positive electrode terminal 211 and the alternating-current potential generated at the negative electrode terminal 212 of the fuel cell stack 1 can be accurately computed. Therefore, a failure of the measurement state due to the phase difference Φ can be more reliably determined.

Further, since the alternating-current component generated in the potential difference V3 can be more directly detected, the detection is less subject to a change in an internal state of the fuel cell stack 1, a change in an operating state of a load 3 and the like and determination accuracy can be improved.

Furthermore, in the present embodiment, it is not necessary to provide the orthogonal multiplier 721 and the orthogonal low-pass filter 722 on both positive and negative electrode sides as in the first embodiment.

Thus, the number of multipliers, LPFs and the like used in the impedance measuring device 5 can be reduced.

Fourth Embodiment

Figure 20:
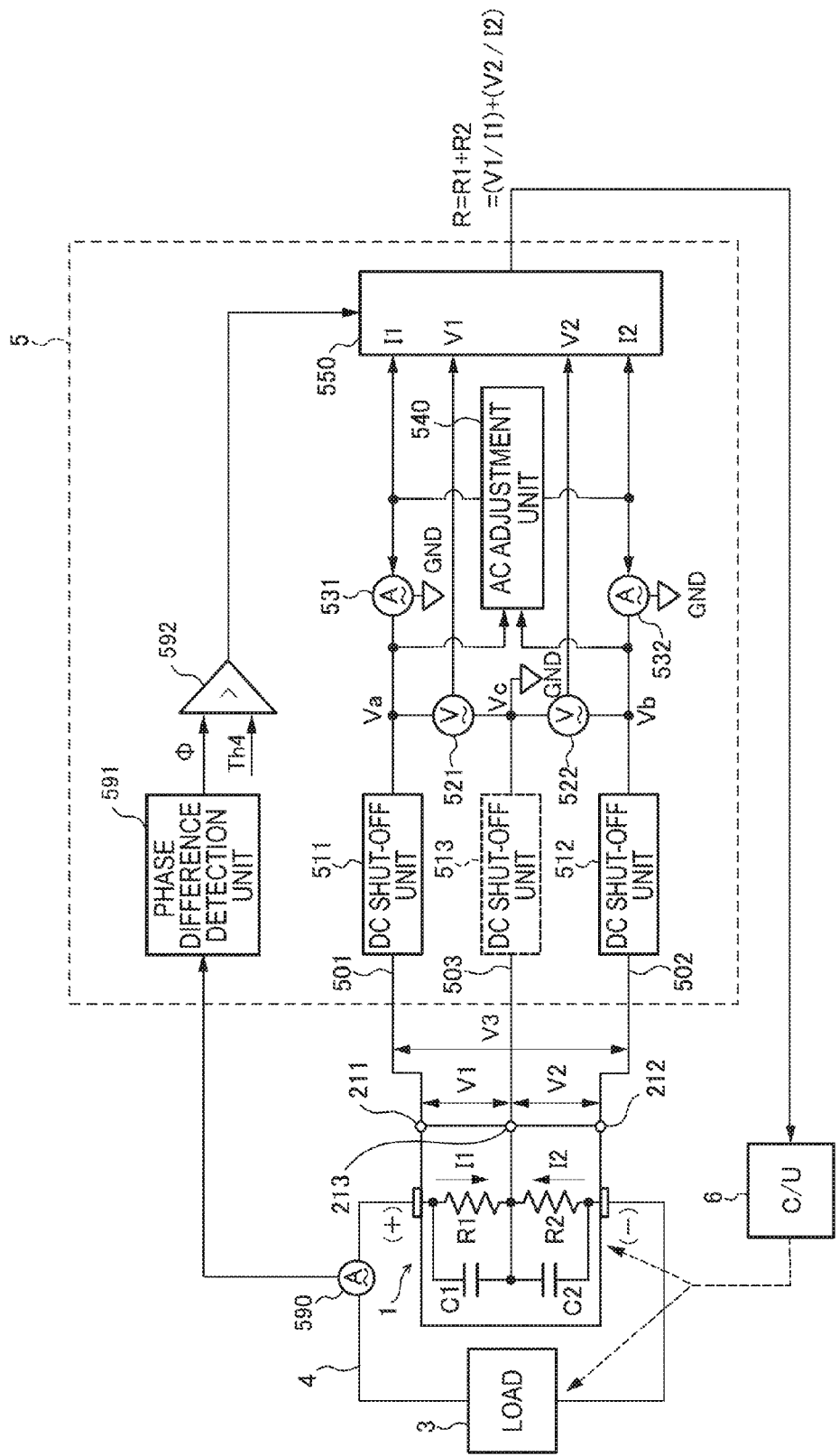
FIG. 20 is a diagram showing a phase difference detection unit in a fourth embodiment of the present invention.

FIG. 20 is a diagram showing the configuration of the impedance measuring device having a phase difference detection unit 591 in a fourth embodiment of the present invention.

In the fourth embodiment, a current sensor 590, the phase difference detection unit 591 and a determination circuit 592 are provided instead of the phase difference detection unit 561 and the determination circuit 562 shown in FIG. 5. It should be noted that other constituent parts are denoted by the same reference signs and not described here since being the same as those of the alternating current adjustment unit 540 shown in FIG. 5.

The current sensor 590 is connected between a fuel cell stack 1 and a load 3. In the present embodiment, the current sensor 590 is connected between a positive electrode terminal 211 of the fuel cell stack 1 and a positive electrode terminal of the load 3.

The current sensor 590 detects a leakage current $I_L$ leaking from the fuel cell stack 1 to the load 3. For example, the current sensor 590 extracts an alternating-current component from a current flowing from the fuel cell stack 1 to the load 3 and detects an amplitude value of the extracted alternating-current component as the leakage current $I_L$. The current sensor 590 outputs that detected leakage current $I_L$ to the phase difference detection unit 591.

As a phase difference Φ between alternating-current potentials Va and Vb increases, the amplitude value of the alternating current flowing from the fuel cell stack 1 to the load 3, i.e. the leakage current $I_L$ increases. Thus, the leakage current $I_L$ can be utilized as a parameter related to the phase difference Φ.

The phase difference detection unit 591 outputs a detection signal related to the phase difference Φ to the determination circuit 592 according to the leakage current $I_L$. In the present embodiment, as the leakage current $I_L$ increases, the phase difference detection unit 591 increases a signal level of the detection signal.

The determination circuit 592 determines a measurement state to be defective and outputs a determination signal of H-level when the detection signal output from the phase difference detection unit 591 is larger than a predetermined allowable value Th4. It should be noted that the allowable value Th4 is set by experimental data or the like similarly to the allowable value Th1 of the phase difference Φ.

According to the fourth embodiment, the leakage current $I_L$ of the alternating current detected by the current sensor 590 connected between the fuel cell stack 1 and the load 3 is utilized as the parameter correlated with the phase difference Φ between the alternating-current potentials generated at the positive electrode terminal 211 and the negative electrode terminal 212. Then, the impedance measuring device 5 determines the measurement state to be defective when the leakage current $I_L$ detected by the current sensor 590 is larger than the prescribed threshold value.

Thus, the leakage current $I_L$ can be more reliably detected when the alternating currents input to the fuel cell stack 1 by a positive-electrode side power supply unit 531 and a negative-electrode side power supply unit 532 leak to the load 3 due to the phase difference Φ. Accordingly, an impedance measurement error can be precisely estimated on the basis of the magnitude of the leakage current $I_L$, wherefore a measurement failure can be more accurately detected. Thus, reliability for a measurement result can be maintained and improved.

Fifth Embodiment

An impedance measuring device in a fifth embodiment of the present invention is described. It should be noted that the impedance measuring device of the present embodiment is basically the same in configuration as the impedance measuring device 5 shown in FIG. 5 and described using the same reference signs as in FIG. 5.

In the present embodiment, an execution period of a failure detection process of detecting on the basis of a phase difference Φ whether or not a measurement state is defective is limited. Since this can reduce a useless diagnosis process, a computational load of the impedance measuring device 5 can be reduced.

Specifically, the impedance measuring device 5 performs a measurement state diagnosis process in accordance with a command transmitted from a controller unit 6.

The controller unit 6 controls an operating state of a fuel cell system for causing a fuel cell stack 1 to generate power by supplying anode gas and cathode gas to the fuel cell stack 1. Specifically, the controller unit 6 manages power required to the fuel cell stack 1 from a load 3, a power generation state of the fuel cell stack 1 and the like and controls supply amounts of the anode gas and the cathode gas to be supplied to the fuel cell stack 1.

The impedance measuring device 5 performs the measurement state diagnosis process when a prescribed diagnosis condition under which capacitances C1 and C2 of the fuel cell stack 1 are likely to vary holds.

The start times of a start process performed when the fuel cell stack 1 is started, a purge process performed during a stop process of the fuel cell stack 1, a restart process performed when a vehicle returns from an idle stop state and the like are desirable as the above diagnosis conditions. A difference between the capacitances C1 and C2 is likely to increase while such processes are performed. It should be noted the purge process performed during the stop process is a process of opening a purge valve provided in an anode gas discharge passage until a pressure of anode gas present in the fuel cell stack 1 decreases to a prescribed value.

In the case of starting the above processes, the controller unit 6 transmits a diagnosis execution command to the impedance measuring device 5. Then, the impedance measuring device 5 judges that the diagnosis condition holds and performs the measurement state diagnosis process upon receiving the diagnosis execution command.

Further, even if an abnormal state is avoided and a return is made to a normal process after a measurement value of an internal resistance R exceeds a system predicted value and the fuel cell system is determined to be in the abnormal state, there is also a possibility that the measurement state of the internal resistance R is not recovered to a acceptable state immediately after the return.

Thus, a recovery process for recovering the abnormal state of the fuel cell stack 1 may be added to the diagnosis condition. In this case, the controller unit 6 transmits a diagnosis execution command to the impedance measuring device 5 when starting the recovery process. It should be noted that examples of the recovery process include a process for increasing a supply amount of cathode gas, a purge amount or the like, for example, in the event of flooding.

Further, the diagnosis process may be performed also when an average change rate of a detection signal level of an alternating-current potential difference V1 or V2, a detection signal level of an alternating current I1 or I2, a measurement value of an internal resistance R or the like becomes extremely large and exceeds a prescribed threshold value. This is because there is a possibility that the phase difference Φ is large in such a case.

The execution of a process requiring high reliability for the measurement result of the internal resistance R and the like can be thought as the other diagnosis conditions.

It should be noted that although an example in which the execution period of the diagnosis process is limited only to the execution period of a specific process has been described in the present embodiment, the diagnosis process may be performed with a determination cycle S extended when the diagnosis condition does not hold and the determination cycle S may be shortened when the diagnosis condition holds. In this way, it is possible to reduce a processing load of the impedance measuring device 5 while suppressing a reduction in reliability for the measurement result.

Next, there is described a technique for suppressing a reduction in the measurement accuracy of the internal resistance R measured by the impedance measuring device 5 when the phase difference Φ is generated between the alternating-current potential differences V1 and V2.

Sixth Embodiment

Figure 21:
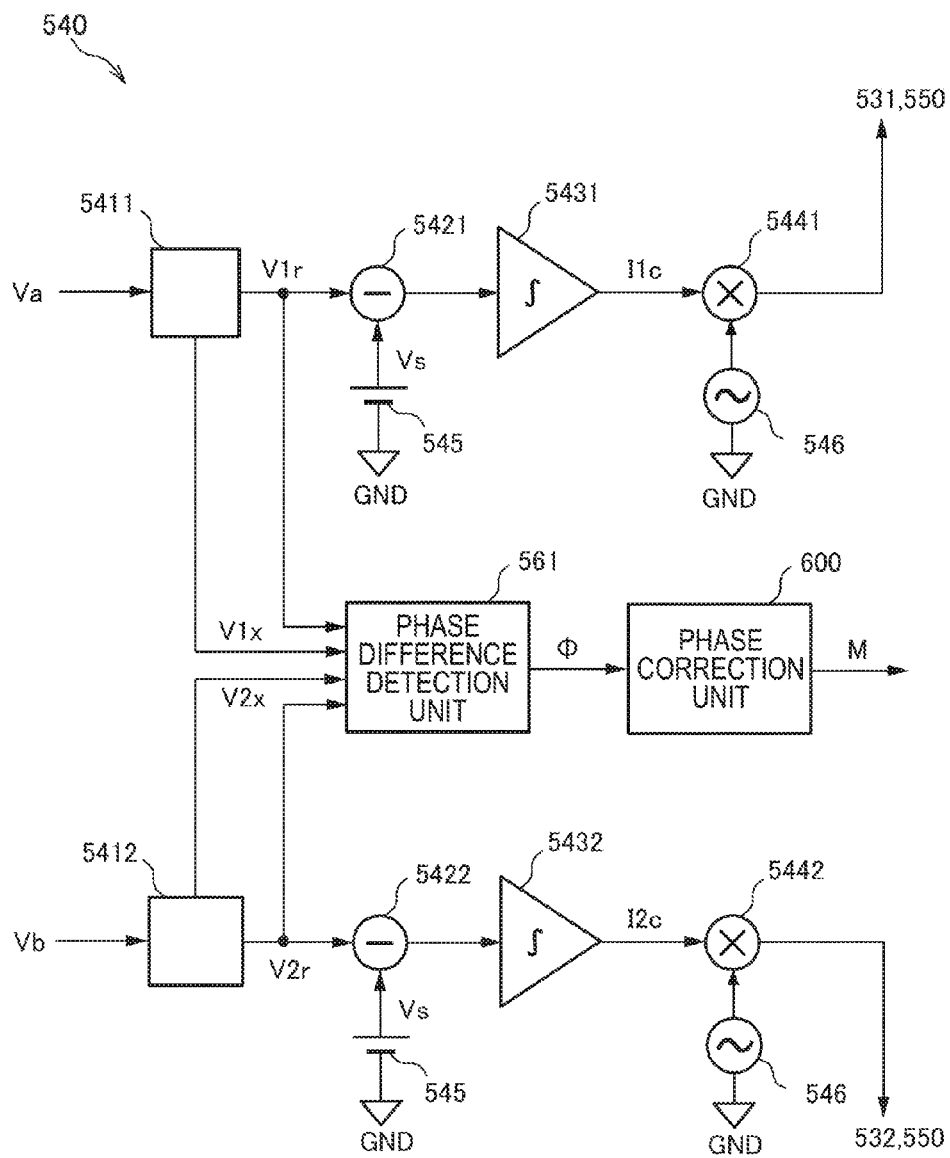
FIG. 21 is a diagram showing a phase correction unit in a sixth embodiment of the present invention.

FIG. 21 is a diagram showing the detail of an alternating current adjustment unit 540 in a sixth embodiment of the present invention. The alternating current adjustment unit 540 includes a phase correction unit 600 instead of the determination circuit 562 shown in FIG. 5.

The phase correction unit 600 corrects a phase difference (phase deviation) between an alternating current I1 output from a positive-electrode side power supply unit 531 and an alternating current I2 output from a negative-electrode side power supply unit 532 on the basis of a phase difference Φ output from a potential difference detection unit 561.

The phase correction unit 600 calculates a shift amount for shifting a phase of the alternating current I1 or I2 to reduce the phase difference Φ output from the potential difference detection unit 561 as a correction amount M necessary to correct the phase deviation.

Figure 22:
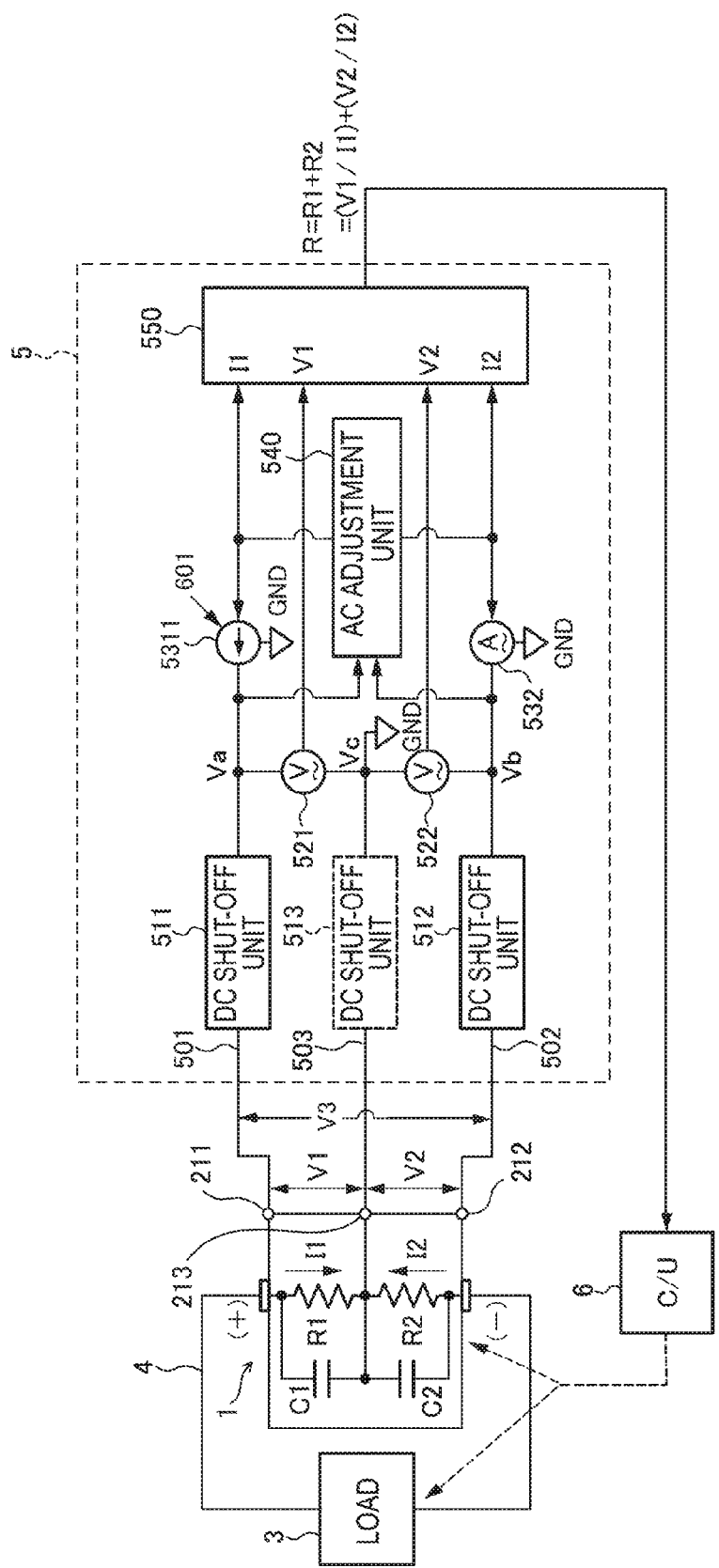
FIG. 22 is a diagram showing an impedance measuring device with a phase variable power supply unit.

FIG. 22 is a diagram showing the configuration of an impedance measuring device 5 in the present embodiment.

Here, a phase variable power supply unit 5311 is provided instead of the positive-electrode side power supply unit 531 shown in FIG. 2.

The phase variable power supply unit 5311 is an alternating current source capable of outputting an alternating current I1 of a reference frequency fb and changing a phase of the alternating current I1.

The phase variable power supply unit 5311 outputs the alternating current I1 of the reference frequency fb according to a command signal output from the alternating current adjustment unit 540 similarly to the positive-electrode side power supply unit 531. Further, the phase variable power supply unit 5311 shifts the phase of the alternating current I1 according to the correction amount M output from the phase correction unit 600.

Figure 4:
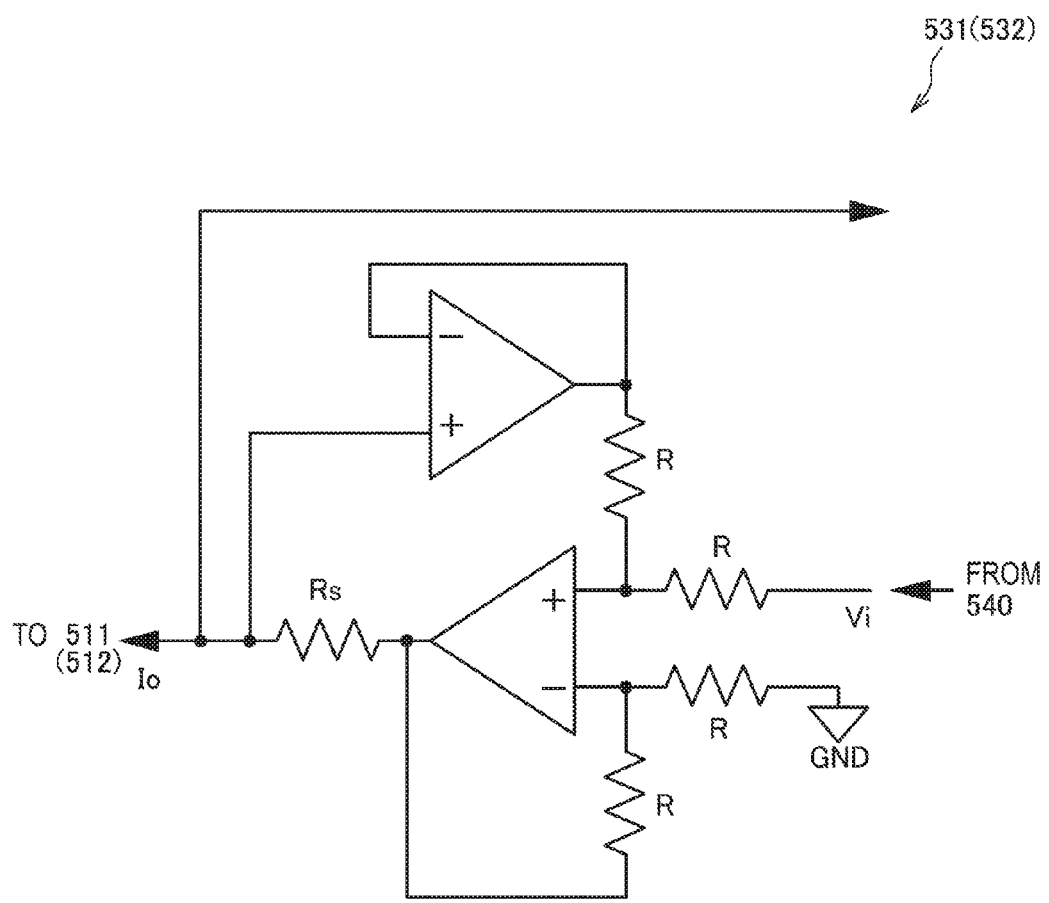
FIG. 4 is a diagram showing power supply units for outputting alternating currents to a positive electrode and a negative electrode of the laminated type battery.

The phase variable power supply unit 5311 is realized, for example, by providing a known phase shift circuit in addition to the voltage-current conversion circuit shown in FIG. 4. A state variable filter constituting an all-pass filter or the like is used as this phase shift circuit. In the present embodiment, the phase shift circuit is connected between an input terminal of the voltage-current conversion circuit and an output terminal of a positive-electrode side multiplier 5441.

In such a phase shift circuit, the phase of the alternating current I1 to be output to the voltage-current conversion circuit is shifted by changing a central frequency of a filter. Thus, the phase correction unit 600 is provided with a voltage-controlled oscillation circuit (VCO: voltage-controlled oscillator) and the like and the correction amount M is converted into a frequency by the voltage-controlled oscillation circuit and that frequency is input as the central frequency of the filter to the phase shift circuit.

Figure 23:
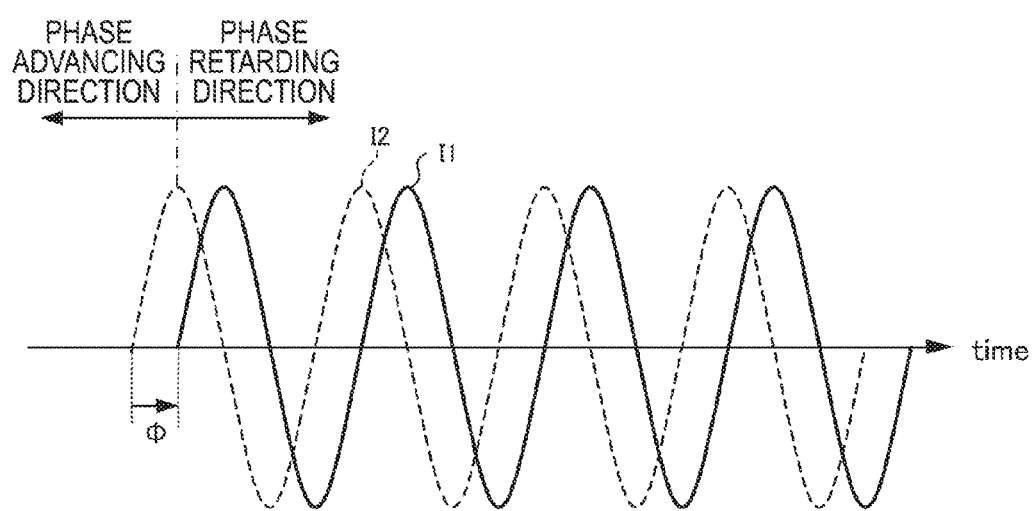
FIG. 23 is a chart when a correction is made to retard a phase of a positive-electrode side alternating current.

FIG. 23 is a chart showing a direction of shifting the phase of the alternating current I1 output from the phase variable power supply unit 5311 according to the correction amount M output from the phase correction unit 600. In this example, the phases of the alternating currents I1 and I2 coincide when the correction amount M is zero.

In the present embodiment, as a phase of an alternating-current potential difference V1 is shifted in an advancing direction with respect to an alternating-current potential difference V2, the correction amount M output from the phase correction unit 600 becomes a positive (plus) value larger than zero.

Thus, as shown in FIG. 23, the phase of the alternating current I1 output from the phase variable power supply unit 5311 is shifted in a retarding direction with respect to the alternating current I2 as the correction amount M becomes larger than zero.

On the other hand, as a phase of the alternating-current potential difference V2 is shifted in the advancing direction with respect to the alternating-current potential difference V1, the correction amount M becomes a negative (minus) value smaller than zero. Thus, the phase of the alternating current I1 output from the phase variable power supply unit 5311 is shifted in the advancing direction.

It should be noted that although an example in which the phase variable power supply unit 5311 is provided instead of the positive-electrode side power supply unit 531 has been described in the present embodiment, the negative-electrode side power supply unit 532 may be replaced by the phase variable power supply unit 5311 and the phase of the alternating current I2 may be shifted to reduce the phase difference Φ.

In such a case, in order to reduce the phase difference 1, the phase of the alternating current I2 needs to be shifted in a direction opposite to the one in which the phase of the alternating current I1 is shifted. Thus, the phase correction unit 600 is, for example, provided with an inversion circuit for inverting a sign of the phase difference Φ. For example, since the correction amount M becomes smaller than zero as the phase difference Φ becomes larger than zero, the phase of the alternating current I2 output from the phase variable power supply unit 5311 is shifted in the advancing direction with respect to the alternating current I1.

According to the sixth embodiment of the present invention, the phase of the alternating current I1 or I2 is corrected on the basis of the phase difference Φ between the alternating-current potential differences V1 and V2 by the phase correction unit 600. Since the phase difference Φ is reduced in this way, an error between the alternating current I1 used for the computation of an internal resistance R1 and an actual current actually flowing through the internal resistance R1 and an error between the alternating current I2 used for the computation of an internal resistance R2 and an actual current actually flowing through the internal resistance R2 become smaller. Thus, a reduction in the measurement accuracy of the internal resistance R calculated on the basis of the alternating currents I1 and I2 can be suppressed.

Thus, in the impedance measuring device 5 for measuring an internal impedance of a fuel cell stack 1, it is possible to suppress a reduction of the measurement accuracy due to variations of capacitance components in the fuel cell stack 1.

Further, in the present embodiment, the phase correction unit 600 shifts the phase of the alternating current I1 output from the phase shift circuit provided in the phase variable power supply unit 5311 such that the phase difference Φ between the alternating-current potential differences V1 and V2 is reduced.

This enables the phase of the alternating-current potential difference V1 to approach that of the alternating-current potential difference V2 even if a balance between capacitances C1 and C2 is lost according to a change in an internal state of a fuel cell stack 1 or a state of a load 3. Thus, even if a difference between the capacitances C1 and C2 increases, an increase of the phase difference Φ can be suppressed, wherefore a reduction in the measurement accuracy of the internal resistance R can be suppressed.

It should be noted that although an example in which the phase shift circuit is provided between the positive-electrode side power supply unit 531 and an alternating-current signal source 546 has been described in the present embodiment, a phase shift circuit may be provided between the positive-electrode side power supply unit 531 and a positive electrode terminal 211 of the fuel cell stack 1.

It should be noted that although an example in which the phase variable power supply unit 5311 is used as a technique for shifting the phase of the alternating current I1 has been described in the present embodiment, there is no limitation to this. A technique for shifting the phase of the alternating current I1 without using the phase variable power supply unit 5311 is described as another example with reference to FIG. 24.

Seventh Embodiment

Figure 24:
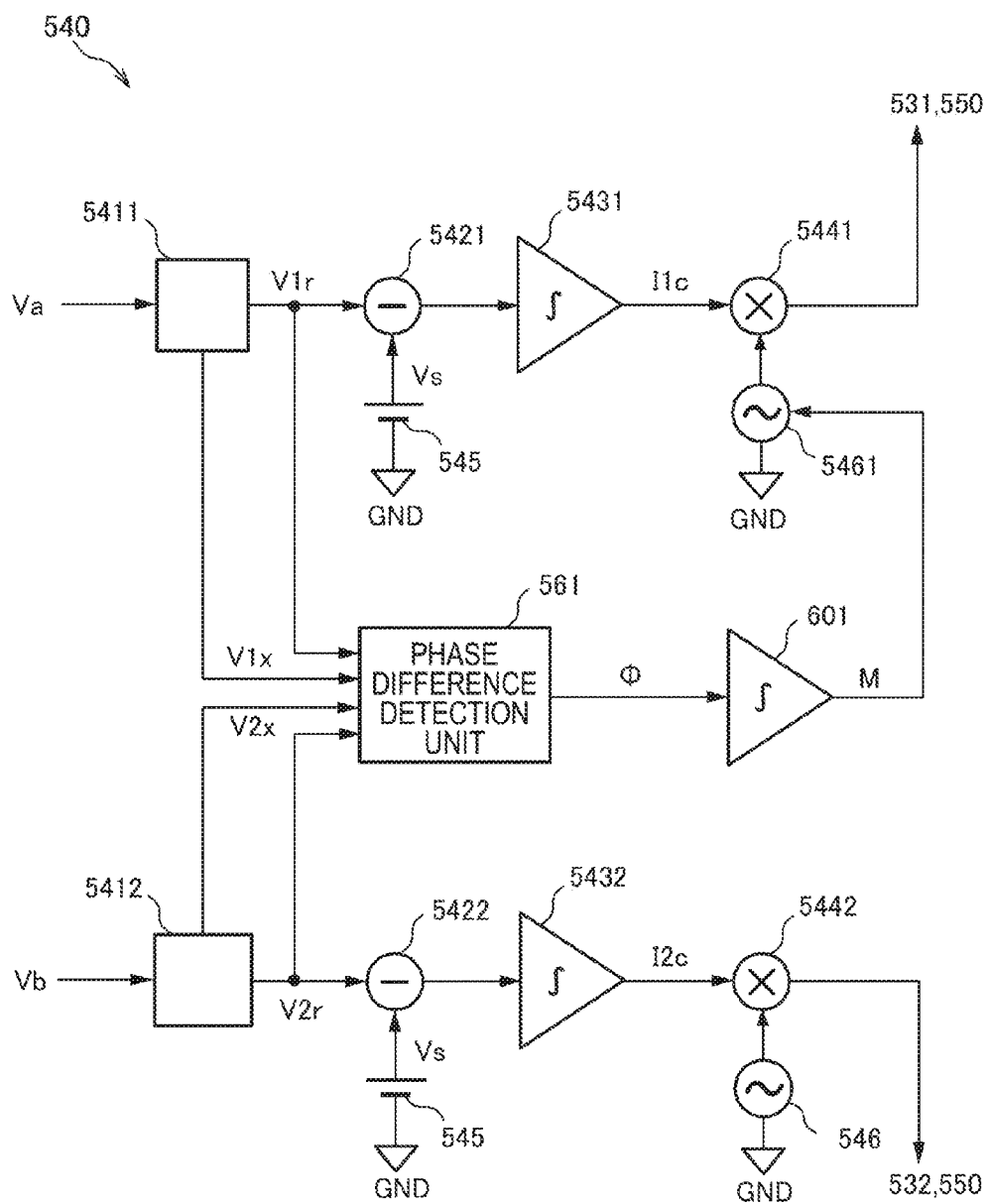
FIG. 24 is a diagram showing an impedance measuring device in a seventh embodiment of the present invention.

FIG. 24 is a diagram showing a configuration example of a phase correction unit 600 in a seventh embodiment of the present invention.

Here, the positive-electrode side multiplier 5441 shown in FIG. 5 is provided with a phase variable alternating-current signal source 5461 instead of the alternating-current signal source 546 for outputting an alternating-current signal of a reference frequency fb.

The phase variable alternating-current signal source 5461 is an alternating current source capable of outputting an alternating current of the reference frequency fb and changing a phase of the alternating current.

The phase correction unit 600 includes an integration circuit 601 to correct the phase of an alternating current I1 by a PI control.

The integration circuit 601 integrates a phase difference Φ output from a phase difference detection unit 561 and outputs an integrated value as a correction amount M to the phase variable alternating-current signal source 5461. Since a noise component included in a detection signal output from the phase difference detection unit 561 is suppressed by the integration circuit 601, the phase of the alternating current I1 can be accurately shifted.

For example, a phase of an alternating-current signal output from the phase variable alternating-current signal source 5461 is shifted in a retarding direction as the correction amount M output from the integration circuit 601 becomes larger than zero. Associated with this, the phase of the alternating current I1 output from a positive-electrode side power supply unit 531 is also shifted in the retarding direction.

On the other hand, since the phase of the alternating-current signal output from the phase variable alternating-current signal source 5461 is shifted in an advancing direction as the correction amount M becomes smaller than zero, the phase of the alternating current I1 output from the positive-electrode side power supply unit 531 is similarly shifted in the advancing direction.

By providing the phase variable alternating-current signal source 5461 to shift the phase of the alternating-current signal of the reference frequency fb in this way, the phase of the alternating current I1 can be shifted to reduce a phase difference 413 between alternating-current potential differences V1 and V2.

It should be noted that although the phase variable alternating-current signal source 5461 is provided instead of the alternating-current signal source 546 of the positive-electrode side power supply unit 531 in the present embodiment, the phase variable alternating-current signal source 5461 may be provided instead of the alternating-current signal source 546 of the negative-electrode side power supply unit 532.

In such a case, the phase correction unit 600 is, for example, provided with an inversion circuit for inverting a sign of the phase difference Φ as described in the sixth embodiment. For example, since the correction amount M becomes smaller than zero as the phase difference Φ becomes larger than zero, the phase of the alternating current I2 output from the phase variable power supply unit 5311 is shifted in the advancing direction.

According to the seventh embodiment of the present invention, the phase variable alternating-current signal source 5461 is used instead of the alternating-current signal source 546 and the phase of the alternating-current signal output from the phase variable alternating-current signal source 5461 is corrected by the correction amount M output from the integration circuit 601. Since this causes the phase of the alternating-current potential difference V1 to approach that of the alternating-current potential difference V2 and reduces the phase difference Φ, the leakage current $I_L$ leaking from the fuel cell stack 1 to the load 3 can be reduced. Thus, measurement accuracy for the internal resistance R of the fuel cell stack 1 can be improved.

Further, by using the phase variable alternating-current signal source 5461, a circuit configuration can be simplified and the phase of the alternating current I1 can be inexpensively changed as compared to the case where a phase shift adjusting function is added by providing the positive-electrode side power supply unit 531 with a phase shift circuit. Specifically, it is possible to simplify the circuit configuration while suppressing a cost increase.

Eighth Embodiment

It should be noted that although an example in which the phase of the alternating current I1 or I2 is corrected has been described in the sixth and seventh embodiments, an error (deviation) of a measurement result to be measured by the impedance measuring device 5 may be corrected. An example of revising the internal resistance R computed by the computation unit 550 shown in FIG. 5 is described below.

Figure 25:
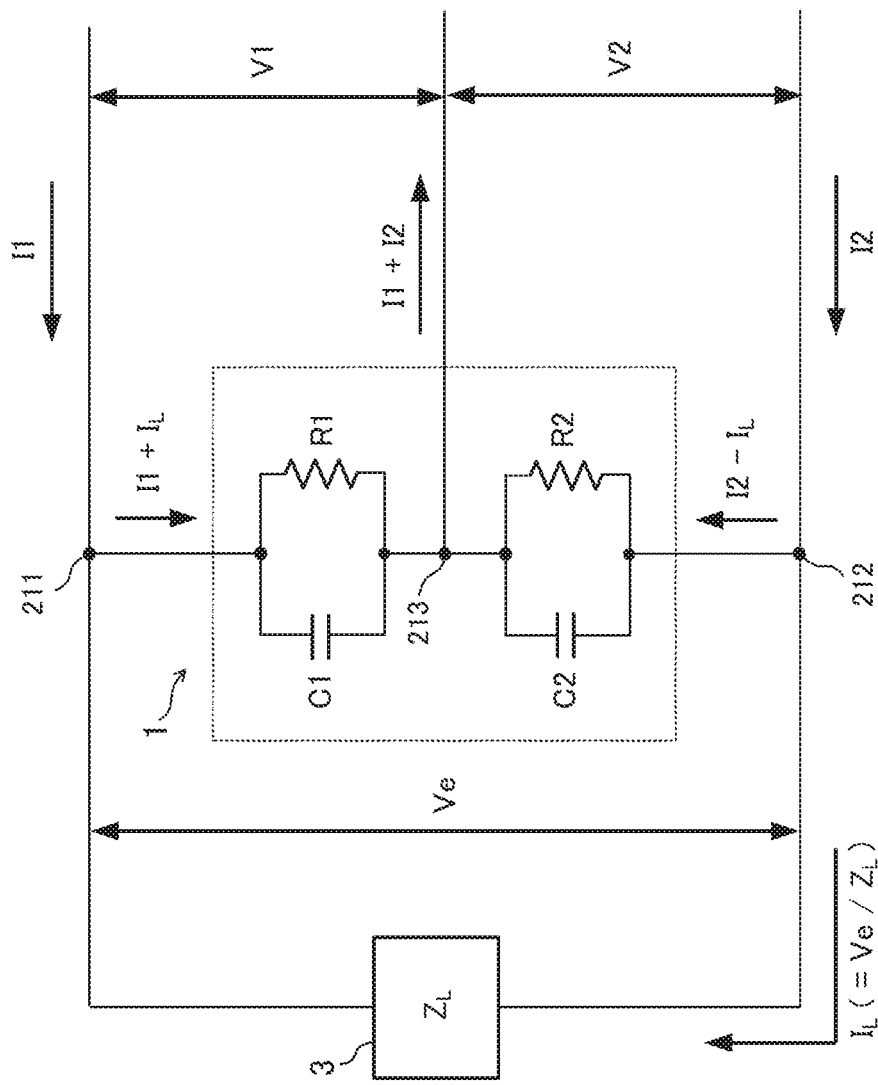
FIG. 25 is a diagram showing a technique for correcting a measurement error in an eighth embodiment of the present invention.

FIG. 25 is a diagram showing a technique for correcting errors of the alternating currents I1 and I2 due to a phase difference Φ between alternating-current potential differences V1 and V2.

FIG. 25 shows an equivalent circuit of a fuel cell stack 1 and paths of the alternating currents I1 and I2 flowing through an impedance $Z_L$ of a load 3. Here, a state is assumed where a phase of the alternating-current potential difference V1 is advanced by the phase difference Φ from that of the alternating-current potential difference V2 as shown in FIG. 7.

An amplitude of an alternating-current potential difference Ve between an alternating-current potential difference generated at a positive electrode terminal 211 and an alternating-current potential generated at a negative electrode terminal 212 of the fuel cell stack 1 can be expressed by the following equation.

[Equation 10]

$$Ve = 2 * Vs * \sin\left(\frac{\Phi}{2}\right) \tag{10}$$

It should be noted that a reference voltage Vs is a predetermined value to match the amplitudes of the alternating-current potential differences V1 and V2 as described with reference to FIG. 5.

As shown in equation (10), the amplitude of the alternating-current potential difference Ve is proportional to those of the alternating-current potential differences V1 and V2, i.e. the reference voltage Vs and increases according to the phase difference Φ in a range of 0° to 90°.

A part of the alternating current I2 output from a negative-electrode side power supply unit 532 to the negative electrode terminal 212 of the fuel cell stack 1 leaks toward the load 3 due to the phase difference Φ between the alternating-current potential differences V1 and V2. This leakage current $I_L$ can be expressed by the following equation.

[Equation 11]

$$\dot{I}_L = \frac{\dot{V}e}{Z} \tag{11}$$

It should be noted that the impedance $Z_L$ of the load 3 is a value obtained in advance by an experiment or the like and recorded, for example, in the phase correction unit 600 shown in FIG. 21.

The leakage current $I_L$ flows from the negative electrode terminal 212 of the fuel cell stack 1 to the positive electrode terminal 211 via the load 3. In the positive electrode terminal 211, the leakage current $I_L$ joins the alternating current I1 and a current (I1+$I_L$) obtained by adding the leakage current $I_L$ to the alternating current I1 is output to an intermediate-point terminal 213 through an internal resistance R1.

On the other hand, in the negative electrode terminal 212, a current (I2−$I_L$) obtained by subtracting the leakage current $I_L$ from the alternating current I2 is output to the intermediate-point terminal 213 through an internal resistance R2.

Thus, measurement errors of the internal resistances R1 and R2 caused by the leakage current $I_L$ can be expressed as ratios of measurement values R1$m$ and R2$m$ of the internal resistances R1 and R2 computed by a computation unit 550 and actual values R1$r$ and R2$r$ of the internal resistances R1 and R2 as in the following equations.

[Equations 12]

$$\frac{R1m}{R1r} = \frac{I1 + I_L}{I1} = 1 + \frac{I_L}{I1} \quad (12\text{-}1)$$

$$\frac{R2m}{R2r} = \frac{I2 - I_L}{I2} = 1 - \frac{I_L}{I2} \quad (12\text{-}2)$$

That is, ratios of the leakage current $I_L$ to the detection values of the alternating currents I1 and I2 are the measurement errors of the internal resistances R1 and R2. By applying a revision processing of the following equations to the measurement values R1$m$ and R2$m$ computed on the basis of the alternating-current potential differences V1 and V2 indicated by the detection signals and the alternating currents I1 and I2, the measurement errors caused by the leakage current $I_L$ can be corrected.

[Equations 13]

$$R1r = R1m \Big/ \left(1 + \frac{I_L}{I1}\right) \quad (13\text{-}1)$$

$$R2r = R2m \Big/ \left(1 - \frac{I_L}{I2}\right) \quad (13\text{-}2)$$

The revision processing shown in equations (13) is performed, for example, in the phase correction unit 600 shown in FIG. 21.

Figure 26:
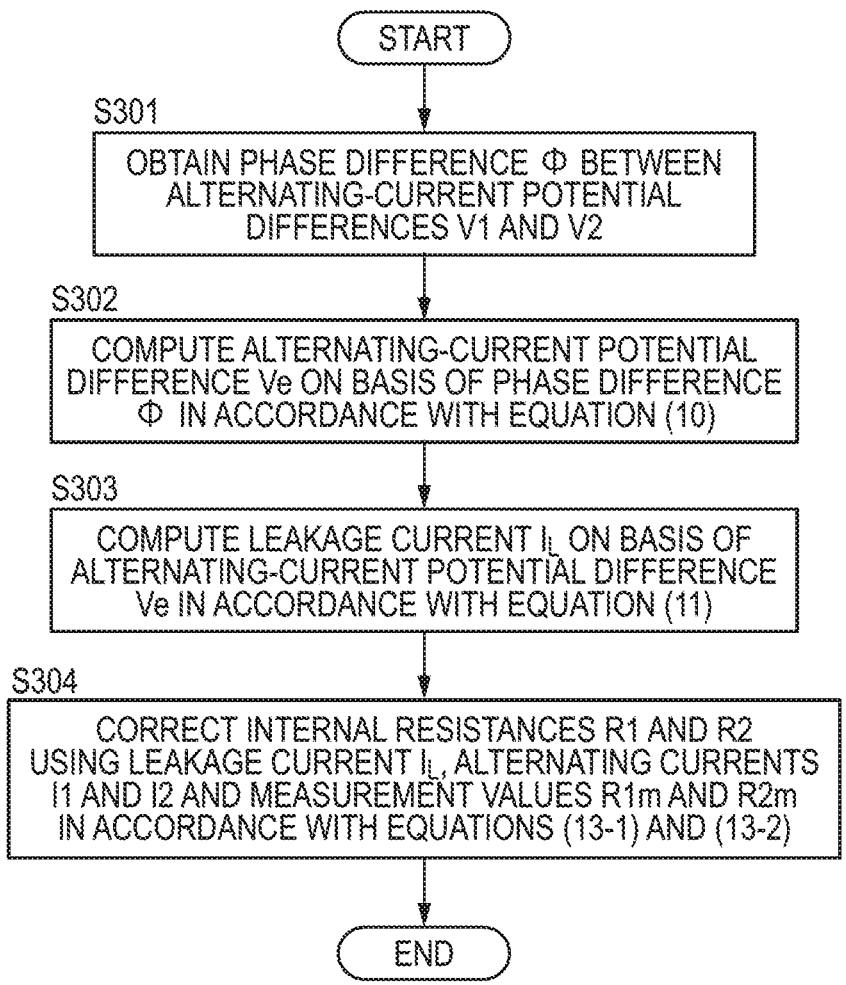
FIG. 26 is a flow chart showing a revision processing method for correcting an internal resistance.

FIG. 26 is a flow chart showing an example of a correction method for correcting the measurement errors associated with the phase difference Φ in the present embodiment. In this example, the revision processing of the internal resistances R1 and R2 is performed by the phase correction unit 600.

First, in Step S301, the phase correction unit 600 obtains the phase difference Φ output from a potential difference detection unit 561.

In Step S302, the phase correction unit 600 computes the amplitude value of the alternating-current potential difference Ve on the basis of the phase difference Φ obtained from the potential difference detection unit 561 and the predetermined reference potential Vs in accordance with equation (10).

In Step S303, the phase correction unit 600 computes the leakage current $I_L$ leaking to the load 3 on the basis of the alternating-current potential difference Ve and the impedance $Z_L$ of the load 3 in accordance with equation (11).

In Step S304, the phase correction unit 600 performs the revision processing for correcting the internal resistances R1 and R2.

Specifically, the phase correction unit 600 revises the internal resistance value R1$m$ to the actual value R1$r$ on the basis of the leakage current $I_L$ and the internal resistance value R1$m$ computed by the computation unit 550 in accordance with equation (13-1). The phase correction unit 600 revises the internal resistance value R2$m$ to the actual value R2$r$ on the basis of the leakage current $I_L$ and the internal resistance value R2$m$ computed by the computation unit 550 in accordance with equation (13-2).

Then, the phase correction unit 600 outputs the revised internal resistances R1 and R2 to the computation unit 550 and finishes a series of processings for the correction method for correcting the measurement errors associated with the phase difference Φ. Thereafter, an internal resistance R of the entire fuel cell stack 1 is computed in Step S12 shown in FIG. 11.

As just described, in the impedance measuring device 5, a measurement error of the internal resistance R due to the phase difference Φ between the alternating-current potential differences V1 and V2 is corrected.

According to the eighth embodiment of the present invention, the leakage current $I_L$ is computed on the basis of the phase difference Φ between the alternating-current potential differences V1 and V2 and phase deviations, which are errors of the alternating currents I1 and I2 associated with the phase difference Φ, are corrected on the basis of the leakage current $I_L$.

Specifically, the phase correction unit 600 corrects the phase difference between the alternating currents I1 and I2 by revising the detection value of the alternating current I1 output from the positive-electrode side power supply unit 531 and the detection value of the alternating current I2 output from the negative-electrode side power supply unit 532 according to the leakage current $I_L$ computed on the basis of the phase difference Φ. In this way, the measurement error of the internal resistance R measured by the impedance measuring device 5 can be corrected. Therefore, it is possible to suppress a reduction of impedance measurement accuracy due to capacitance components of the fuel cell stack 1 in the impedance measuring device 5.

Thus, the measurement error of the internal resistance R can be corrected by a computational processing even if the phase difference Φ between the alternating-current potential differences V1 and V2 increases such as when the impedance of the fuel cell stack 1 changes or when a balance between the capacitances C1 and C2 is lost. Therefore, the impedance measuring device 5 can have a simple circuit configuration as compared to the seventh embodiment.

According to the sixth to eighth embodiments of the present invention described above, the phase difference Φ between the alternating-current potential generated at the positive electrode terminal 211 and the alternating-current potential generated at the negative electrode terminal 212 of the fuel cell stack 1 is detected by the phase correction unit 600. Then, the phase difference of the alternating current output from at least one of the positive-electrode side power supply unit 531 and the negative-electrode side power supply unit 532 is corrected on the basis of the phase difference Φ. In this way, it is possible to suppress a reduction of impedance measurement accuracy due to the leakage current from the impedance measuring device 5 to the load 3.

It should be noted that although an example in which the phase of the alternating current I1 or I2 is corrected by revising the alternating current I1 or I2 output from the positive-electrode side power supply unit 531 or the negative-electrode side power supply unit 532 on the basis of the phase difference Φ has been described in the sixth and seventh embodiments, there is no limitation to this. For example, the phase correction unit 600 may compute the leakage current $I_L$ on the basis of the phase difference Φ as in equation (11) and correct the phase difference between the alternating currents I1 and I2 by revising the alternating currents I1 and I2 according to the leakage current $I_L$. In this case, a map in which shift amounts for the phases of the alternating currents I1 and I2 are related to each leakage current $I_L$ is set in advance in the phase correction unit 600.

Ninth Embodiment

An example in which the phase correction unit 600 of the alternating current adjustment unit 540 corrects the phase of the alternating current I1 or I2 has been described in the sixth and seventh embodiment. However, as the phase of the alternating current I1 or I2 is corrected by the phase correction unit 600, an error corresponding to a phase amount corrected by the phase correction unit 600 is included in an impedance computation result. Particularly, as the frequencies of the alternating currents I1 and I2 decrease, the error included in the impedance computation result increases for the reason described later. Accordingly, an example in which an error due to the correction of the phase of the alternating current I1 or I2 is revised for an impedance computation result is described in the ninth embodiment of the present invention.

An impedance measuring device of the present embodiment is similarly configured to the impedance measuring device 5 of the sixth or seventh embodiment. Similar constituent parts are denoted by the same reference signs and not described.

In the present embodiment, a phase correction unit 600 calculates a correction amount M of a phase of an alternating current I2 out of alternating currents I1 and I2. As described later, a phase angle of an impedance Z2 on a negative electrode side calculated by a calculation unit 5521 is shifted by an amount equivalent to the correction amount M due to the correction of the phase of the alternating current I2. Thus, a configuration equivalent to the phase variable alternating-current signal source 5461 as shown in the seventh embodiment is provided instead of the alternating-current signal source 546 on the negative electrode side. Then, the phase correction unit 600 outputs the calculated correction amount M to a phase variable power supply unit provided on the negative electrode side and outputs the calculated correction amount M as a correction amount Δξ used to revise the phase angle of the impedance Z2 to a computation unit 550.

Figure 27:
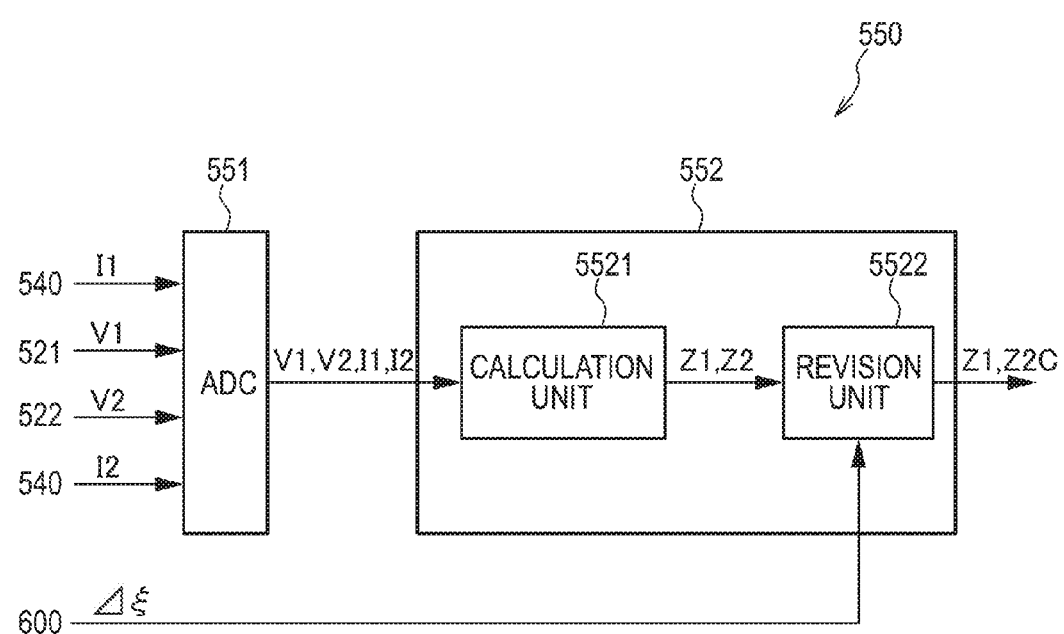
FIG. 27 is a diagram showing the configuration of a computation unit in a ninth embodiment of the present invention.

FIG. 27 is a diagram showing a detailed configuration of the computation unit 550. As described above, the correction amount Δξ is input to the computation unit 550 from the phase correction unit 600. Further, as shown in FIG. 22, an alternating-current potential difference V1 from a positive-electrode side potential difference detection unit 521, an alternating-current potential difference V2 from a negative-electrode side potential difference detection unit 522 and the alternating currents I1 and I2 from an alternating current adjustment unit 540 are input to the computation unit 550.

Figure 9:
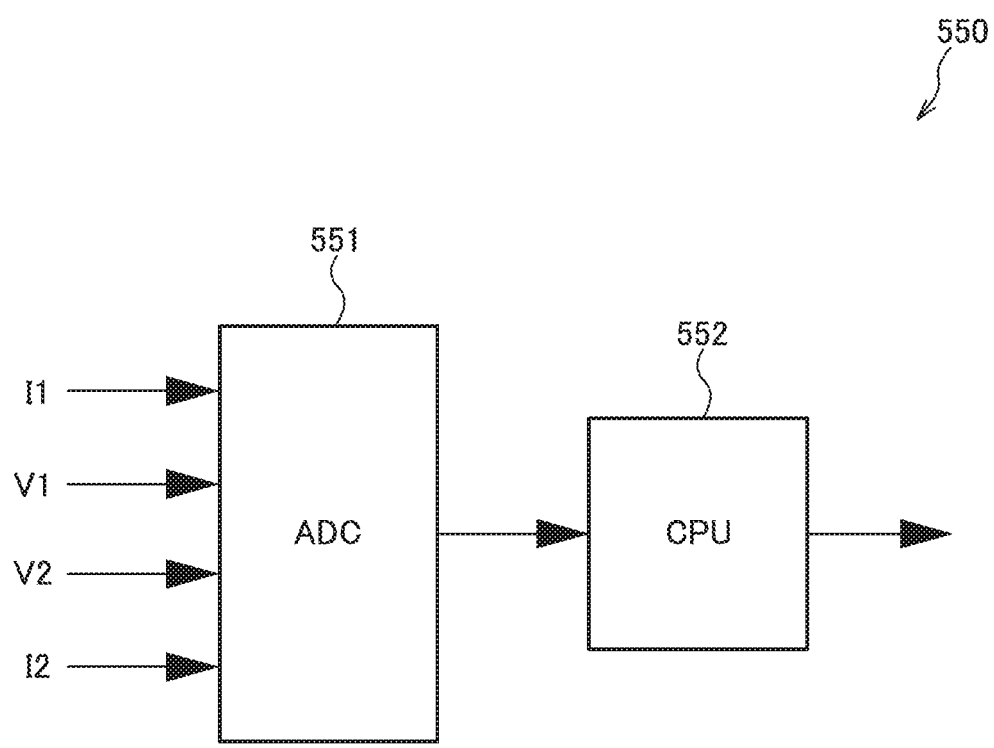
FIG. 9 is a diagram showing the detail of a computation unit for computing an impedance of the laminated type battery.

Similarly to the computation unit 550 shown in FIG. 9, the computation unit 550 includes an AD (Analog-Digital) converter 551 and a microcomputer chip 552. Further, the microcomputer chip 552 includes the calculation unit 5521 and a revision unit 5522.

The calculation unit 5521 calculates an impedance Z1 on a positive electrode side using the alternating-current potential difference V1 and the alternating current I1 output from the AD converter 551. Then, the calculation unit 5521 outputs the calculated impedance Z1 on the positive electrode side.

Further, the calculation unit 5521 calculates the impedance Z2 on the negative electrode side using the alternating-current potential difference V2 and the alternating current I2 output from the AD converter 551. Then, the calculation unit 5521 outputs the calculated impedance Z2 on the negative electrode side.

The revision unit 5522 receives the correction amount Δξ from the phase correction unit 600. The revision unit 5522 revises an error of the impedance Z2 due to the correction of the phase of the alternating current I2 according to the correction amount Δξ. Then, the revision unit 5522 outputs the revised impedance Z2 as an impedance Z2C. Further, the revision unit 5522 outputs the impedance Z1 output from the calculation unit 5521 without revising it.

Here, a method for revising the impedance Z2 by the revision unit 5522 is specifically described. First, a phase difference between the impedance Z1 on the positive electrode side and the impedance Z2 on the negative electrode side is described.

Figure 28:
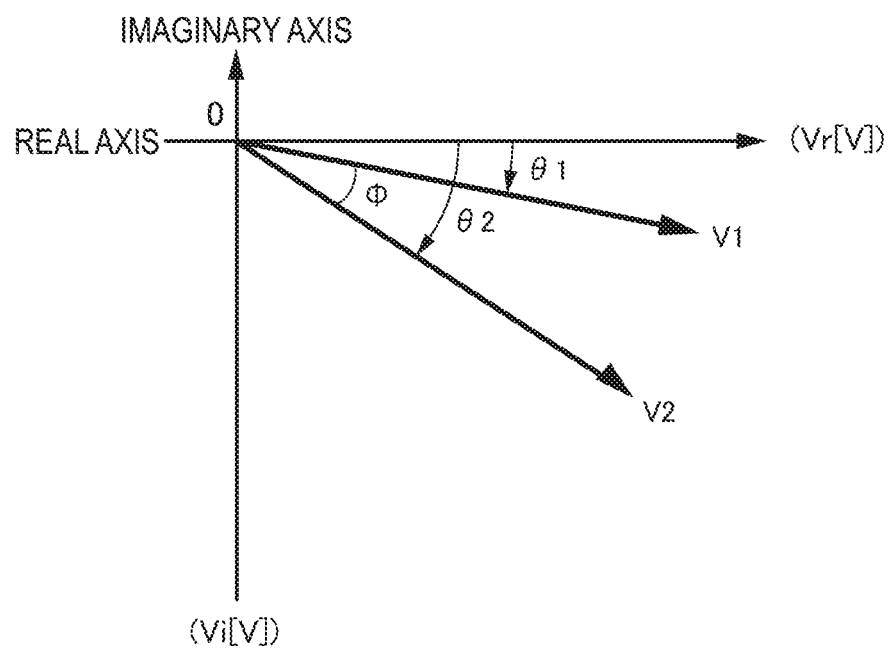
FIG. 28 is a graph showing an example of a phase difference between alternating-current potential differences on positive and negative electrode sides.

FIG. 28 is a graph showing an example of a phase difference ϕ between the alternating-current potential difference V1 on the positive electrode side and the alternating-current potential difference V2 on the negative electrode side. A horizontal axis shows real axis components of the alternating-current potential differences V1 and V2 with phase angles of the alternating currents I1 and I2 as references and a vertical axis shows imaginary axis components of the alternating-current potential differences V1 and V2. Here, the phase correction unit 600 does not correct the phase of the alternating current I2.

The phase of the alternating-current potential difference V1 is retarded by a phase angle θ1 from that of the alternating current I1. Further, the phase of the alternating-current potential difference V2 is retarded by a phase angle θ2 larger than the phase angle θ1 from that of the alternating current I2. Thus, the phase difference ϕ is generated between the alternating-current potential differences V1 and V2.

If the phase difference ϕ is generated between the alternating-current potential differences V1 and V2 as described above, a current leaks to a load 3. To reduce such current leakage, the phase correction unit 600 corrects the phase of the alternating current I2 such that the phases of the alternating-current potential differences V1 and V2 are equal.

Further, the alternating current adjustment unit 540 adjusts amplitudes of the alternating currents I1 and I2 such that amplitudes of the alternating-current potential differences V1 and V2 are equal. In this way, an equipotential control is applied to the alternating currents I1 and I2 such that the magnitudes and phases of the alternating-current potential differences V1 and V2 are equal.

Next, a deviation between the phase angle of the impedance Z1 and that of the impedance Z2 due to the correction of the phase of the alternating current I2 by the phase correction unit 600 is described.

Figure 29A:
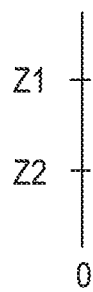
FIG. 29A is a chart showing an example of phases of impedances on the positive and negative electrode sides.
Figure 29B:
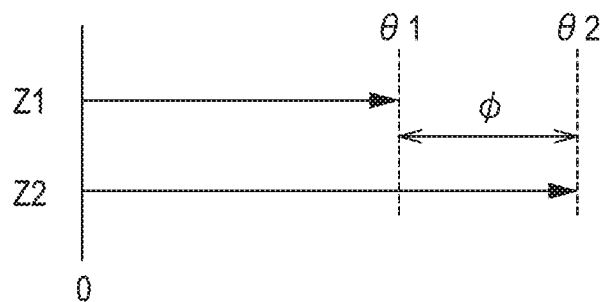
FIG. 29B is a chart showing an example of the phases of the impedances on the positive and negative electrode sides.
Figure 29C:
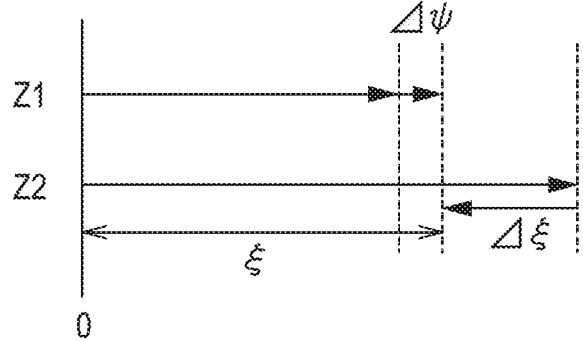
FIG. 29C is a chart showing an example of the phases of the impedances on the positive and negative electrode sides.

Each of FIGS. 29A, 29B and 29C is a chart showing an example of the phase angles of the impedances Z1 and Z2 calculated by the calculation unit 5521. In each figure, the phase angles with respect to real axes of the impedances Z1 and Z2 are shown. The phase angles are shown to be larger in a positive (plus) direction as the phase angles are more retarded.

FIG. 29A shows the phase angles of the impedances Z1 and Z2 when a fuel cell stack 1 has only resistance components without having any capacitance component.

Generally, the impedance measuring device 5 is adjusted to an ideal state so as not be affected by an individual difference of a measurement circuit and the like such as at the time of shipment. Further, an internal resistance does not affect a phase angle of an impedance. Thus, the phase angles of the impedances Z1 and Z2 are neither advanced nor retarded and are zero.

FIG. 29B shows the phase angles of the impedances Z1 and Z2 when the phase of the alternating current I2 is not corrected by the phase correction unit 600.

Generally, as the capacitance components of the fuel cell stack 1 increase, a phase angle of an impedance is more retarded. Here, the capacitance component on the negative electrode side of the fuel cell stack 1 is larger than that on the positive electrode side of the fuel cell stack 1. Thus, the phase angle θ2 of the impedance Z2 is larger than the phase angle θ1 of the impedance Z1. Therefore, the phase difference Φ is generated between the phase angle θ1 of the impedance Z1 and the phase angle θ2 of the impedance Z2.

FIG. 29C shows the phase angles of the impedances Z1 and Z2 when the phase of the alternating current I2 is corrected by the phase correction unit 600.

The phase correction unit 600 advances the phase of the alternating current I2 by the correction amount Δξ to zero the phase difference φ. Associated with this, the phase of the alternating-current potential difference V2 is actively advanced by an advanced amount of the phase of the alternating current I2, i.e. by the correction amount Δξ. Here, the impedance Z2 is calculated by dividing the alternating-current potential difference V2 by the amplitude of the alternating current I2. Thus, the phase angle of the impedance Z2 is advanced by an advanced amount of the phase of the alternating-current potential difference V2, i.e. by the correction amount Δξ when the phase of the alternating current I2 is corrected.

Further, when the phase of the alternating current I2 is corrected, the leakage current to the load 3 decreases. Thus, the phase of the alternating-current potential difference V1 is passively retarded by a change amount Δφ. Here, the impedance Z1 is calculated by dividing the alternating-current potential difference V1 by the amplitude of the alternating current I1. Thus, the phase angle of the impedance Z1 is retarded by a retarded amount of the phase of the alternating-current potential difference V1, i.e. by the change amount Δφ when the leakage current to the load 3 decreases.

As just described, the phase of the alternating current I2 is corrected to zero the phase difference Φ between the phase angles of the impedances Z1 and Z2. Here, when the phase of the alternating current I2 is corrected, the leakage current to the load 3 decreases and the phase of the alternating-current potential difference V1 is passively retarded by the change amount Δφ.

It should be noted that an example in which the phase of the alternating-current potential difference V1 is retarded by the change amount Δφ when the leakage current decreases has been described here. However, depending on capacitance components of the fuel cell stack 1 and the sizes of the load 3 and the like, the phase of the alternating-current potential difference V1 may be advanced when the leakage current decreases.

As just described, the phase angle of the impedance Z2 is advanced by the correction amount Δξ when the phase of the alternating current I2 is corrected by the correction amount Δξ. Since the leakage current decreases when the phase of the alternating current I2 is corrected, the phase angle of the impedance Z1 is retarded by the change amount Δφ. Thus, the phase angles of the impedances Z1 and Z2 are both corrected to a phase angle ξ. Since the passive change amount Δφ of the phase angle of the impedance Z1 is considered in this way, the phase difference φ becomes zero by advancing the phase of the alternating current I2 not by the phase difference φ before the correction, but by the correction amount Δξ.

Next, a revision method of the impedance Z2 by the revision unit 5522 is described.

Figure 30:
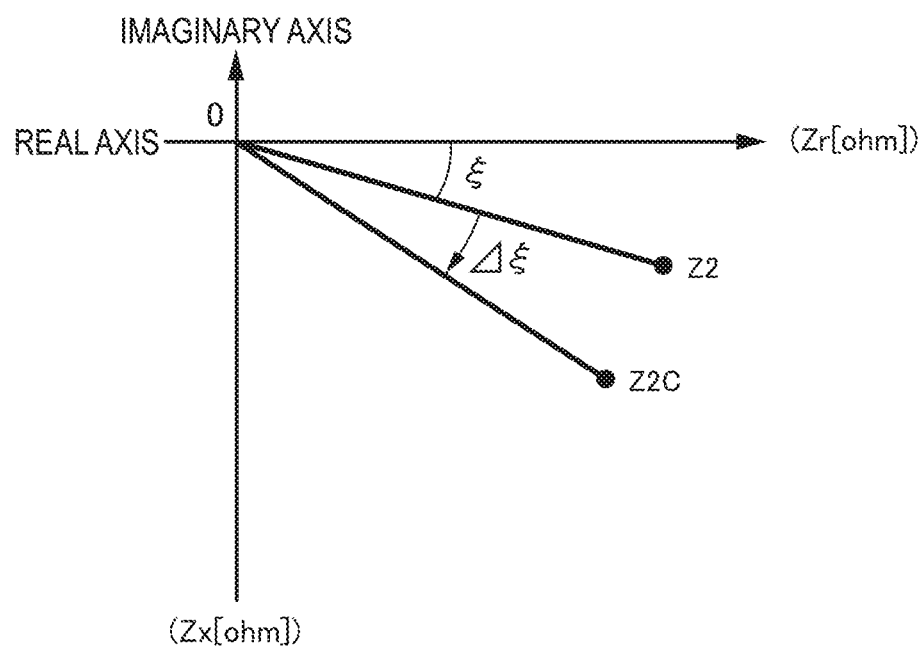
FIG. 30 is a graph showing a revision of an error due to a phase correction.

FIG. 30 is a graph showing a method for revising an error of the impedance Z2 due to the correction of the phase of the alternating current I2. FIG. 30 shows the impedance Z2 calculated by the calculation unit 5521 and the impedance Z2C after the revision of the error by the revision unit 5522. Note that a horizontal axis shows real axis components of the impedances Z2 and Z2C and a vertical axis shows imaginary axis components of the impedances Z2 and Z2C.

As described above, the phase angle of the impedance Z2 is advanced by the correction amount Δξ and an error is included in the impedance Z2 when the phase of the alternating current I2 is corrected. In contrast, the revision unit 5522 revises the error due to the correction of the phase of the alternating current I2 by retarding the phase angle of the impedance Z2 by the correction amount Δξ.

Here, the following relationship holds between the impedance Z2 before the revision and the impedance Z2C after the revision.

[Equations 14]

$$Z2Cr: \sqrt{Z2r^2 + Z2x^2} \cos(\xi + \Delta\xi) = \sqrt{Z2r^2 + Z2x^2} \quad (14\text{-}1)$$
$$(\cos\xi\cos\Delta\xi - \sin\xi\sin\Delta\xi)$$
$$= Z2r\cos\Delta\xi - Z2x\sin\Delta\xi$$

$$Z2Cx: \sqrt{Z2r^2 + Z2x^2} \sin(\xi + \Delta\xi) = \sqrt{Z2r^2 + Z2x^2} \quad (14\text{-}2)$$
$$(\sin\xi\cos\Delta\xi + \cos\xi\sin\Delta\xi)$$
$$= Z2r\cos\Delta\xi - Z2x\sin\Delta\xi$$

In this way, the revision unit 5522 calculates the impedance Z2C after the revision by revising the impedance Z2 using equations (14-1) and (14-2).

Here, the operation of the impedance measuring device 5 of this embodiment is described.

Figure 31:
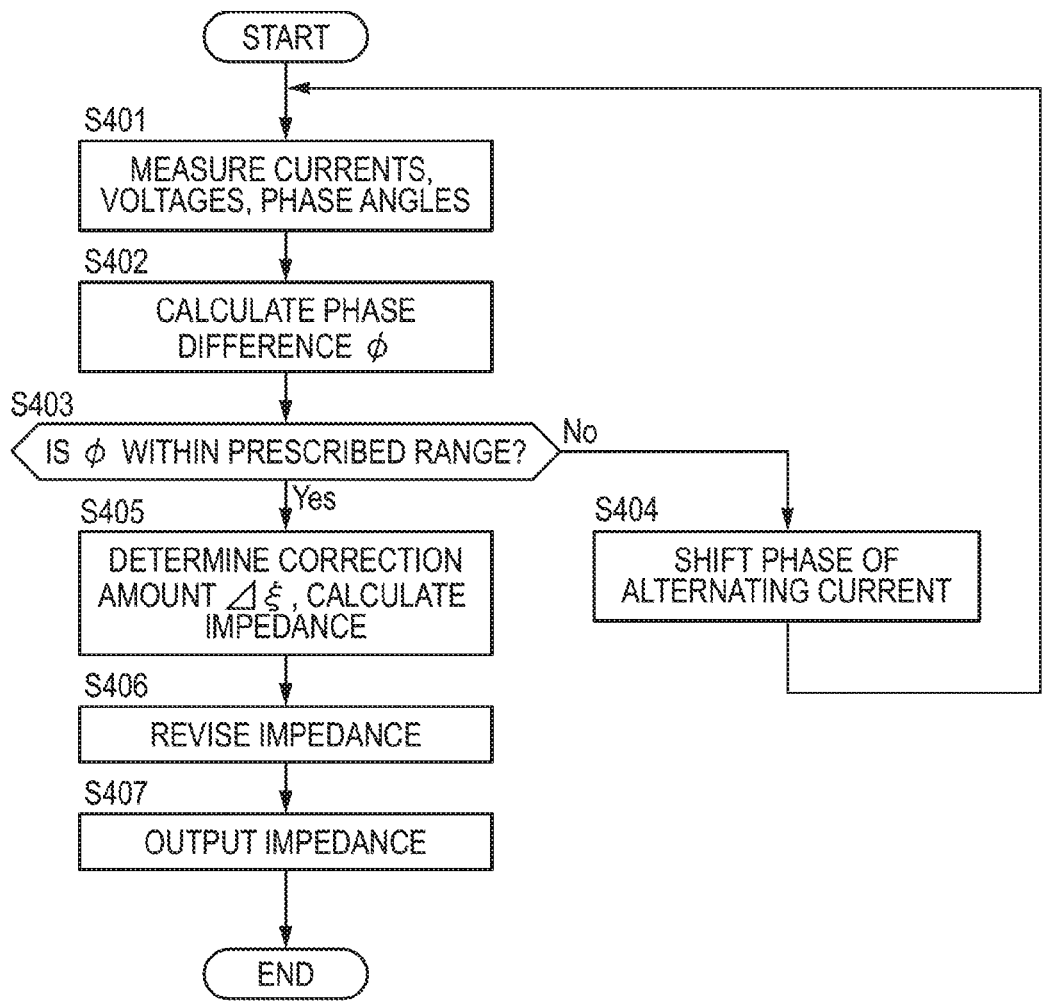
FIG. 31 is a flow chart showing a revision method for the error due to the phase correction.

FIG. 31 is a flow chart showing a process of revising the error of the impedance Z2 due to the correction of the phase of the alternating current I2. It should be noted that the phase correction by the phase correction unit 600 is not performed when this process is started.

In Step S401, the alternating current adjustment unit 540 measures a real axis component V1r and an imaginary axis component V1x of the alternating-current potential difference V1, the phase angle θ1 of the alternating-current potential difference V1, a real axis component V2r and an imaginary axis component V2x of the alternating-current potential difference V2 and the phase angle θ2 of the alternating-current potential difference V2. For example, the alternating current adjustment unit 540 performs processings similar to those of Steps S101 to S104 shown in FIG. 14.

Subsequently, in Step S402, the alternating current adjustment unit 540 calculates the phase difference φ by subtracting the phase angle θ1 of the alternating-current potential difference V1 from the phase angle θ2 of the alternating-current potential difference V2. It should be noted that this processing is similar to that of Step S105 shown in FIG. 14.

Subsequently, in Step S403, the alternating current adjustment unit 540 determines whether or not the phase angle φ is within a prescribed range. Here, the phase difference φ is desirably zero to generate no leakage current to the load 3. Thus, the alternating current adjustment unit 540 determines, for example, whether or not the phase difference φ is within such a prescribed range of not smaller than −1° and smaller than +1°.

When the alternating current adjustment unit 540 determines that the potential differences φ is beyond the prescribed range (No in Step S403), the phase correction unit 600 shifts the phase of the alternating current I2 to zero the phase difference φ (Step S404). Then, the impedance measuring device 5 returns to the processing of Step S401.

When the alternating current adjustment unit 540 determines that the potential differences φ is within the prescribed range (Yes in Step S403), an advance is made to the processing of Step S405.

In Step S405, the phase correction unit 600 determines the phase angle, by which the phase correction unit 600 has shifted the phase of the alternating current I2 when the phase difference φ was within the predetermined range, as the correction amount Δξ. The phase correction unit 600 outputs the determined correction amount Δξ to the computation unit 550. It should be noted that the phase correction unit 600 sets the correction amount Δξ to zero when the processing of Step S404 is not performed.

Then, the calculation unit 5521 computes a real axis component Z1r and an imaginary axis component Z1x of the impedance Z1 from the alternating-current potential difference V1 and the alternating current I1. Further, the calculation unit 5521 computes a real axis component Z2r and an imaginary axis component Z2x of the impedance Z2 from the alternating-current potential difference V2 and the alternating current I2.

For example, the calculation unit 5521 includes an in-phase component extraction unit 710 and an orthogonal component extraction unit 720 similarly to the positive-electrode side detector circuit 5411 shown in FIG. 6 and computes the real axis component V1r and the imaginary axis component V1x of the altering-current potential difference V1 using these constituent parts. Then, the calculation unit 5521 calculates the real axis component Z1r of the impedance Z1 by dividing the real axis component V1r by the amplitude of the alternating current I1. Further, the calculation unit 5521 calculates the imaginary axis component Z1x of the impedance Z1 by dividing the imaginary axis component V1x by the amplitude of the alternating current I1.

Similarly, the calculation unit 5521 includes constituent parts similar to those of the negative-electrode side detector circuit 5412 and computes the real axis component Z2r and the imaginary axis component Z2x of the impedance Z2 using these constituent parts.

Subsequently, in Step S406, the revision unit 5522 calculates a real axis component Z2Cr and an imaginary axis component Z2Cx after the revision using the real axis component Z2r and the imaginary axis component Z2x of the impedance Z2 and the correction amount Δξ in accordance with equations (14-1) and (14-2). In this way, the revision unit 5522 calculates the impedance Z2C after the revision.

It should be noted that the revision unit 5522 may calculate trigonometric calculation parts in equations (14-1) and (14-2) using a map set in advance. For example, a trigonometric table, which is a map relating an angle θ and a sine function (sin θ) and a cosine function (cos θ) at the angle θ is stored in the revision unit 5522.

Then, the revision unit 5522 computes sin θ and cos θ using the stored trigonometric table. The revision unit 5522 calculates the real axis component Z2Cr and the imaginary axis component Z2Cx after the revision by performing the following calculations out of equations (14-1) and (14-2) using these sin Δξ and cos Δξ and the real axis component Z2r and the imaginary axis component Z2x of the impedance Z2.

$$Z2Cr{:}Z2r\cos\Delta\xi - Z2x\sin\Delta\xi$$

$$Z2Cx{:}Z2r\cos\Delta\xi - Z2x\sin\Delta\xi \qquad \text{[Equations 15]}$$

Further, the revision unit 5522 calculates the following values in advance.

[Equations 16]

$$\text{Phase angle of impedance } Z2 \text{ before revision: } \xi = \tan^{-1}\frac{Z2x}{Z2r}$$

$$\text{Magnitude of impedance } Z2 \text{ before revision: } |Z2| = \sqrt{Z2r^2 + Z2x^2}$$

The revision unit 5522 calculates the phase angle after the revision (ξ+Δξ) by adding the calculated phase angle ξ before the revision and the correction amount Δξ corrected by the phase correction unit 600. The revision unit 5522 computes sin(ξ+Δξ) and cos(ξ+Δξ) using the stored trigonometric function. Then, the revision unit 5522 calculates the real axis component Z2Cr and the imaginary axis component Z2Cx after the revision by performing the following calculations out of equations (14-1) and (14-2) using these sin(ξ+Δξ) and cos(ξ+Δξ) and the magnitude Z2 of the impedance Z2 before the revision.

$$Z2Cr{:}\sqrt{Z2r^2+Z2x^2}(\cos\xi\cos\Delta\xi - \sin\xi\sin\Delta\xi)$$

$$Z2Cx{:}\sqrt{Z2r^2+Z2x^2}(\sin\xi\cos\Delta\xi + \cos\xi\sin\Delta\xi) \qquad \text{[Equations 17]}$$

Subsequently, in Step S407, the revision unit 5522 outputs the impedance Z2C to the controller unit 6. Further, the revision unit 5522 outputs the impedance Z1 to the controller unit 6.

After the processing of Step S407 is finished, the impedance measuring device 5 finishes the process relating to impedance measurement.

Here, a relationship of the correction amount g used for revision by the revision unit 5522 and the real axis component Z2r and the imaginary axis component Z2x of the impedance Z2 before the revision by the revision unit 5522 is described.

Figure 32:
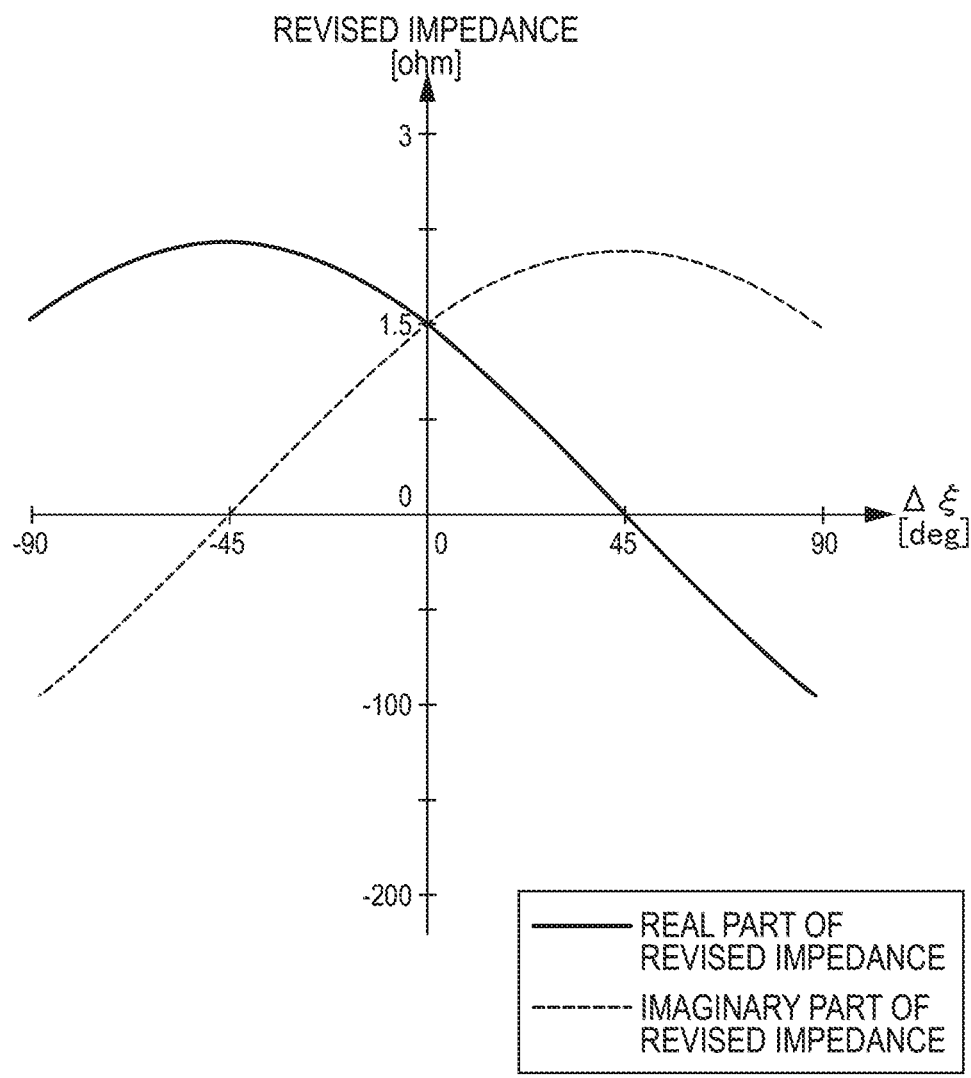
FIG. 32 is a graph showing an example of a relationship of a correction amount and a revised impedance.

FIG. 32 is a graph showing an example of the relationship of the correction amount g used for revision by the revision unit 5522 and the impedance Z2C revised by the revision unit 5522. Here, the real axis component Z2r and the imaginary axis component Z2x of the impedance Z2 are both 1.5Ω. Thus, the phase angle of the impedance Z2 is 45°.

First, a relationship of the correction amount g and the real axis component Z2r after the revision is described. In a range of the correction amount $\Delta\xi$ from $-90°$ to $-45°$, the real axis component $Z2r$ after the revision increases as the correction amount g decreases. In a range of the correction amount $\Delta\xi$ from $-45°$ to $+90°$, the real axis component $Z2r$ after the revision decreases as the correction amount $\Delta\xi$ increases.

Next, a relationship of the correction amount $\Delta\xi$ and the imaginary axis component $Z2x$ after the revision is described. In a range of the correction amount $\Delta\xi$ from $-90°$ to $+45°$, the imaginary axis component $Z2x$ after the revision increases as the correction amount $\Delta\xi$ increases. In a range of the correction amount $\Delta\xi$ from $+45°$ to $+90°$, the imaginary axis component $Z2x$ after the revision decreases as the correction amount $\Delta\xi$ increases.

As just described, the real axis component $Z2r$ and the imaginary axis component $Z2x$ of the impedance $Z2$ after the revision may increase or decrease when the correction amount g increase. However, in a range of the correction amount $\Delta\xi$ from $-45°$ to $+45°$, the real axis component $Z2r$ after the revision decreases and the imaginary axis component $Z2x$ after the revision increases as the correction amount $\Delta\xi$ increases.

Generally, states on the positive and negative electrode sides of the fuel cell stack 1 are not very much different. Thus, the phase angle of the impedance $Z1$ and that of the impedance $Z2$ are substantially equal and the correction amount $\Delta\epsilon$ is often a value near $0°$, i.e. a value in the range from $-45°$ to $+45°$. Thus, in many cases, the real axis component $Z2r$ after the revision decreases and the imaginary axis component $Z2x$ after the revision increases as the correction amount $\Delta\xi$ increases.

It should be noted that although an example in which the phase correction unit 600 corrects the phase of the alternating current $I2$ has been described in the present embodiment, there is no limitation to this. The phase correction unit 600 may correct the phase of the alternating current $I1$. In such a case, the revision unit 5522 revises an error of the impedance $Z1$ on the positive electrode side.

Further, although the phase correction unit 600 revises both the real axis component $Z2r$ and the imaginary axis component $Z2x$ of the impedance $Z2$ in the present embodiment, there is no limitation to this. The phase correction unit 600 may revise either one of the real axis component $Z2r$ and the imaginary axis component $Z2x$.

For example, the controller unit 6 may use only the real axis component $Z2r$ of the impedance $Z2$ without using the imaginary axis component $Z2x$ for a control of the operating state of the fuel cell stack 1. In such a case, the revision unit 5522 revises only the real axis component $Z2r$ and does not revise the imaginary axis component $Z2x$.

According to the ninth embodiment of the present invention, the revision unit 5522 revises the real axis component $Z2r$ and the imaginary axis component $Z2x$ of the impedance $Z2$ on the negative electrode side calculated by the calculation unit 5522 according to the correction amount 44 of the alternating current $I2$ by the phase correction unit 600.

Here, if the phase difference $\phi$ is generated between the phases of the alternating-current potential differences $V1$ and $V2$, a leakage current to the load 3 is generated and the impedance measuring device 5 cannot precisely measure the impedances $Z1$ and $Z2$. Thus, the phase of the alternating current $I2$ is corrected by the correction amount $\Delta\xi$ by the phase correction unit 600, whereby the phase difference $\phi$ becomes zero and the leakage current is reduced.

However, when the phase of the alternating current $I2$ is corrected by the correction amount $\Delta\xi$, the phase angle of the impedance $Z2$ is shifted by the correction amount $\Delta\xi$ to cause an error. In contrast, in the present embodiment, the revision unit 5522 revises the phase angle of the impedance $Z2$ by the correction amount $\Delta\xi$, thereby revising the error due to the correction of the phase of the alternating current $I2$.

As just described, no leakage current to the load 3 is generated by correcting the phase of the alternating current $I2$ and, further, the error of the impedance $Z2$ due to the correction of the phase of the alternating current $I2$ is revised. Thus, the impedance $Z2C$ having the error revised by the revision unit 5522 has a more accurate value. Therefore, the controller unit 6 can properly control the operating state of the fuel cell stack 1 by using the more accurate impedance $Z2C$.

Further, the revision unit 5522 revises the phase angle of the impedance $Z2$ in a direction opposite to a shifted direction of the alternating current $I2$ by the correction amount $\Delta\xi$, which is the magnitude of the phase by which the alternating current $I2$ is shifted. Since the revision unit 5522 properly revises the error included in the impedance $Z2$ in this way, the impedance $Z2C$ has a more accurate value. By using the more accurate impedance $Z2C$ in this way, the controller unit 6 can properly control the operating state of the fuel cell stack 1.

Further, the revision unit 5522 revises at least one of the real axis component $Z2r$ and the imaginary axis component $Z2x$ of the impedance $Z2$ calculated by the calculation unit 5522. By omitting the revision processing of either one of the real axis component $Z2r$ and the imaginary axis component $Z2x$ by the revision unit 5522 if necessary in this way, a processing load of the impedance measuring device 5 can be reduced.

Tenth Embodiment

In the ninth embodiment, an example in which the revision unit 5522 constantly revises the impedance $Z2$ calculated by the calculation unit 5521 has been described. In a tenth embodiment, an example in which a revision unit 5522 revises an impedance $Z2$ if necessary is described.

Figure 33:
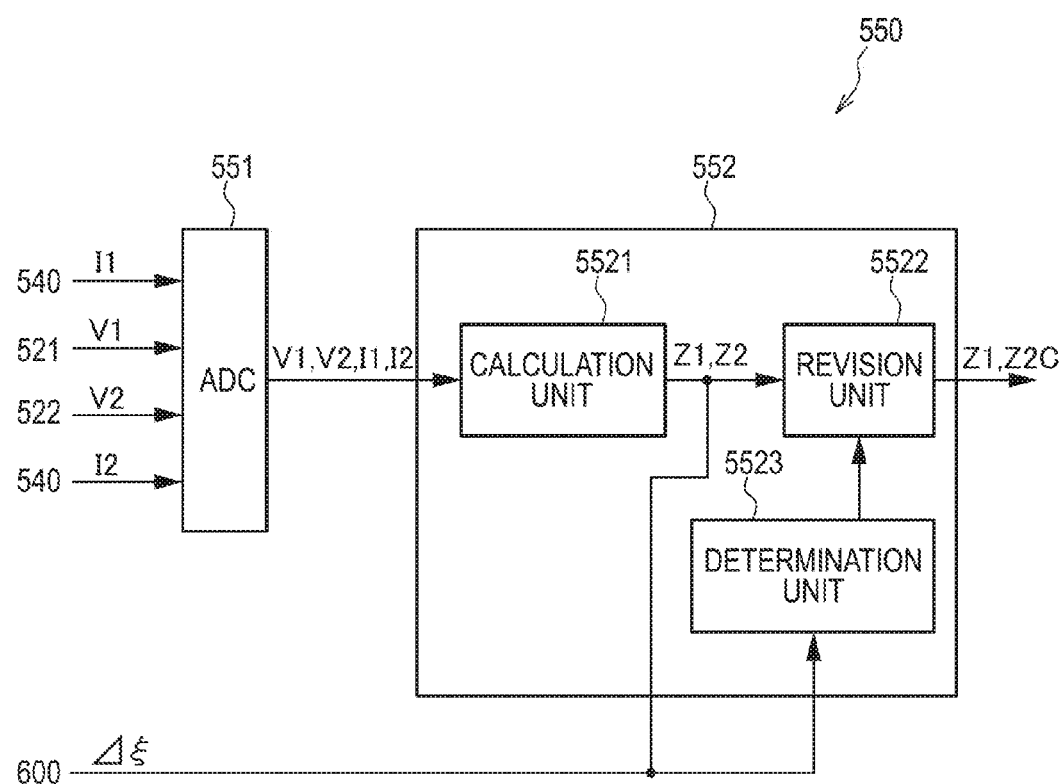
FIG. 33 is a diagram showing the configuration of a computation unit in a tenth embodiment of the present invention.

FIG. 33 is a diagram showing the configuration of a computation unit 550 of the present embodiment. In the computation unit 550 of the present embodiment, a microcomputer chip 552 shown in FIG. 27 further includes a determination unit 5523. It should be noted that the same constituent parts as those of the computation unit 550 shown in FIG. 27 are denoted by the same reference signs and not described below.

The determination unit 5523 receives a correction amount $\Delta\xi$ of a phase angle from a phase correction unit 600.

As described above, when a phase of an alternating current $I2$ is corrected by the correction amount $\Delta\xi$ by the phase correction unit 600, a phase angle of the impedance $Z2$ is shifted by the correction amount $\Delta\xi$. Thus, an error included in the impedance $Z2$ is small when the correction amount $\Delta\xi$ of the phase of the alternating current $I2$ by the phase correction unit 600 is small.

As just described, when the error of the impedance $Z2$ due to the correction of the phase of the alternating current $I2$ is small, the impedance $Z2$ has substantially an accurate value even if a revision by the revision unit 5522 is not made. Thus, a need to revise the impedance $Z2$ by the revision unit 5522 is low. Therefore, the determination unit 5523 determines on the basis of the correction amount $\Delta\xi$ of the phase of the alternating current $I2$ whether or not the revision by the revision unit 5522 is necessary.

The revision unit 5522 revises the impedance Z2 when the revision is determined to be necessary by the determination unit 5523. Then, the revision unit 5522 outputs an impedance Z2C after the revision to a controller unit 6. On the other hand, when the revision is determined to be unnecessary by the determination unit 5523, the revision unit 5522 outputs the impedance Z2 to the controller unit 6 without revising the impedance Z2.

Figure 34:
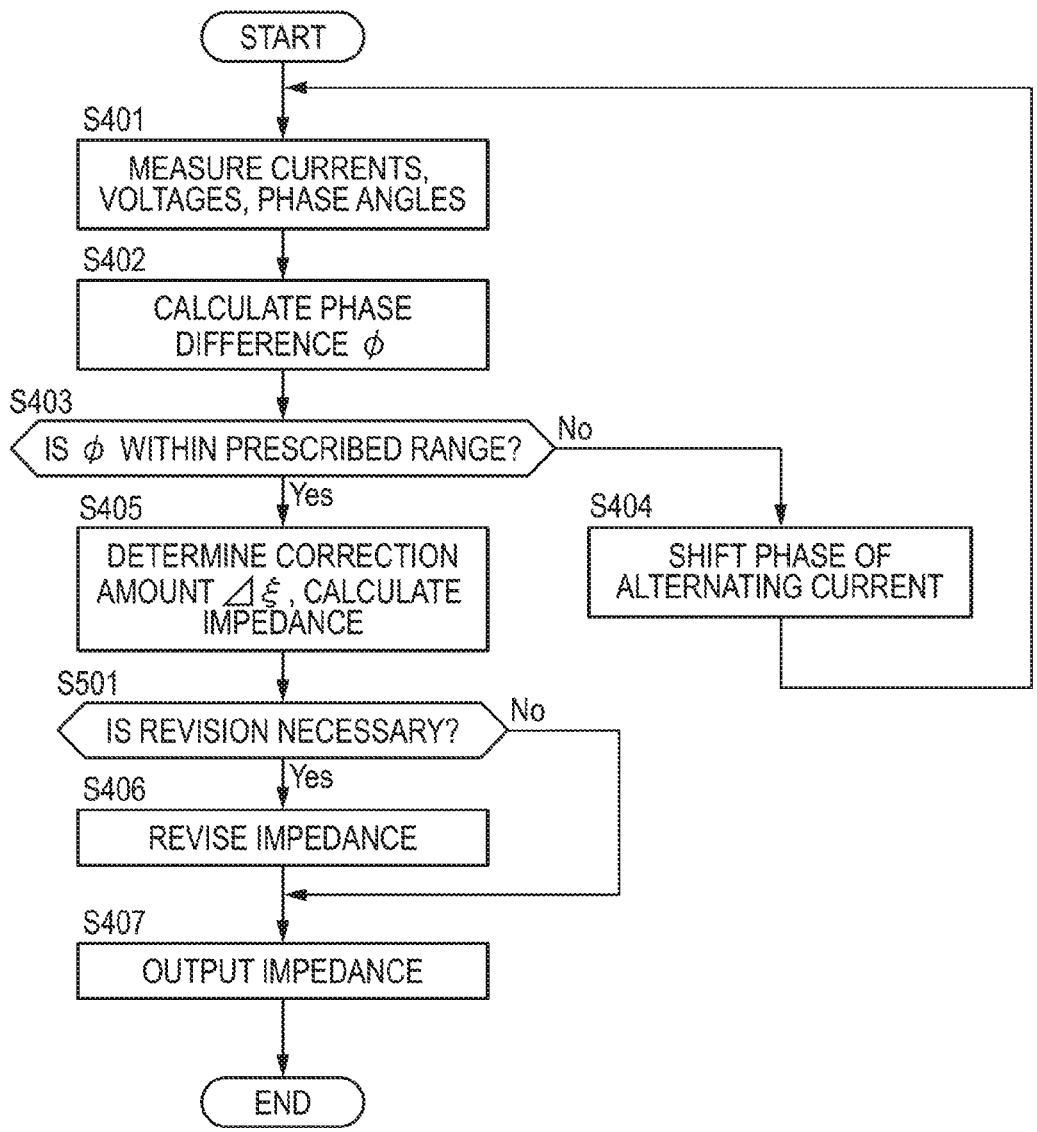
FIG. 34 is a flow chart showing another revision method for an error due to a phase adjustment.

FIG. 34 is a flow chart showing the operation of an impedance measuring device 5 of the present embodiment. Here, a processing of Step S501 is further performed in addition to a series of processings shown in FIG. 31. Further, a range of −5° to +5° is, for example, stored as a prescribed threshold value in advance in the determination unit 5523 to determine on the basis of the correction amount $\Delta\xi$ whether or not the revision by the revision unit 5522 is necessary.

In Step S501, the determination unit 5523 determines on the basis of the correction amount $\Delta\xi$ whether or not the revision by the revision unit 5522 is necessary.

The determination unit 5523 determines the revision to be necessary (Step S501: Yes) when the correction amount $\Delta\xi$ is beyond the prescribed range. Then, the determination unit 5523 outputs a determination result to the effect that the revision is necessary to the revision unit 5522. When receiving the determination result to the effect that the revision is necessary, the revision unit 5522 proceeds to the processing of Step S406 to revise the impedance Z2.

The determination unit 5523 determines the revision to be unnecessary (Step S501: No) when the correction amount $\Delta\xi$ is within the prescribed range. Then, the determination unit 5523 outputs a determination result to the effect that the revision is unnecessary to the revision unit 5522. When receiving the determination result to the effect that the revision is unnecessary, the revision unit 5522 proceeds to the processing of Step S407.

It should be noted that although the determination unit 5523 determines using the correction amount $\Delta\xi$ whether or not the revision is necessary in the present embodiment, there is no limitation to this. The determination unit 5523 may determine whether or not the revision is necessary, using frequencies of the alternating currents I1 and I2 output from the impedance measuring device 5.

Here, a relationship of the frequencies of the alternating currents I1 and I2 used for impedance measurement and the need of the revision by the revision unit 5522 is described.

Figure 35:
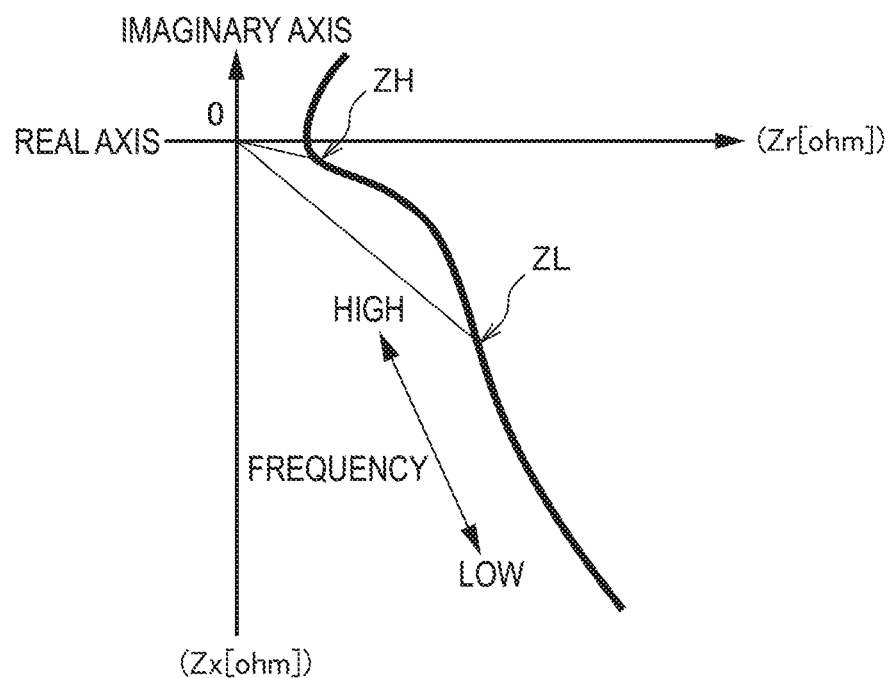
FIG. 35 is a graph showing a relationship of a frequency of an alternating current and an impedance.

FIG. 35 is a graph showing an example of a relationship of a frequency of an alternating current used for impedance measurement of the fuel cell stack 1 and an impedance measurement result. Generally, such a graph is called a Nyquist diagram.

FIG. 35 shows a characteristic of the impedance of the fuel cell stack 1 when the frequency of the alternating current was changed. As shown in FIG. 35, a phase angle of the impedance is advanced as the frequency of the alternating current increases. Further, the phase angle of the impedance is retarded as the frequency of the alternating current decreases.

An impedance ZH is a measurement result when an alternating current of a frequency substantially higher than 1 KHz was used. It should be noted that a measurement using such a high-frequency alternating current is called an HFR (High Frequency Resistance) measurement.

An impedance $Z_L$ is a measurement result when an alternating current of a frequency lower than that of the alternating current used in the HFR measurement was used. It should be noted that such an impedance measured using the alternating current of a low frequency lower than that of the alternating current used in the HFR measurement is called an LFI (Low Frequency Impedance).

As shown in FIG. 35, since the impedance ZH is located near a real axis, the phase angle is less likely to be retarded. Thus, the phase angles of the impedances Z1 and Z2 are less retarded and a phase difference $\Phi$ tends to decrease between the impedances Z1 and Z2. If the phase difference $\Phi$ is small, the correction amount $\Delta\xi$ of the phase of the alternating current I2 is small since the phase of the alternating current I2 is corrected to zero the phase difference $\phi$.

As the correction amount $\Delta\xi$ decreases, an error included in the impedance Z2 due to the correction of the phase by the phase correction unit 600 decreases. Thus, the impedance Z2 has a substantially accurate value even without being revised by the revision unit 5522. Therefore, the need of the revision by the revision unit 5522 is low in the HFR measurement.

On the other hand, since the impedance $Z_L$ is distant from the real axis, the phase angle is likely to be retarded. Thus, the phase angles of the impedances Z1 and Z2 are more retarded and the phase difference $\phi$ tends to increase. When the phase difference $\phi$ is large, the correction amount $\Delta\xi$ of the phase of the alternating current I2 is large.

As the correction amount $\Delta\xi$ increases, the error included in the impedance Z2 due to the correction of the phase by the phase correction unit 600 increases. Thus, the need of the revision by the revision unit 5522 is high in the LFR measurement.

Thus, 1 KHz is, for example, stored as a reference frequency in the determination unit 5523 to determine whether or not the revision is necessary. In Step S501, the determination unit 5523 compares the frequencies of the alternating currents I1 and I2 and the reference frequency and determines the revision to be necessary (Step S501: Yes) when the frequencies of the alternating currents I1 and I2 are lower than the reference frequency. On the other hand, the determination unit 5523 determines the revision to be unnecessary (Step S501: No) when the frequencies of the alternating currents I1 and I2 are not lower than the reference frequency.

As just described, according to the tenth embodiment of the present invention, the determination unit 5523 determines whether or not the revision is necessary. Then, the revision unit 5522 can omit the revision process by the revision unit 5522 when the revision is determined to be unnecessary by the determination unit 5523. Thus, a processing load of the impedance measuring device 5 can be reduced.

Further, when the correction amount $\Delta\xi$ of the phase of the alternating current I2 is small, the error of the phase angle of the impedance Z2 due to the correction of the phase of the alternating current I2 is small. Accordingly, the impedance Z2 has a substantially accurate value. Thus, the determination unit 5523 determines the revision by the revision unit 5522 to be unnecessary. Since the revision process by the revision unit 5522 can be omitted if necessary in this way, a processing load of the impedance measuring device 5 can be reduced.

Further, if the frequencies of the alternating currents I1 and I2 for measuring the impedance of the fuel cell stack 1 increase, the impedances Z1 and Z2 are located near the real axis and have small phase angles as shown in the Nyquist diagram of FIG. 35. Accordingly, the phase difference $\phi$ between the impedances Z1 and Z2 tends to decrease. Since the phase of the alternating current I2 is corrected to zero the phase difference $\phi$, the correction amount $\Delta\xi$ of the phase of the alternating current I2 is small when the phase difference $\phi$ is small. As just described, when the correction amount $\Delta\xi$ of the phase of the alternating current I2 is small, the error included in the impedance Z2 due to the correction of the phase of the alternating current I2 is small.

Accordingly, the impedance Z2 has a substantially accurate value, wherefore the determination unit 5523 determines the revision by the revision unit 5522 to be unnecessary. The revision unit 5522 makes no revision when the revision is determined to be unnecessary by the determination unit 5523. Since the revision process by the revision unit 5522 can be omitted if necessary in this way, a processing load of the impedance measuring device 5 can be reduced.

Eleventh Embodiment

In the tenth embodiment, an example in which the determination unit 5523 determines whether or not the revision by the revision unit 5522 is necessary has been described. In an eleventh embodiment, another method by a determination unit 5523 for determining whether or not a revision by a revision unit 5522 is necessary is described.

Figure 36:
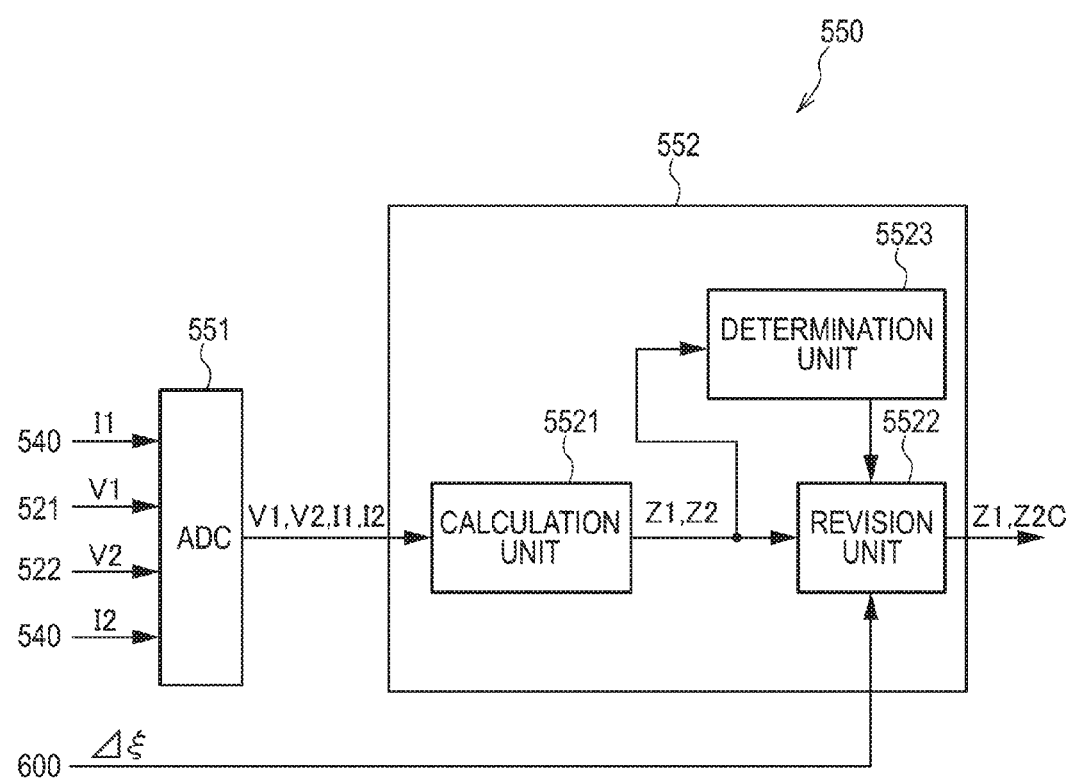
FIG. 36 is a diagram showing the configuration of a computation unit in an eleventh embodiment of the present invention.

FIG. 36 is a diagram showing the configuration of a computation unit 550 of the present embodiment. In the computation unit 550, the determination unit 5523 shown in FIG. 33 receives impedances Z1 and Z2 from a calculation unit 5521. It should be noted that the same constituent parts as those of the computation unit 550 shown in FIG. 33 are denoted by the same reference signs and not described below.

The calculation unit 5521 outputs the calculated impedances Z1 and Z2 to the revision unit 5522. The calculation unit 5521 outputs the calculated impedances Z1 and Z2 further to the determination unit 5523.

The determination unit 5523 determines whether or not a state of a fuel cell stack 1 is normal, using the impedances Z1 and Z2.

Here, when the state of the fuel cell stack 1 is normal, an error is less likely to occur in a measurement result of the impedance Z2. Thus, a revision process by the revision unit 5522 is unnecessary. On the other hand, when the state of the fuel cell stack 1 is not normal, an error is likely to occur in the measurement result of the impedance Z2. Thus, the revision process by the revision unit 5522 is necessary.

Thus, the revision unit 5522 does not revise the impedance Z2 when the state of the fuel cell stack 1 is determined to be normal by the determination unit 5523. On the other hand, the revision unit 5522 revises the impedance Z2 when the state of the fuel cell stack 1 is determined not to be normal by the determination unit 5523.

Here, the operation of an impedance measuring device 5 of the present embodiment is described in detail. The impedance measuring device 5 performs a process similar to the operation shown in FIG. 34. The following description is centered on the processing of Step S501.

Generally, when the state of the fuel cell stack 1 is normal, a real axis component Z2$r$ of the impedance Z2 calculated by the calculation unit 5521 has a value within a prescribed range. Thus, a range of not lower than 1Ω and below 2Ω is, for example, stored as a prescribed real axis range in the determination unit 5523 to determine whether or not the state of the fuel cell stack 1 is normal.

In Step S501, the determination unit 5523 determines whether or not the real axis component Z2$r$ of the impedance Z2 is within the prescribed real axis range in order to determine whether or not the revision by the revision unit 5522 is necessary.

The determination unit 5523 determines that the state of the fuel cell stack 1 is normal and the revision by the revision unit 5522 is unnecessary (Step S501: No) when the real axis component Z2$r$ is within the prescribed real axis range.

On the other hand, the determination unit 5523 determines that the state of the fuel cell stack 1 is not normal and the revision by the revision unit 5522 is necessary (Step S501: Yes) when the real axis component Z2$r$ is beyond the prescribed real axis range.

It should be noted that although the determination unit 5523 determines using the real axis component Z2$r$ of the impedance Z2 whether or not the state of the fuel cell stack 1 is normal in the present embodiment, there is no limitation to this. The determination unit 5523 may determine whether or not the state of the fuel cell stack 1 is normal, using the imaginary axis component Z2$x$ of the impedance Z2.

Further, the determination unit 5523 may determine whether or not the state of the fuel cell stack 1 is normal, using the impedance Z1 on the positive electrode side. Further, the determination unit 5523 may determine whether or not the state of the fuel cell stack 1 is normal, using both the impedances Z1 and Z2.

As just described, according to the eleventh embodiment of the present invention, the determination unit 5523 determines whether or not the state of the fuel cell stack 1 is normal. Here, when the state of the fuel cell stack 1 is normal, an error is less likely to occur in the measurement result of the impedance Z2, wherefore the need of the revision by the revision unit 5522 is low. On the other hand, when the state of the fuel cell stack 1 is not normal, an error is likely to occur in the measurement result of the impedance Z2, wherefore the need of the revision by the revision unit 5522 is high.

Thus, the revision unit 5522 does not revise the impedance Z2 when the state of the fuel cell stack 1 is judged to be normal by the determination unit 5523. Since the revision process by the revision unit 5522 can be omitted if necessary in this way, a processing load of the impedance measuring device 5 can be reduced.

Further, the determination unit 5523 determines whether or not the calculated impedance Z2 is within the prescribed range and determines according to that determination result whether or not the state of the fuel cell stack 1 is normal. Then, the revision unit 5522 does not revise the impedance Z2 when the calculated impedance Z2 is determined to be within the prescribed range by the determination unit. Since the revision process by the revision unit 5522 can be omitted if necessary in this way, a processing load of the impedance measuring device 5 can be reduced.

Twelfth Embodiment

In the tenth and eleventh embodiments, an example in which the determination unit 5523 determines whether or not the revision by the revision unit 5522 is necessary has been described. In a twelfth embodiment, another method by a determination unit 5523 for determining whether or not a revision by a revision unit 5522 is necessary is described.

Figure 37:
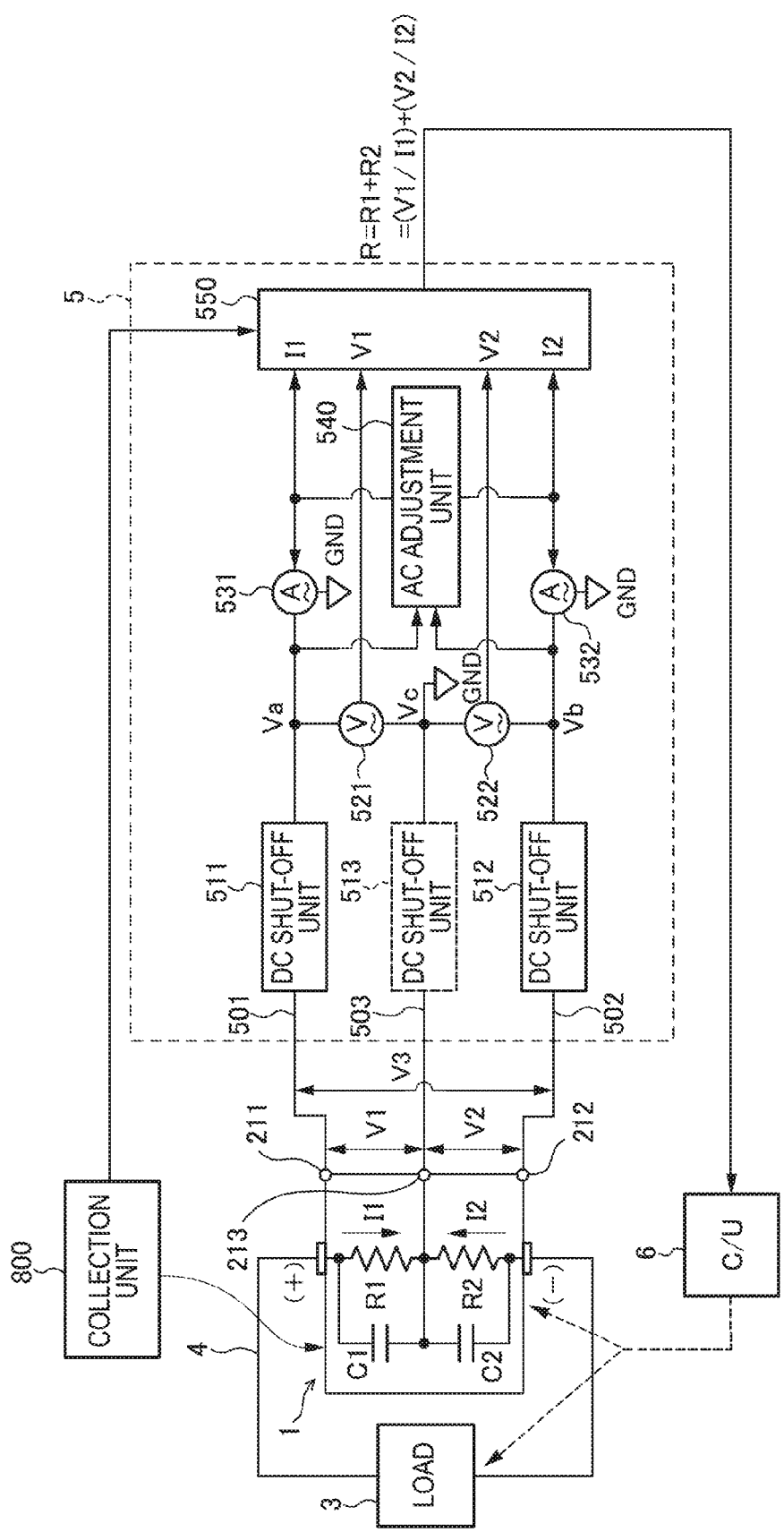
FIG. 37 is a diagram showing an impedance measuring device in a twelfth embodiment of the present invention.

FIG. 37 is a diagram showing the configuration of an impedance measuring device 5 of the present embodiment. In the impedance measuring device 5 of the present embodiment, the impedance measuring device 5 shown in FIG. 22 further includes a collection unit 800. It should be noted that the same constituent parts as those of the impedance measuring device 5 shown in FIG. 22 are denoted by the same reference signs and not described.

The collection unit 800 collects power generation information which changes according to a power generation state of a fuel cell stack 1. For example, the collection unit 800 collects a temperature of cooling water supplied to the fuel cell stack 1, a gas pressure supplied to the fuel cell stack 1, an output voltage of the fuel cell stack 1 and the like as the power generation information. The collection unit 800 outputs the collected power generation information to a determination unit 5523.

A prescribed reference for the power generation information is stored in the determination unit 5523 to judge whether or not a state of the fuel cell stack 1 is normal. The determination unit 5523 determines whether or not the power generation information collected by the collection unit 800 satisfies the prescribed reference.

Here, when the power generation information collected by the collection unit 800 satisfies the prescribed reference, the state of the fuel cell stack 1 is normal and an impedance Z2 often has an accurate value. Thus, the need of the revision by the revision unit 5522 is low.

On the other hand, when the power generation information collected by the collection unit 800 does not satisfy the prescribed reference, the state of the fuel cell stack 1 is not normal and the impedance Z2 often has a value which is not normal. Thus, the need of the revision by the revision unit 5522 is high.

Accordingly, the revision unit 5522 does not revise the impedance Z2 when the power generation information collected by the collection unit 800 satisfies the prescribed reference. On the other hand, the revision unit 5522 revises the impedance Z2 unless the power generation information collected by the collection unit 800 satisfies the prescribed reference.

Here, the operation of the impedance measuring device 5 of the present embodiment is described in detail. The impedance measuring device 5 performs a process similar to the process shown in FIG. 34. The following description is centered on the processing of Step S501.

In Step S501, the determination unit 5523 determines whether or not the power generation information collected by the collection unit 800 satisfies the prescribed reference to determine whether or not the revision by the revision unit 5522 is necessary. Then, the determination unit 5523 outputs a determination result to the revision unit 5522.

The determination unit 5523 determines the state of the fuel cell stack 1 to be normal (Step S501: No) when the power generation information collected by the collection unit 800 satisfies the prescribed reference.

On the other hand, the determination unit 5523 determines the state of the fuel cell stack 1 not to be normal (Step S501: Yes) unless the power generation information collected by the collection unit 800 satisfies the prescribed reference.

For example, when the state of the fuel cell stack 1 is normal, a temperature of the fuel cell stack 1 is about 90° Celsius. Accordingly, the temperature of the fuel cell stack 1 is measured by the collection unit 800 to specify an abnormal state of the fuel cell stack 1. On the other hand, a range of not lower than 50° Celsius and below 95° Celsius is stored as a prescribed temperature range in advance in the determination unit 5523.

The determination unit 5523 determines that the state of the fuel cell stack 1 is not normal and the revision by the revision unit 5522 is necessary (Step S501: Yes) when the temperature of the fuel cell stack 1 measured by the collection unit 800 is beyond the prescribed temperature range.

On the other hand, the determination unit 5523 determines that the state of the fuel cell stack 1 is normal and the revision by the revision unit 5522 is unnecessary (Step S501: No) when the temperature of the fuel cell stack 1 measured by the collection unit 800 is within the prescribed temperature range.

Further, when the state of the fuel cell stack 1 is normal, the gas pressure supplied to the fuel cell stack 1 is about 110 KPa to 250 KPa. Accordingly, the gas pressure supplied to the fuel cell stack 1 is measured by the collection unit 800 to specify an abnormal state of the fuel cell stack 1. On the other hand, a range of not lower than 100 KPa and below 270 KPa is stored as a prescribed pressure range in advance in the determination unit 5523.

The determination unit 5523 determines that the state of the fuel cell stack 1 is not normal and the revision by the revision unit 5522 is necessary (Step S501: Yes) when the gas pressure measured by the collection unit 800 is beyond the prescribed pressure range.

On the other hand, the determination unit 5523 determines that the state of the fuel cell stack 1 is normal and the revision by the revision unit 5522 is unnecessary (Step S501: No) when the gas pressure measured by the collection unit 800 is within the prescribed gas pressure range.

It should be noted that although the determination unit 5523 is provided in the microcomputer chip 552 in the present embodiment, there is no limitation to this. For example, the determination unit 5523 may be provided in the collection unit 800.

Further, although the determination unit 5523 determines whether or not the power generation information collected by the collection unit 800 satisfies the prescribed reference and determines according to that determination result whether or not the revision by the revision unit 5522 is necessary in the present embodiment, there is no limitation to this. The determination unit 5523 may not determine whether or not the power generation information collected by the collection unit 800 satisfies the prescribed reference and determine according to that determination result whether or not the revision by the revision unit 5522 is necessary.

In such a case, the revision unit 5522 revises the impedance Z2 when the determination unit 5523 determines that the power generation information collected by the collection unit 800 does not satisfy the prescribed reference. On the other hand, the revision unit 5522 does not revise the impedance Z2 when the determination unit 5523 determines that the power generation information collected by the collection unit 800 satisfies the prescribed reference.

As just described, according to the twelfth embodiment of the present invention, the determination unit 5523 obtains the power generation information that is collected by the collection unit 800 and changes according to the power generation state of the fuel cell stack 1, and judges whether or not the state of the fuel cell stack 1 is normal, using the obtained power generation information.

Here, in the eleventh embodiment, the determination unit 5523 judges whether or not the state of the fuel cell stack 1 is normal, using the correction amount $\Delta\xi$ of the phase by the phase correction unit 600. Here, if the state of the fuel cell stack 1 changes, for example, in a similar manner to enter an abnormal state on the positive and negative electrode sides, no phase difference $\phi$ may be generated between the phase angles $\theta_1$ and $\theta_2$ of the impedances Z1 and Z2 and the phase may not be corrected by the phase correction unit 600. In such a case, the correction amount $\Delta\xi$ of the phase by the phase correction unit 600 remains to be zero and the determination unit 5523 makes an error in judging whether or not the state of the fuel cell stack 1 is normal.

On the other hand, in the present embodiment, the power generation information collected by the collection unit 800 changes when the state of the fuel cell stack 1 changes. Accordingly, even if the state of the fuel cell stack 1 changes in a similar manner to enter an abnormal state on the positive and negative electrode sides, a state of the entire fuel cell stack 1 changes. Thus, the power generation information collected by the collection unit 800 changes. By using the power generation information that changes according to the power generation state of the fuel cell stack 1 in this way, the determination unit 5523 can more accurately judge whether or not the state of the fuel cell stack 1 is normal.

In this way, the determination unit 5523 can properly determine whether or not the revision by the revision unit 5522 is necessary. Thus, a processing load of the impedance measuring device 5 can be properly reduced by omitting the revision processing of the impedance Z2 by the revision unit 5522 at a proper timing.

Although the embodiments of the present invention have been described above, the above embodiments are merely some application examples of the present invention and not intended to limit the technical scope of the present invention to the specific configurations of the above embodiments.

For example, although an example in which the internal impedance of the fuel cell stack 1 is measured by the impedance measuring device 5 has been described in the above embodiments, a measurement object has only to be a laminated type battery in which a plurality of battery cells are laminated and may be, for example, a laminated lithium ion battery. Even in a lithium battery, a capacitance C1 on a positive electrode side and a capacitance C2 on a negative electrode side may differ due to individual differences of battery cells and a phase difference Φ may be generated. Even in such a case, effects of the present application can be obtained as in the above embodiments.

It should be noted that the above embodiments can be combined as appropriate.

The present application claims the benefit of priority from International Application No. PCT/JP2014/053912, filed in the Japan Patent Office as the Receiving Office on Feb. 19, 2014, these disclosure of which is incorporated herein by reference in its entirety.

The invention claimed is:

1. An impedance measuring device, comprising:
a laminated type battery, a plurality of battery cells being laminated in the laminated type battery;
a first power supply unit configured to output an alternating current of a prescribed frequency for measuring an impedance of the laminated type battery to a positive electrode terminal of the laminated type battery;
a second power supply unit configured to output an alternating current of the prescribed frequency to a negative electrode terminal of the laminated type battery;
a first detection unit configured to detect an alternating-current potential difference between the positive electrode terminal and an intermediate-point terminal of the laminated type battery;
a second detection unit configured to detect an alternating-current potential difference between the negative electrode terminal and the intermediate-point terminal;
an adjustment unit configured to adjust an amplitude of the alternating current output from at least one of the first and second power supply units such that the alternating-current potential difference detected by the first detection unit and the alternating-current potential difference detected by the second detection unit coincide;
a computation unit configured to compute the impedance of the laminated type battery on the basis of the alternating current adjusted by the adjustment unit and the alternating-current potential difference; and
a processing unit configured to suppress a measurement error by processing a phase difference between an alternating-current potential generated at the positive electrode terminal and an alternating-current potential generated at the negative electrode terminal on the basis of the phase difference.

2. An impedance measuring device, comprising:
a laminated type battery, a plurality of battery cells being laminated in the laminated type battery;
a first power supply unit configured to output an alternating current of a prescribed frequency for measuring an impedance of the laminated type battery to a positive electrode terminal of the laminated type battery;
a second power supply unit configured to output an alternating current of the prescribed frequency to a negative electrode terminal of the laminated type battery;
a first detection unit configured to detect an alternating-current potential difference between the positive electrode terminal and an intermediate-point terminal of the laminated type battery;
a second detection unit configured to detect an alternating-current potential difference between the negative electrode terminal and the intermediate-point terminal;
an adjustment unit configured to adjust an amplitude of the alternating current output from at least one of the first and second power supply units such that the alternating-current potential difference detected by the first detection unit and the alternating-current potential difference detected by the second detection unit coincide;
a computation unit configured to compute the impedance of the laminated type battery on the basis of the alternating current adjusted by the adjustment unit and the alternating-current potential difference; and
a processing unit configured to perform a process for suppressing an error of the alternating current on the basis of a phase difference between an alternating-current potential generated at the positive electrode terminal and an alternating-current potential generated at the negative electrode terminal.

3. The impedance measuring device according to claim 2, wherein:
the processing unit corrects a phase of the alternating current output from the first power supply unit or a phase of the alternating current output from the second power supply unit on the basis of the phase difference.

4. The impedance measuring device according to claim 3, wherein:
one of the first and second power supply units includes a phase shift circuit for changing the phase of the alternating current; and
the processing unit controls a phase of a current output from the phase shift circuit to reduce the phase difference.

5. The impedance measuring device according to claim 2, wherein:
the processing unit revises, according to a leakage current computed on the basis of the phase difference, an alternating current value output from the first power supply unit and an alternating current value output from the second power supply unit.

6. The impedance measuring device according to claim 2, further comprising:
a revision unit configured to revise the impedance calculated by the computation unit according to a phase amount corrected by the processing unit.

7. The impedance measuring device according to claim 6, wherein:
the revision unit changes a phase angle of the impedance calculated by the computation unit to a larger extent as the phase amount corrected by the processing unit increases.

8. The impedance measuring device according to claim 6, wherein:
the revision unit changes a phase angle of the impedance calculated by the computation unit in a direction opposite to a correction direction of the phase by the processing unit.

9. The impedance measuring device according to claim 6, wherein:
the revision unit revises at least one of a real part and an imaginary part of the impedance calculated by the computation unit.

10. The impedance measuring device according to claim 6, comprising:
a determination unit configured to determine whether or not a revision by the revision unit is necessary, wherein:
the revision unit revises the impedance calculated by the computation unit when the revision is determined to be necessary by the determination unit.

11. The impedance measuring device according to claim 10, wherein:
the determination unit determines the revision by the revision unit to be necessary when the phase angle corrected by the processing unit is beyond a prescribed range.

12. The impedance measuring device according to claim 10, wherein:
the determination unit determines the revision by the revision unit to be necessary when a frequency of the alternating current used for the measurement of the impedance of the laminated type battery is smaller than a prescribed threshold value.

13. The impedance measuring device according to claim 10, wherein:
the determination unit further determines whether or not a state of the laminated type battery is normal; and
the revision unit revises the impedance calculated by the computation unit when the state of the laminated type battery is determined not to be normal by the determination unit.

14. The impedance measuring device according to claim 13, wherein:
the determination unit determines whether or not a value of the impedance calculated by the computation unit is within a prescribed range and judges the state of the laminated type battery not to be normal when the value of the impedance is beyond the prescribed range.

15. The impedance measuring device according to claim 10, further comprising:
a collection unit configured to collect power generation information, the power generation information changing according to a power generation state of the laminated type battery, wherein:
the determination unit further determines whether or not the power generation information collected by the collection unit satisfies a prescribed reference; and
the revision unit revises the impedance calculated by the computation unit when the power generation information is determined not to satisfy the prescribed reference by the determination unit.

16. A control method for an impedance measuring device with a laminated type battery, a plurality of battery cells being laminated in the laminated type battery, a first power supply unit for outputting an alternating current of a prescribed frequency for measuring an impedance of the laminated type battery to a positive electrode terminal of the laminated type battery and a second power supply unit for outputting an alternating current of the prescribed frequency to a negative electrode terminal of the laminated type battery, comprising:
a first detection step of detecting an alternating-current potential difference between the positive electrode terminal and an intermediate-point terminal of the laminated type battery;
a second detection step of detecting an alternating-current potential difference between the negative electrode terminal and the intermediate-point terminal;
an adjustment step of adjusting an amplitude of the alternating current output from at least one of the first and second power supply units such that the alternating-current potential difference detected in the first detection step and the alternating-current potential difference detected in the second detection step coincide;
a computation step of computing the impedance of the laminated type battery on the basis of the alternating current adjusted in the adjustment step and the alternating-current potential difference; and
a processing step of suppressing a measurement error by processing a phase difference between an alternating-current potential generated at the positive electrode terminal and an alternating-current potential generated at the negative electrode terminal on the basis of the phase difference.

17. A control method for an impedance measuring device with a laminated type battery, a plurality of battery cells being laminated in the laminated type battery, a first power supply unit for outputting an alternating current of a prescribed frequency for measuring an impedance of the laminated type battery to a positive electrode terminal of the laminated type battery and a second power supply unit for outputting an alternating current of the prescribed frequency to a negative electrode terminal of the laminated type battery, comprising:
a first detection step of detecting an alternating-current potential difference between the positive electrode terminal and an intermediate-point terminal of the laminated type battery;
a second detection step of detecting an alternating-current potential difference between the negative electrode terminal and the intermediate-point terminal;
an adjustment step of adjusting an amplitude of the alternating current output from at least one of the first and second power supply units such that the alternating-current potential difference detected in the first detection step and the alternating-current potential difference detected in the second detection step coincide;
a computation step of computing the impedance of the laminated type battery on the basis of the alternating current adjusted in the adjustment step and the alternating-current potential difference; and a processing step of performing a process for suppressing an error of the alternating current on the basis of a phase difference between an alternating-current potential generated at the positive electrode terminal and an alternating-current potential generated at the negative electrode terminal.

* * * * *